US012412830B2

(12) United States Patent
Xie et al.

(10) Patent No.: US 12,412,830 B2
(45) Date of Patent: Sep. 9, 2025

(54) SEMICONDUCTOR DEVICE WITH POWER VIA

(71) Applicant: INTERNATIONAL BUSINESS MACHINES CORPORATION, Armonk, NY (US)

(72) Inventors: Ruilong Xie, Niskayuna, NY (US); Junli Wang, Sr., Slingerlands, NY (US); Kisik Choi, Watervliet, NY (US); Julien Frougier, Albany, NY (US); Reinaldo Vega, Mahopac, NY (US); Lawrence A. Clevenger, Saratoga Springs, NY (US); Albert M. Chu, Nashua, NH (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 548 days.

(21) Appl. No.: 17/808,186

(22) Filed: Jun. 22, 2022

(65) Prior Publication Data
US 2023/0420359 A1 Dec. 28, 2023

(51) Int. Cl.
*H01L 23/522* (2006.01)
*H01L 21/762* (2006.01)
(Continued)

(52) U.S. Cl.
CPC ........ *H01L 23/5226* (2013.01); *H01L 21/762* (2013.01); *H01L 21/76804* (2013.01);
(Continued)

(58) Field of Classification Search
CPC ............... H01L 23/5226; H01L 21/762; H01L 21/76804; H01L 21/76883;
(Continued)

(56) References Cited

U.S. PATENT DOCUMENTS 9,570,395 B1 2/2017 Sengupta
9,659,786 B2 5/2017 Greene
(Continued)

OTHER PUBLICATIONS

Mathur, et al., "Buried Bitline for sub-5nm SRAM Design," 4 pages.
(Continued)

*Primary Examiner* — Michelle Mandala
(74) *Attorney, Agent, or Firm* — Jeffrey M. Ingalls

(57) ABSTRACT

A semiconductor device is provided. The semiconductor device includes a field effect transistor (FET) including first and second source/drain (S/D) epitaxial regions. The semiconductor device also includes a gate cut region at cell boundaries between the first and second S/D epitaxial regions, a dielectric liner and a dielectric core formed in the gate cut region, and a backside power rail (BPR) and a backside power distribution network (BSPDN). The semiconductor device also includes a power via passing through the dielectric core and connecting to the BPR and BSPDN, first metal contacts formed in contact with the first and second S/D epitaxial regions, and a via to backside power rail (VBPR) contact. The dielectric liner separates the power via from the first S/D epitaxial region.

18 Claims, 61 Drawing Sheets

(51) Int. Cl.
*H01L 21/768* (2006.01)
*H10D 30/60* (2025.01)
*H10D 30/62* (2025.01)
*H10D 30/69* (2025.01)
*H10D 62/00* (2025.01)
*H10D 62/13* (2025.01)
*H10D 84/01* (2025.01)
*H10D 84/03* (2025.01)
*H10D 86/00* (2025.01)
*H10D 86/01* (2025.01)
*H01L 23/528* (2006.01)
*H10D 84/85* (2025.01)

(52) U.S. Cl.
CPC ....... *H01L 21/76883* (2013.01); *H10D 30/60* (2025.01); *H10D 30/62* (2025.01); *H10D 30/797* (2025.01); *H10D 62/021* (2025.01); *H10D 62/151* (2025.01); *H10D 84/017* (2025.01); *H10D 84/0186* (2025.01); *H10D 84/038* (2025.01); *H10D 86/00* (2025.01); *H10D 86/01* (2025.01); *H10D 86/011* (2025.01); *H01L 21/76831* (2013.01); *H01L 23/5286* (2013.01); *H01L 2924/13091* (2013.01); *H10D 84/85* (2025.01)

(58) Field of Classification Search
CPC ..... H01L 21/823814; H01L 21/823871; H01L 21/84; H01L 21/845; H01L 27/12; H01L 29/0847; H01L 29/66636; H01L 29/78; H01L 29/7848; H01L 29/785; H01L 21/76831; H01L 23/5286; H01L 27/092; H01L 2924/13091

See application file for complete search history.

(56) References Cited

U.S. PATENT DOCUMENTS

| | | | |
|---|---|---|---|
| 10,388,519 B2 | 8/2019 | Smith | |
| 10,586,765 B2 | 3/2020 | Smith | |
| 10,636,739 B2 | 4/2020 | Beyne | |
| 10,700,207 B2 | 6/2020 | Chen | |
| 10,832,973 B2 | 11/2020 | Zhou | |
| 10,991,796 B2* | 4/2021 | Hu | H10D 84/0158 |
| 11,114,549 B2 | 9/2021 | Chen | |
| 11,342,413 B2* | 5/2022 | Huang | H10D 30/62 |
| 11,728,244 B2* | 8/2023 | Van Dal | H01L 29/66795 |
| | | | 257/371 |
| 2020/0043945 A1 | 2/2020 | Kim | |
| 2020/0105671 A1* | 4/2020 | Lai | G06F 30/39 |
| 2020/0402979 A1 | 12/2020 | Chien | |
| 2021/0082936 A1 | 3/2021 | Koshizawa | |
| 2021/0249313 A1 | 8/2021 | Chen | |
| 2021/0280708 A1 | 9/2021 | Wei | |
| 2022/0102274 A1* | 3/2022 | Chien | H01L 29/401 |
| 2023/0238324 A1* | 7/2023 | Cheng | H10B 63/30 |
| 2023/0335610 A1* | 10/2023 | Huang | H01L 21/823431 |

OTHER PUBLICATIONS

Prasad et al., "Buried Power Rails and Back-side Power Grids: Arm CPU Power Delivery Delivery Network Beyond 5nm," 2019, 4 pages.

* cited by examiner

SEMICONDUCTOR DEVICE WITH POWER VIA

BACKGROUND

The present disclosure relates to fabrication methods and resulting structures for semiconductor devices. More specifically, the present disclosure relates to fabrication methods and resulting structures for semiconductor devices with a power via.

In certain semiconductor device fabrication processes, a large number of semiconductor devices, such as n-type field effect transistors (nFETs) and p-type field effect transistors (pFETs), may be fabricated on a single wafer. Non-planar transistor device architectures (e.g., fin-type FETs (FinFETs) and nanosheet FETs) can provide increased device density and increased performance over planar transistors. As semiconductor integrated circuits (ICs) and/or chips become smaller, the implementation of stacked nanosheets in semiconductor devices has increased. Nanosheets generally refer to two-dimensional nanostructures with a thickness range on the order of about 1 nanometer (nm) to about 100 nm, and they can facilitate the fabrication of non-planar semiconductor devices having a reduced footprint compared to conventional planar-type semiconductor devices. For example, nanosheet transistors, in contrast to conventional planar FETs, include a gate stack that wraps around the full perimeter of multiple stacked nanosheet channel regions for a reduced device footprint and improved control of channel current flow. Nanosheet transistor configurations may enable fuller depletion in the nanosheet channel regions and reduce short-channel effects. Accordingly, nanosheets and nanowires are seen as feasible options for reducing the footprints of semiconductor transistor devices to 7 nanometers or less. With reductions in the scale of these devices, lower BEOL wirings become very congested as space for both signal routing and power supply becomes smaller. One way to improve lower BEOL wiring congestion is to moving power supply wires to backside of the wafer, such that wiring space for both signal and power supply become wide. However, there is a potential for electrical shorting between a power via or via-to-backside-power-rail (VBPR) and various metal contacts.

SUMMARY

Embodiments of the present disclosure relate to a semiconductor device. The semiconductor device includes a field effect transistor (FET) including first and second source/drain (S/D) epitaxial regions. The semiconductor device also includes a gate cut region at cell boundaries between the first and second S/D epitaxial regions, a dielectric liner and a dielectric core formed in the gate cut region, and a backside power rail (BPR) and a backside power distribution network (BSPDN). The semiconductor device also includes a power via passing through the dielectric core and connecting to the BPR and BSPDN, first metal contacts formed in contact with the first and second S/D epitaxial regions, and a via to backside power rail (VBPR) contact. The dielectric liner separates the power via from the first S/D epitaxial region.

Embodiments of the present disclosure relate to a method of manufacturing a semiconductor device. The method includes forming a field effect transistor (FET) including first and second source/drain (S/D) epitaxial regions; forming a gate cut region at cell boundaries between the first and second S/D epitaxial regions; forming a dielectric liner and a dielectric core in the gate cut region; forming a backside power rail (BPR) and a backside power distribution network (BSPDN); forming a power via passing through the dielectric core and connecting to the BPR and BSPDN; forming first metal contacts in contact with the first and second S/D epitaxial regions; and forming a via to backside power rail (VBPR) contact. The dielectric liner separates the power via from the first S/D epitaxial region.

Embodiments of the present disclosure relate to a semiconductor device. The semiconductor device includes: a field effect transistor (FET) including first and second source/drain (S/D) epitaxial regions; a gate cut region at cell boundaries between the first and second S/D epitaxial regions; a first dielectric fill layer and a second dielectric fill layer formed in the gate cut region; and a backside power rail (BPR) connected to a backside power distribution network (BSPDN), wherein a portion of the second dielectric fill layer is removed and replaced with a power bar, which connects at least one of the first and second S/D epitaxial regions to the backside power rail.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1A:
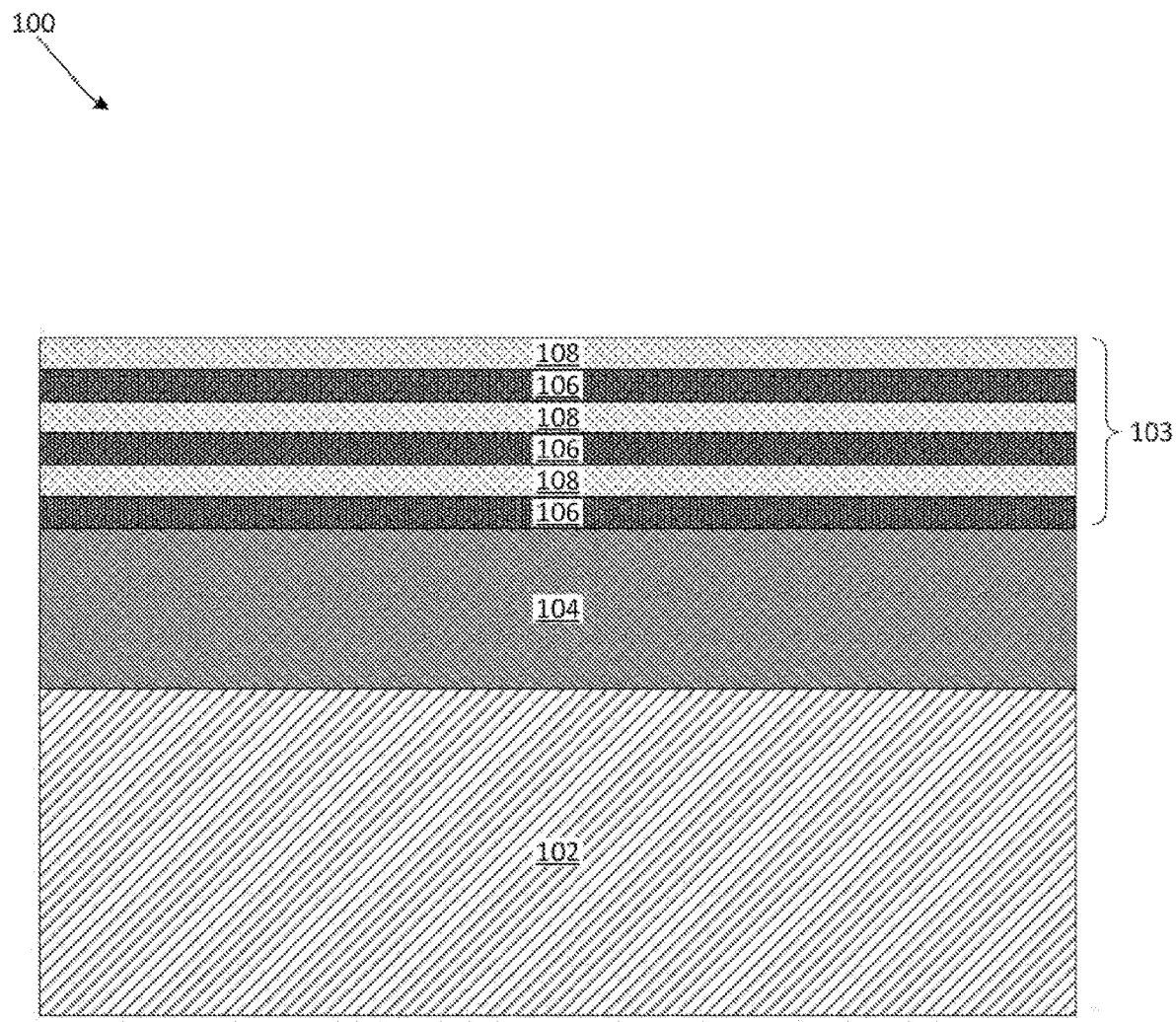
FIG. 1A is a cross-sectional view of a semiconductor device at an intermediate stage of the fabrication process and taken along the Y line of FIG. 1C, according to embodiments.

The present disclosure describes semiconductor devices having backside power rails and methods of manufacturing the semiconductor devices. In particular, the present disclosure describes a structure and method for forming semiconductor devices including gate cut trenches at cell boundaries. This includes forming a first dielectric liner and a second dielectric core in the gate cut trenches. This also includes forming a self-aligned power via by selectively etching the second dielectric core to the first dielectric liner. The method may also include forming a source/drain (S/D) contact opening, and forming a via-to-backside power rail (VBPR) contact opening by selectively removing the first dielectric liner between the power via and the S/D epitaxial region that connect together.

The flowcharts and cross-sectional diagrams in the Figures illustrate methods of manufacturing nanosheet FET devices according to various embodiments. In some alternative implementations, the manufacturing steps may occur in a different order that that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, a metal-oxide-semiconductor field-effect transistor (MOSFET) may be used for amplifying or switching electronic signals. The MOSFET has a source electrode, a drain electrode, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (nFET) and p-type field effect transistors (pFET) are two types of complementary MOSFETs. The nFET includes n-doped source and drain junctions and uses electrons as the current carriers. The pFET includes p-doped source and drain junctions and uses holes as the current carriers. Complementary metal oxide semiconductor (CMOS) is a technology that uses complementary and symmetrical pairs of p-type and n-type MOSFETs to implement logic functions. As mentioned above, hole mobility on the pFET may have an impact on overall device performance.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. Semiconductor nanosheet FET devices typically include one or more suspended nanosheets that serve as the channel. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below.

Figure 1B:
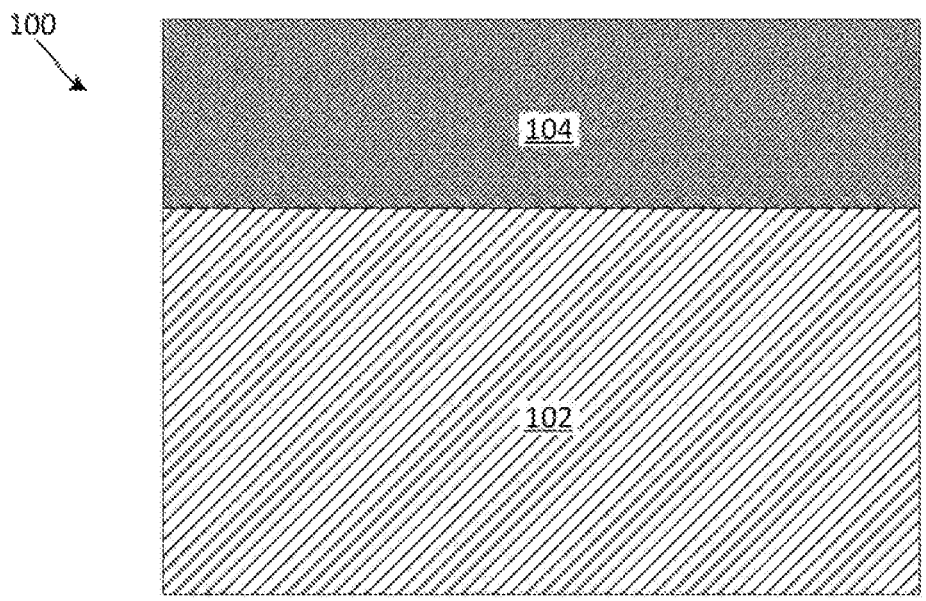
FIG. 1B is a cross-sectional view of the semiconductor device of FIG. 1A and taken along the X line of FIG. 1C, according to embodiments.
Figure 1C:
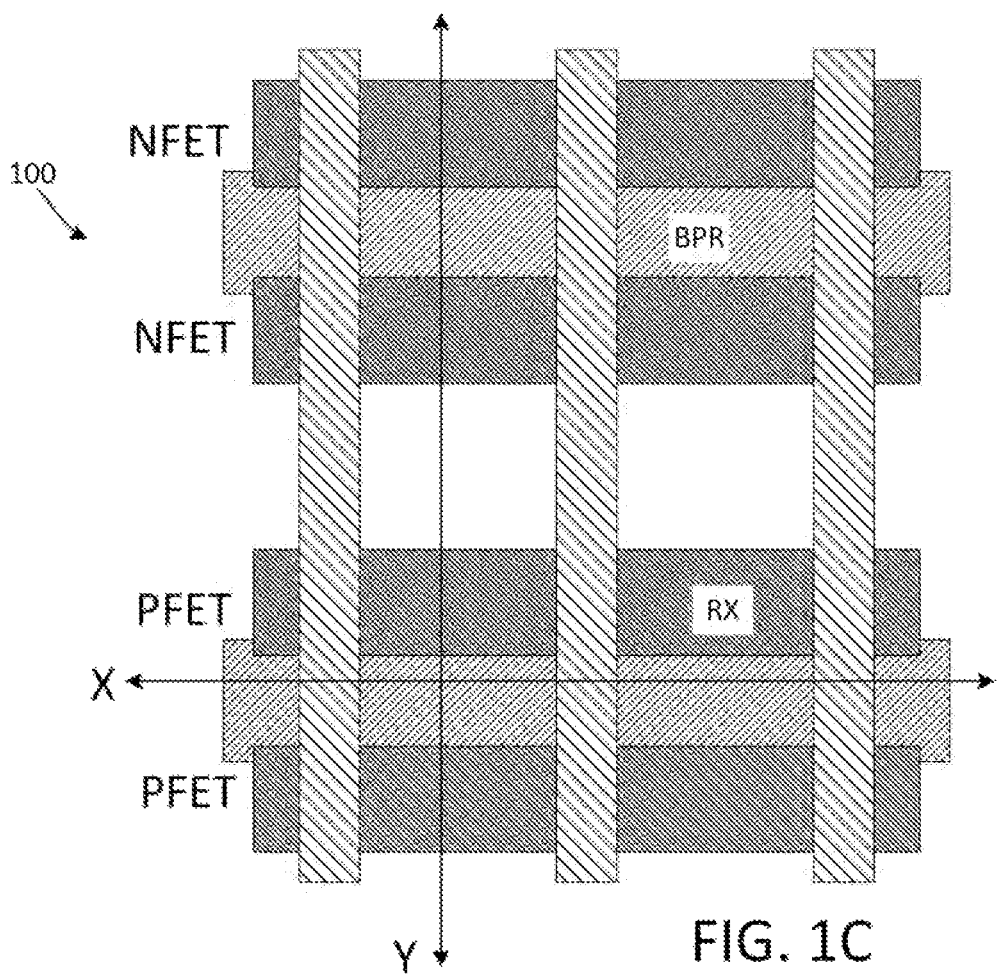
FIG. 1C is a top view of the semiconductor device of FIG. 1A, according to embodiments.

Referring now to the drawings in which like numerals represent the same or similar elements and initially to FIG. 1A, this figure depicts a cross-sectional view of the semiconductor device 100 shown in FIG. 1C taken along line Y, according to embodiments. FIG. 1C is a simplified top-down (or plan) view of the semiconductor device 100 to show the various cut lines, the NFET and PFET active regions (RX), the backside power rail (BPR), the location of the gates, and various other metal contacts as described in further detail below. Please note that FIG. 1C shows the final locations of active region and backside power rail. At current stage, the active region has not been defined and backside power rail has not been formed. As shown in FIGS. 1A and 1B, a substrate 102 is provided. The substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor-on-insulator (SOI) substrate. The substrate 102 may be comprised of any other suitable material(s) that those listed above. In some embodiments, the substrate 102 includes both semiconductor materials and dielectric materials. In some silicon-on-insulator (SOI) implementations such as shown in FIGS. 1A and 1B, a buried oxide (BOX) layer 104 (e.g., $SiO_2$) is buried in the substrate 102.

As shown in FIG. 1A, a multi-layer nanosheet stack 103 is formed on the BOX layer 104. The nanosheet stack 103 includes a first type sacrificial layer 106, followed by the formation of an active semiconductor layer 108. In certain examples, the first one of the first type sacrificial layers 106 (i.e., the bottommost first type sacrificial layer) is initially formed directly on an upper surface of the BOX layer 104. In other examples, certain layers may be formed between the upper surface of the BOX layer 104 and the first one of the first type sacrificial layers 106. In an example, the first type sacrificial layer 106 is composed of silicon-germanium (e.g., SiGe35, or more generally, where the Ge ranges from about 15-35%). Next, an active semiconductor layer 108 is formed on an upper surface of the first one of the first type sacrificial layers 106. In an example, the active semiconductor layer 108 is composed of silicon. Several additional layers of the first type sacrificial layer 106 and the active semiconductor layer 108 are alternately formed. In the example illustrated in FIG. 1A, there are a total of three first type sacrificial layers 106 and three active semiconductor layers 108 that are alternately formed to form the nanosheet stack 103. However, it should be appreciated that any suitable number of alternating layers may be formed.

In certain embodiments, the first type sacrificial layers 106 have a vertical thickness ranging, for example, from approximately 3 nm to approximately 20 nm. In certain embodiments, the active semiconductor layers 108 have a vertical thickness ranging, for example, from approximately 3 nm to approximately 10 nm. Although the range of 3-20 nm is cited as an example range of thickness, other thickness of these layers may be used. In certain examples, certain of the first type sacrificial layers 106, or the active semiconductor layers 108 may have different thicknesses relative to one another. Therefore, multiple epitaxial growth processes can be performed to form the first type sacrificial layers 106 and the active semiconductor layers 108 shown in FIG. 1A.

In certain embodiments, it may be desirable to have a small vertical spacing (VSP) between adjacent nanosheet layers in a stack of nanosheets to reduce the parasitic capacitance and to improve circuit speed. For example, the VSP (the distance between the bottom surface of a first nanosheet layer and the top surface of an adjacent second nanosheet layer) may range from 5 nm to 15 nm. However, the VSP must be of a sufficient value to accommodate the gate stack that will be formed in the spaces created by later removal of the first type sacrificial layers 106.

Figure 2A:
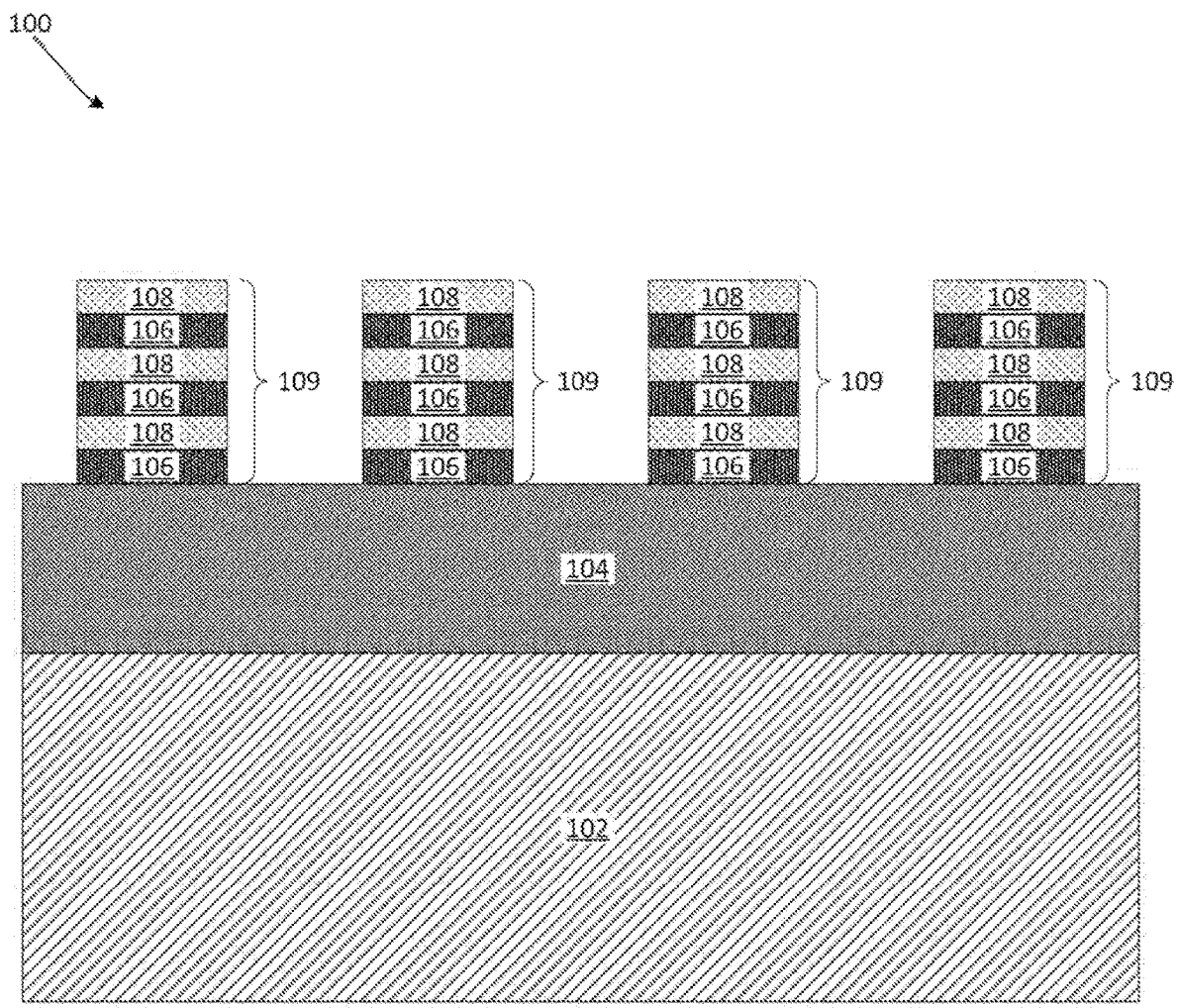
FIG. 2A is a cross-sectional view of the semiconductor device of FIG. 1A after additional fabrication operations and taken along the Y line of FIG. 2B, according to embodiments.
Figure 2B:
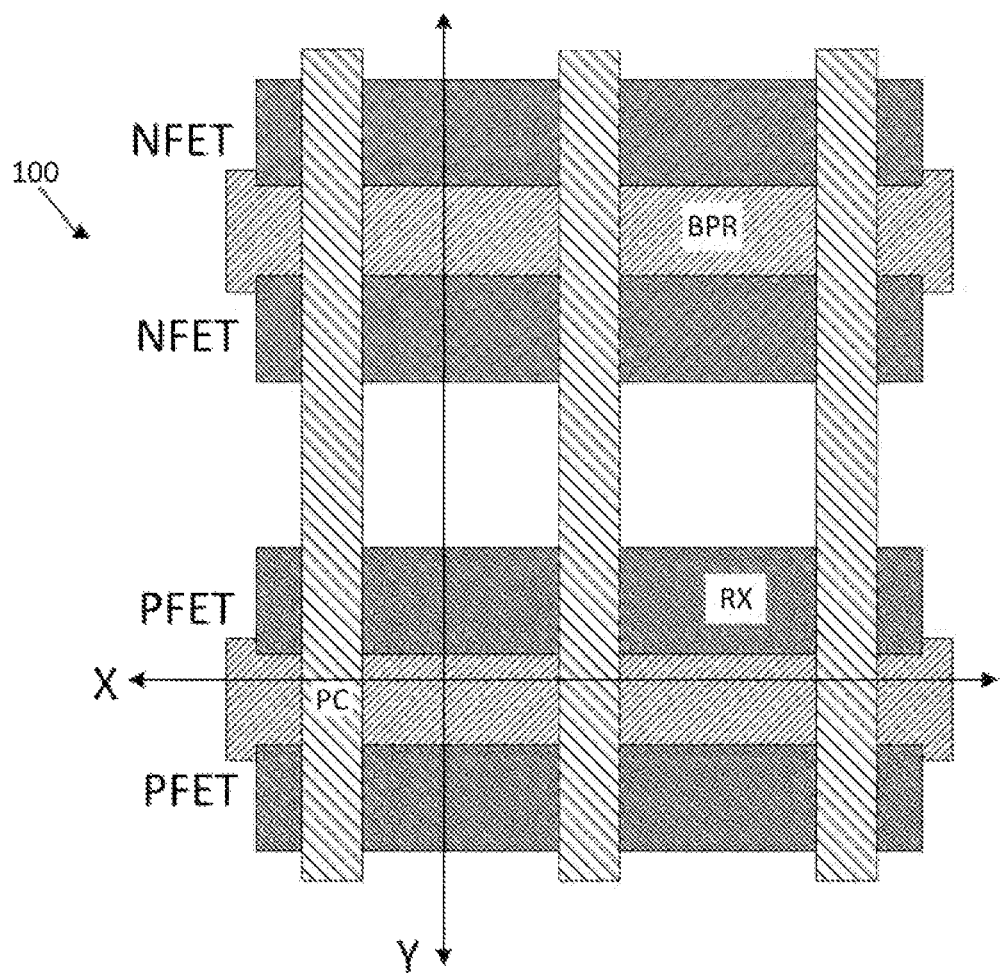
FIG. 2B is a top view of the semiconductor device of FIG. 2A, according to embodiments.

Referring now to FIG. 2A, this figure depicts a cross-sectional view of the semiconductor device 100 shown in FIG. 1A after several additional manufacturing operations and taken along line Y of FIG. 2B, according to embodiments. As shown in FIG. 2A, the semiconductor device 100 is patterned to create the patterned nanosheet stacks 109. In certain examples, although not shown in FIG. 2A, one or more hardmask layers and/or nitride layers may be patterned and sized to correspond to what will later be the active region (RX) of the FETs. Any suitable combination of deposition, lithography and material removal processes may be used to form and pattern the hardmask and nitride layer. The hardmask may comprise, for example, SiN, SiC or $SiCO_4$. The semiconductor device 100 is then patterned using the hardmask to create the patterned nanosheet stacks 109, and then the hardmasks and/or nitride layers may be removed.

Figure 3A:
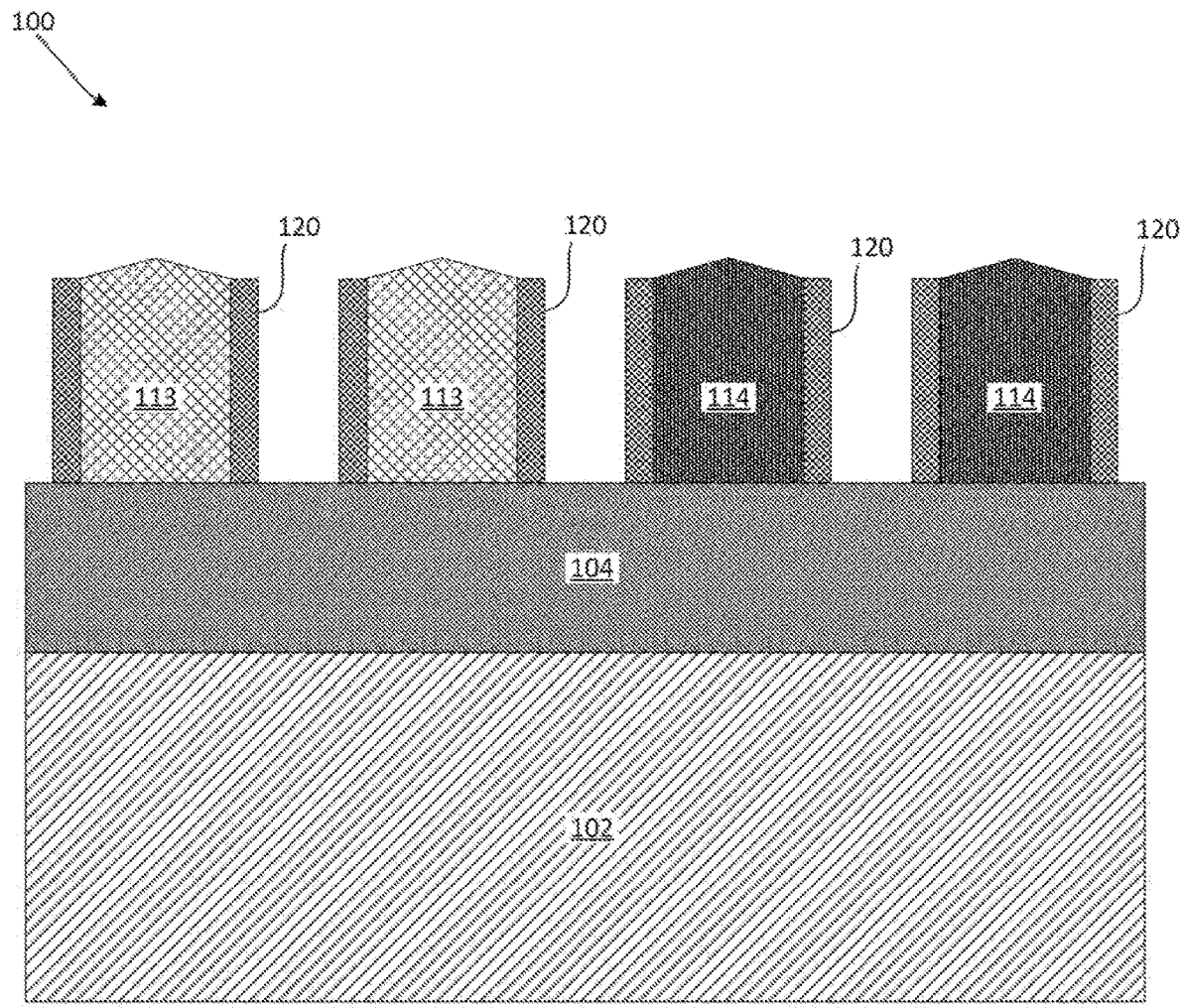
FIG. 3A is a cross-sectional view of the semiconductor device of FIG. 2A after additional fabrication operations and taken along the Y line of FIG. 2B, according to embodiments.
Figure 3B:
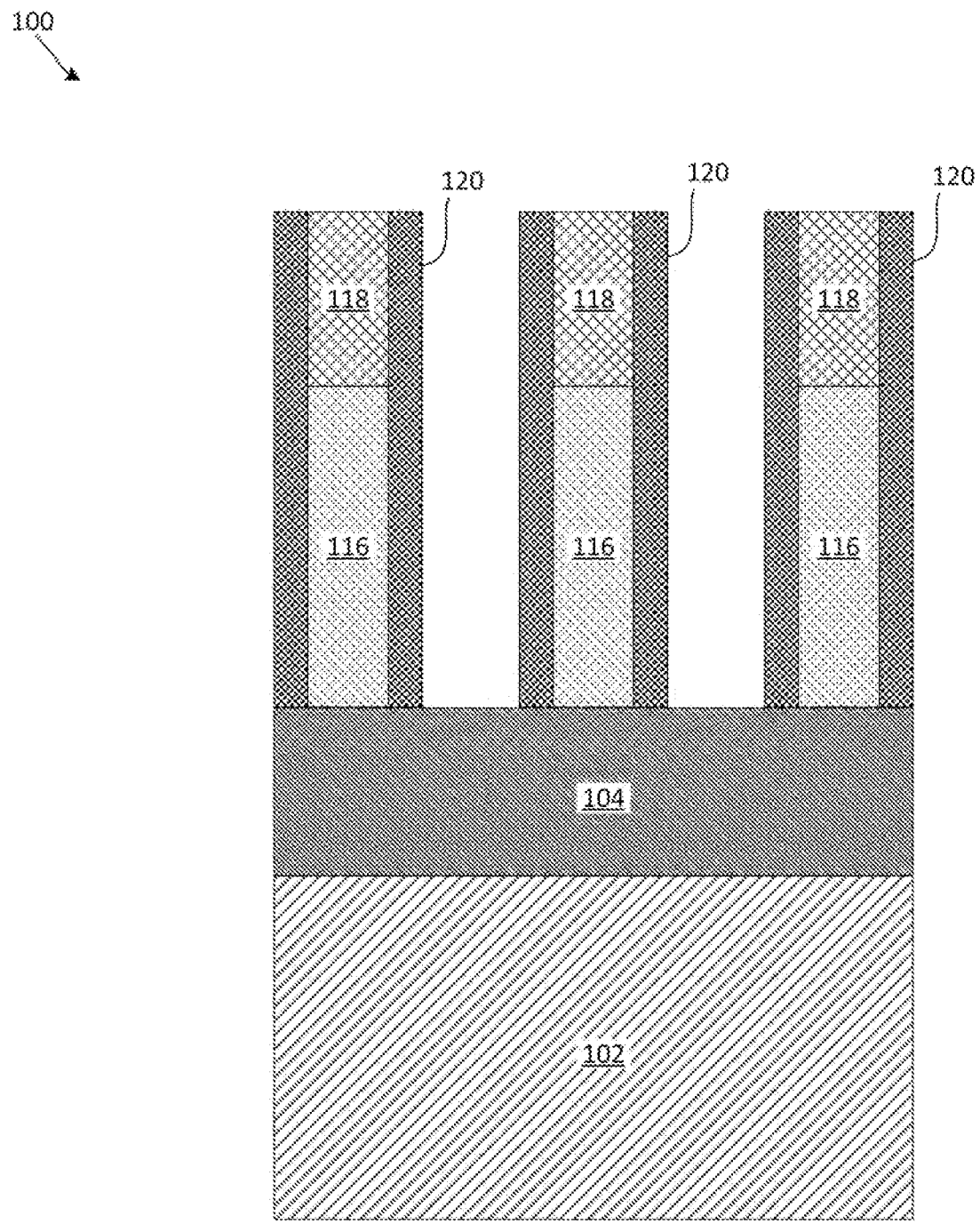
FIG. 3B is a cross-sectional view of the semiconductor device of FIG. 2B after additional fabrication operations and taken along the X line of FIG. 2B, according to embodiments.

Referring now to FIG. 3A, this figure depicts a cross-sectional view of the semiconductor device 100 shown in FIG. 2A after additional manufacturing operations and taken along line Y of FIG. 2B, according to embodiments. As shown in FIGS. 3A and 3B (a cross-sectional view of the semiconductor device 100 shown in FIG. 2B after additional manufacturing operations and taken along line X of FIG. 2B), dummy gate 116 with gate hardmask 118 is formed over nanosheet stack 109, followed by gate spacer 120 formation. After that, an inner spacer (not shown) is formed, followed by formation of the n-type source/drain epitaxial regions 113 and p-type source/drain epitaxial regions 114.

Figure 4A:
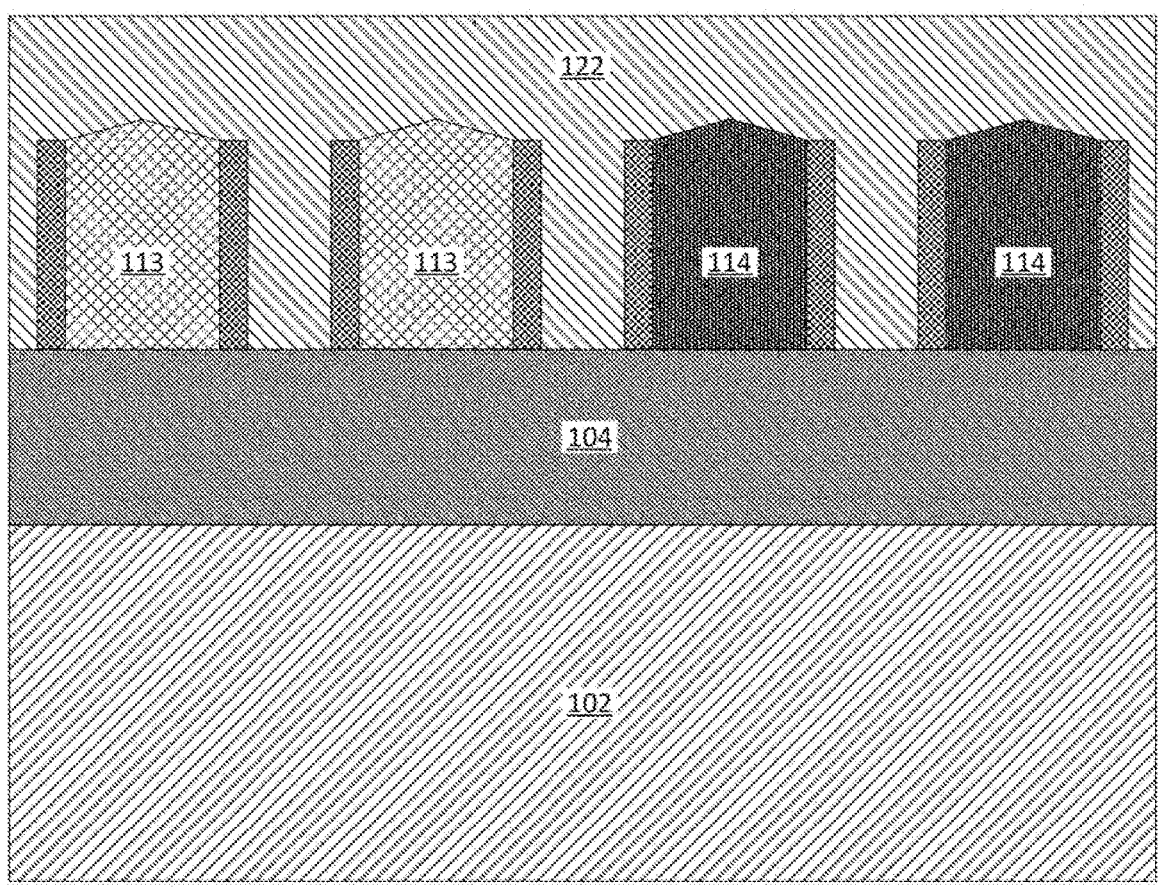
FIG. 4A is a cross-sectional view of the semiconductor device of FIG. 3A after additional fabrication operations and taken along the Y line of FIG. 2B, according to embodiments.
Figure 4B:
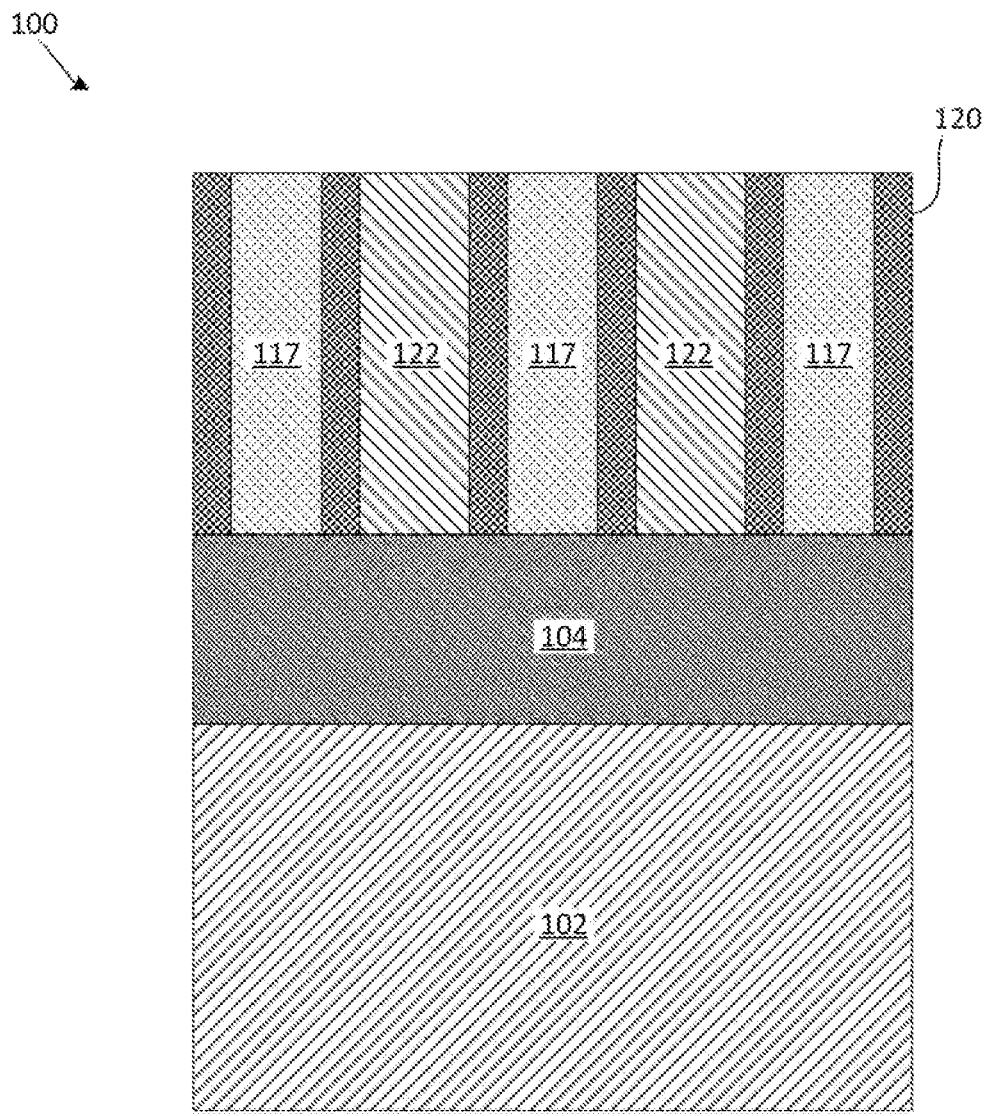
FIG. 4B is a cross-sectional view of the semiconductor device of FIG. 3B after additional fabrication operations and taken along the X line of FIG. 2B, according to embodiments.

Referring now to FIG. 4A, this figure depicts a cross-sectional view of the semiconductor device 100 shown in FIG. 3A after additional manufacturing operations and taken along line Y of FIG. 2B, according to embodiments. As shown in FIGS. 4A and 4B (a cross-sectional view of the semiconductor device 100 shown in FIG. 3B after additional manufacturing operations and taken along line X of FIG. 2B), a first interlayer dielectric (ILD) layer 122 is formed to fill in the spaces between the n-type epitaxial regions 113 and p-type epitaxial regions 114, and to fill in the spaces between the dummy gates 116. Next, any suitable material removal process is performed to remove the dummy gates 116. Then, any suitable material removal process is performed to remove the remaining material of the first type sacrificial layers 106. As shown in FIG. 4B, in the spaces created by the removal of the dummy gates 116 and sacrificial layer 106, a replacement high-x metal gate (HKMG) 117 is formed.

Figure 5:
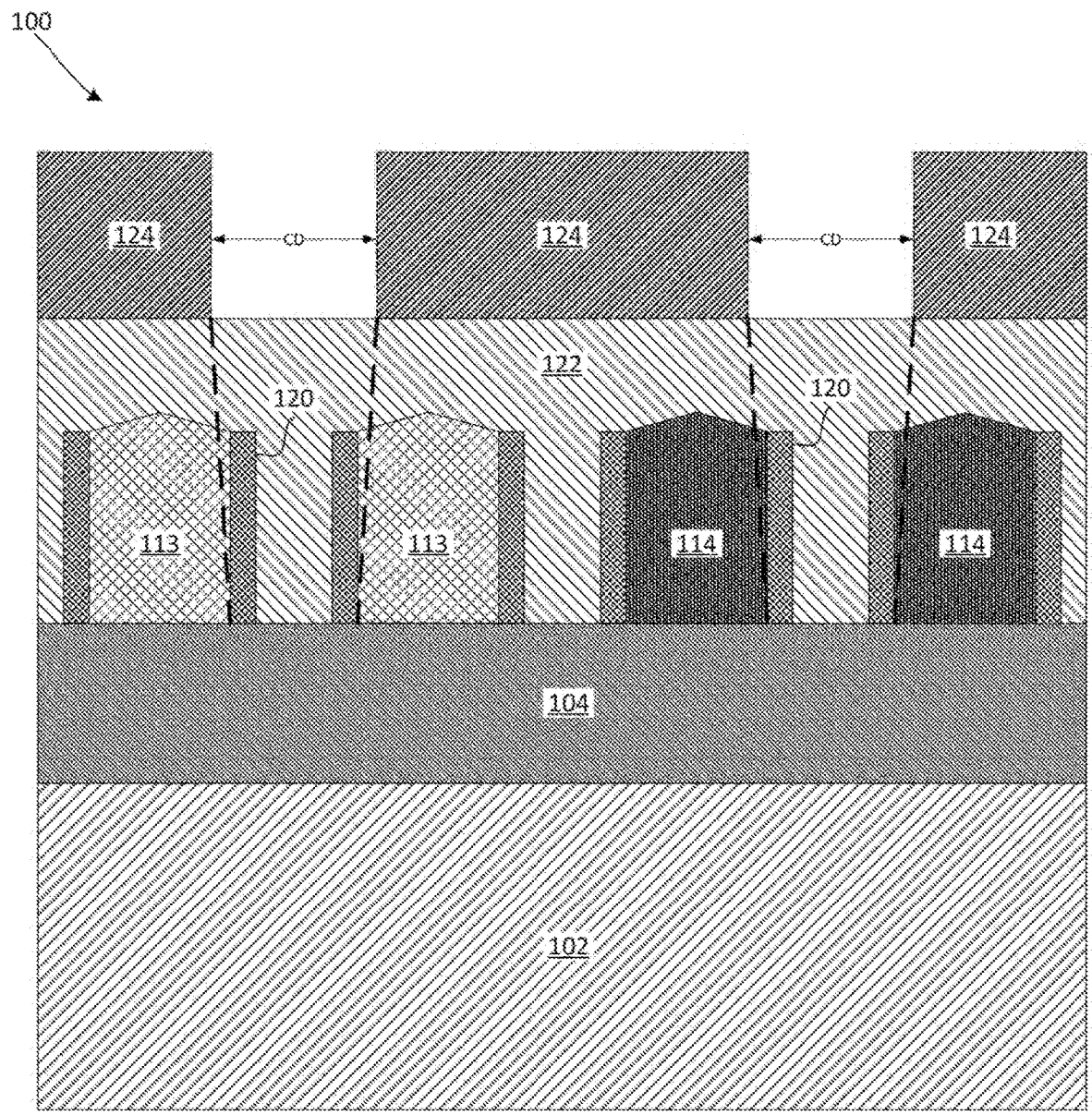
FIG. 5 is a cross-sectional view of the semiconductor device of FIG. 4A after additional fabrication operations and taken along the Y line of FIG. 2B, according to embodiments.

Referring now to FIG. 5, this figure depicts a cross-sectional view of the semiconductor device 100 shown in FIG. 4A after additional manufacturing operations and taken along line Y of FIG. 2B, according to embodiments. As shown in FIG. 5, an organic planarization (OPL) layer 124 is formed on the top surface of the ILD layer 122. Then, the OPL layer 124 is patterned to have openings corresponding to areas between the NFET region and PFET region. As shown in FIG. 5, a critical dimension (CD) or width of these openings in the OPL layer 124 is larger (or wider) than the space between the n-type epitaxial regions 113 and p-type epitaxial regions 114. This is indicated in FIG. 5 by slightly slanted dashed lines connecting the edges of the openings in the OPL layer 124 with the edges of the n-type epitaxial regions 113 and p-type epitaxial regions 114. As will be described below in relation to FIG. 6A, it can be seen that the spacer layers 120 between adjacent n-type epitaxial regions 113 (and between adjacent p-type epitaxial regions 114) are within the regions bounded by the dashed lines.

Figure 6A:
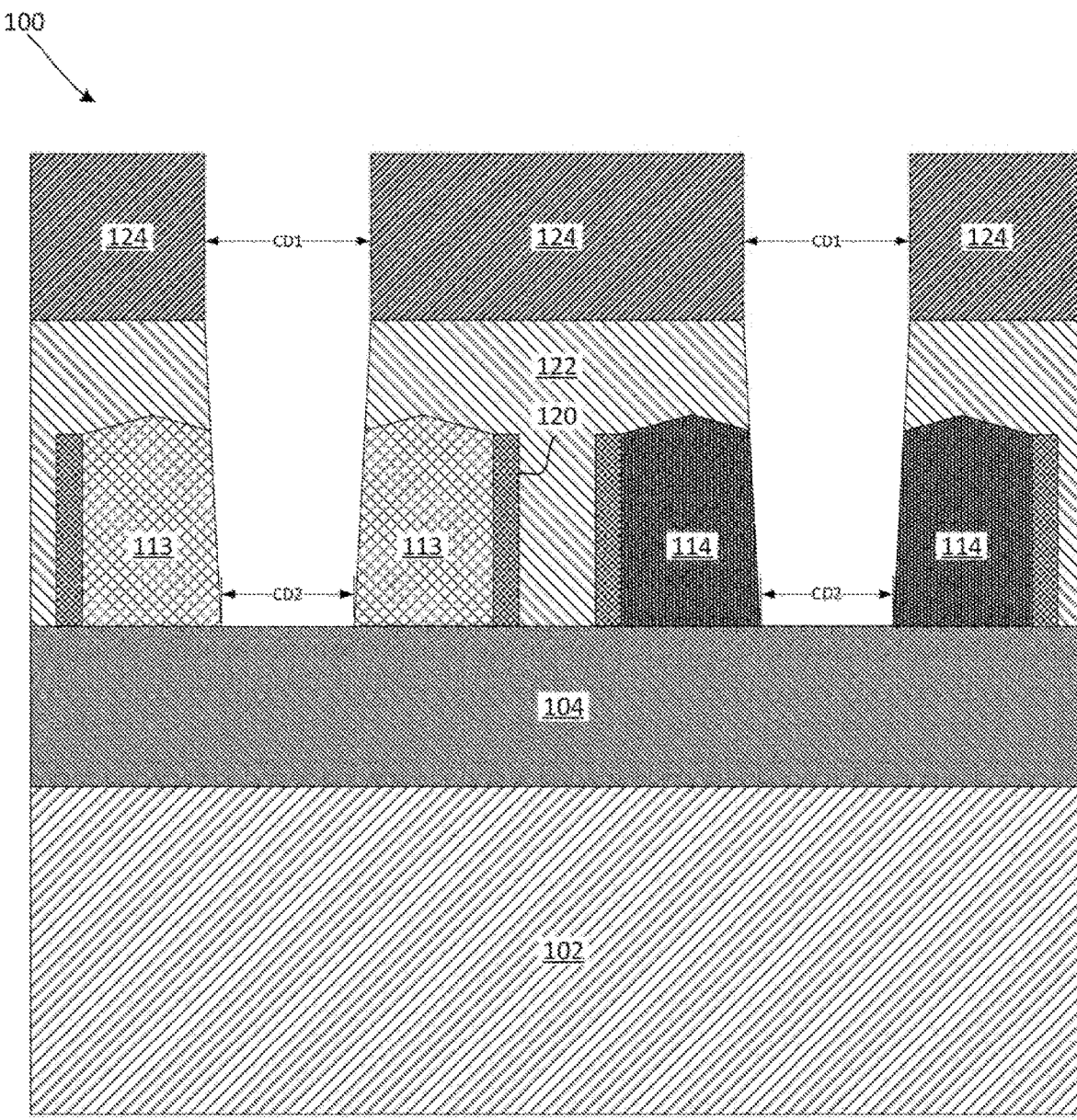
FIG. 6A is a cross-sectional view of the semiconductor device of FIG. 5 after additional fabrication operations and taken along the Y line of FIG. 6C, according to embodiments.
Figure 6B:
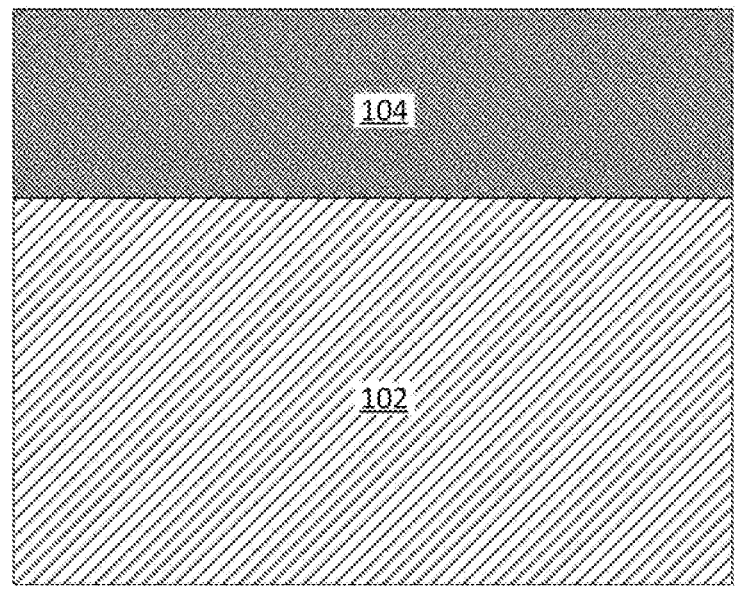
FIG. 6B is a cross-sectional view of the semiconductor device of FIG. 5 after additional fabrication operations and taken along the X line of FIG. 6C, according to embodiments.
Figure 6C:
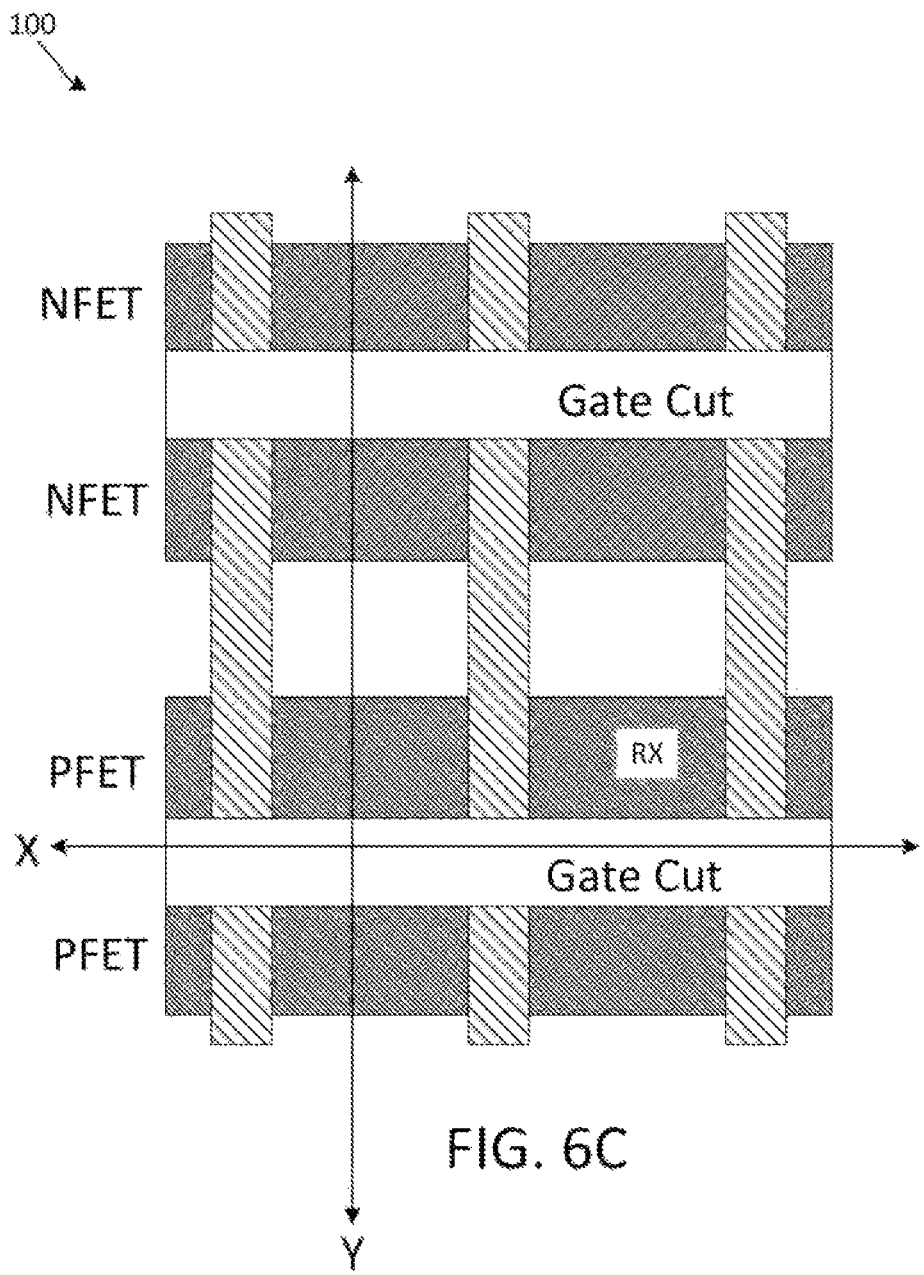
FIG. 6C is a top view of the semiconductor device of FIG. 6A, according to embodiments.
Figure 7A:
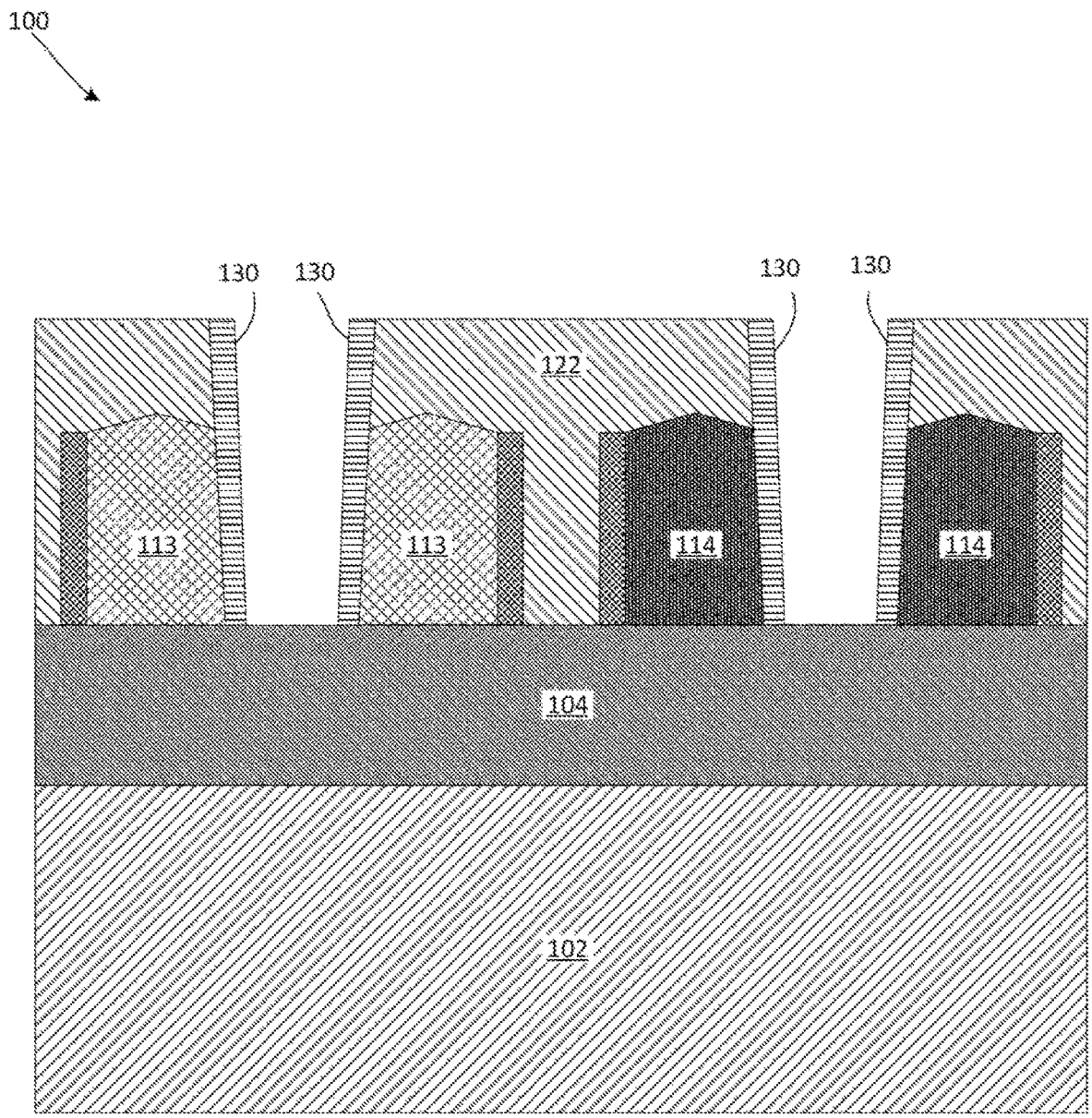
FIG. 7A is a cross-sectional view of the semiconductor device of FIG. 6A after additional fabrication operations and taken along the Y line of FIG. 7B, according to embodiments.

Referring now to FIG. 7A, this figure depicts a cross-sectional view of the semiconductor device 100 shown in FIG. 5 after additional manufacturing operations and taken along line Y of FIG. 6C, according to embodiments. As shown in FIGS. 6A and 6B (a cross-sectional view of the semiconductor device 100 shown in FIG. 4B after additional manufacturing operations and taken along line X of FIG. 6C), a gate cut is performed using any suitable material removal process such as reactive ion etching (ME). The ME process may be non-selective so that is removes the material each of the different layers at roughly the same rate. As shown in FIG. 6A, because the spacer layers 120 between adjacent n-type epitaxial regions 113 (and between adjacent p-type epitaxial regions 114) are within the regions bounded by the dashed lines shown in FIG. 5, they are removed by the RIE process. By removing these portions of the spacer layers 120, the RIE process therefore exposes the inner sidewalls of the adjacent n-type epitaxial regions 113 and exposes the inner sidewalls of the adjacent p-type epitaxial regions 114. As also shown in FIG. 6A, the CD1 of the openings in the OPL layer 124 may be slightly larger than the CD2 of the openings at the bottom of the ME cut (which stops on the upper surface of the BOX layer 104). Therefore, in certain examples, in addition to the portions of the spacer layers 120 being removed, small portions of the adjacent n-type epitaxial regions 113 and adjacent p-type epitaxial regions 114 may also be removed by the RIE process. However, it should be appreciated that it may be sufficient if only the portions of the spacer layers 120 are removed. As shown in FIGS. 6B and 6C, along the cut line X from FIG. 6C all of the material of the HKMG 117, the spacer layers 120 and the ILD layer 122 are removed down to the level of the top of the BOX layer 104.

Figure 7B:
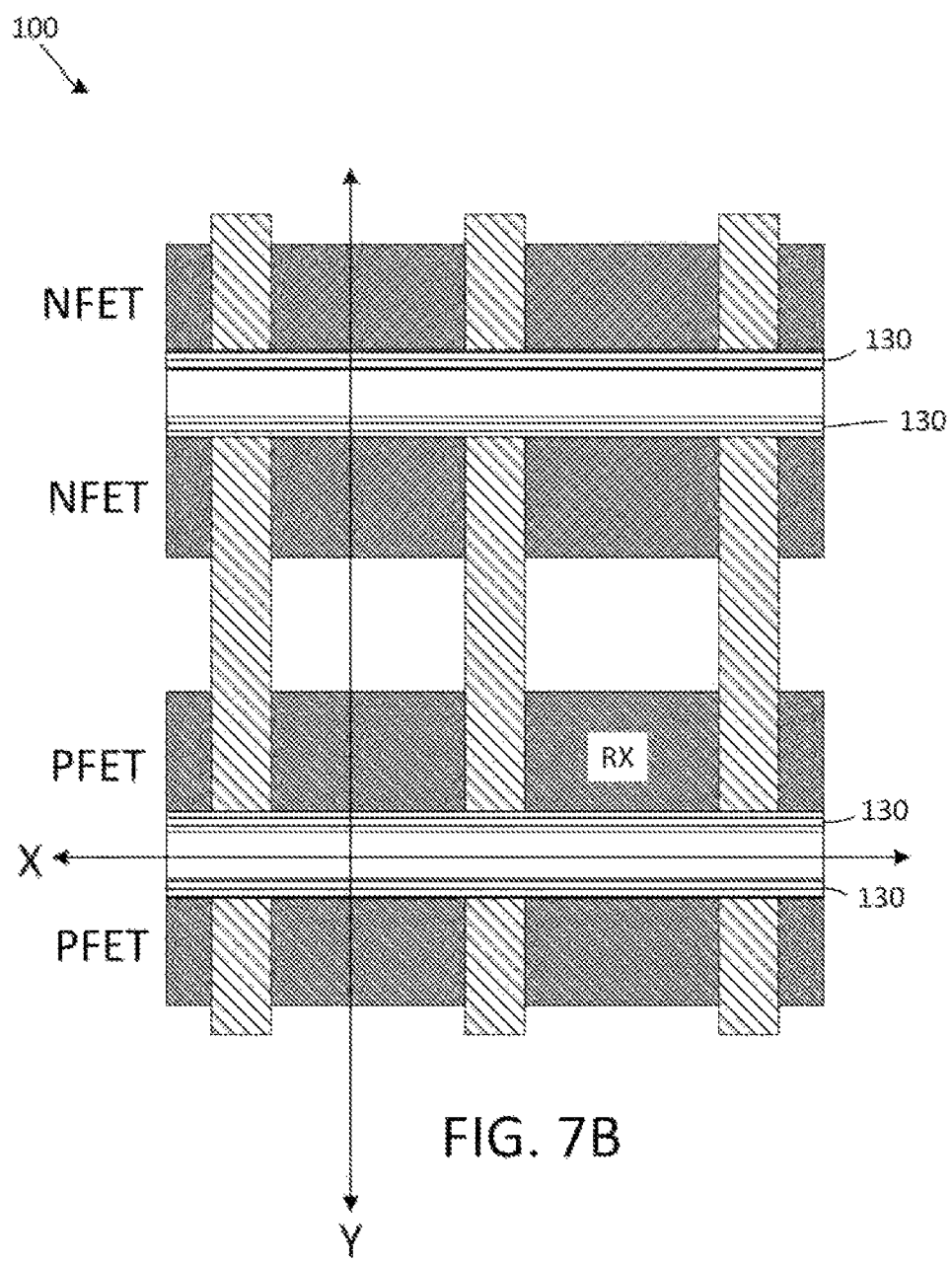
FIG. 7B is a top view of the semiconductor device of FIG. 7A, according to embodiments.

Referring now to FIG. 7A, this figure depicts a cross-sectional view of the semiconductor device 100 shown in FIG. 6A after additional manufacturing operations and taken along line Y of FIG. 7B, according to embodiments. As shown in FIG. 7A, a first dielectric spacer layer 130 (or dielectric liner) is formed to cover the inner exposed sidewalls of the adjacent n-type epitaxial regions 113 and the inner sidewalls of the adjacent p-type epitaxial regions 114. This first dielectric spacer layer 130 also covers the exposed sidewalls of the ILD layer 122. In certain examples, the material of the first dielectric spacer layer 130 may include SiN, SiBCN, $SiOC_4$ or SiC. After spacer liner deposition, an anisotropic etch process is performed to remove the spacer liner from horizontal surfaces. The locations of the first dielectric spacer layer 130 are also shown in the top down view of FIG. 7B.

Figure 8A:
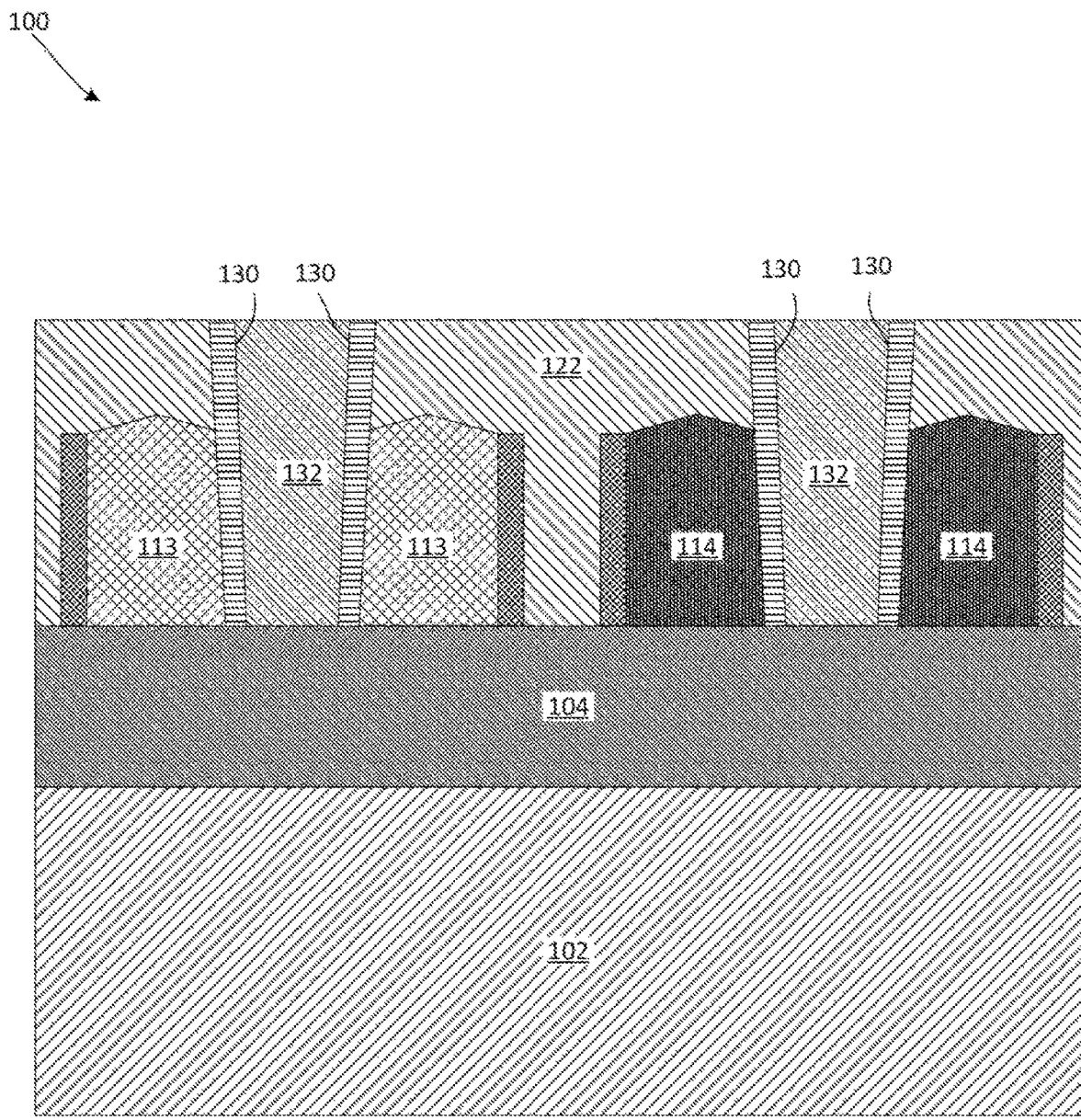
FIG. 8A is a cross-sectional view of the semiconductor device of FIG. 7A after additional fabrication operations and taken along the Y line of FIG. 8C, according to embodiments.
Figure 8B:
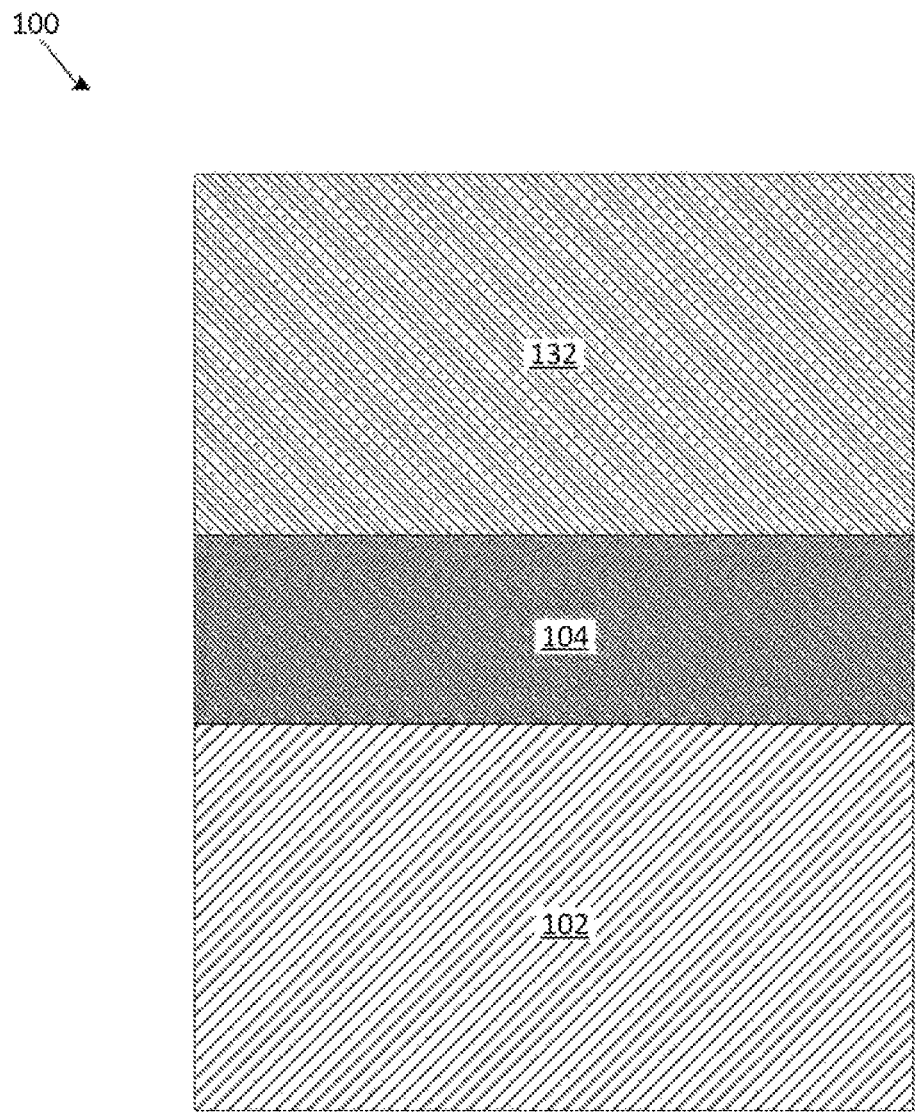
FIG. 8B is a cross-sectional view of the semiconductor device of FIG. 6B after additional fabrication operations and taken along the X line of FIG. 8C, according to embodiments.
Figure 8C:
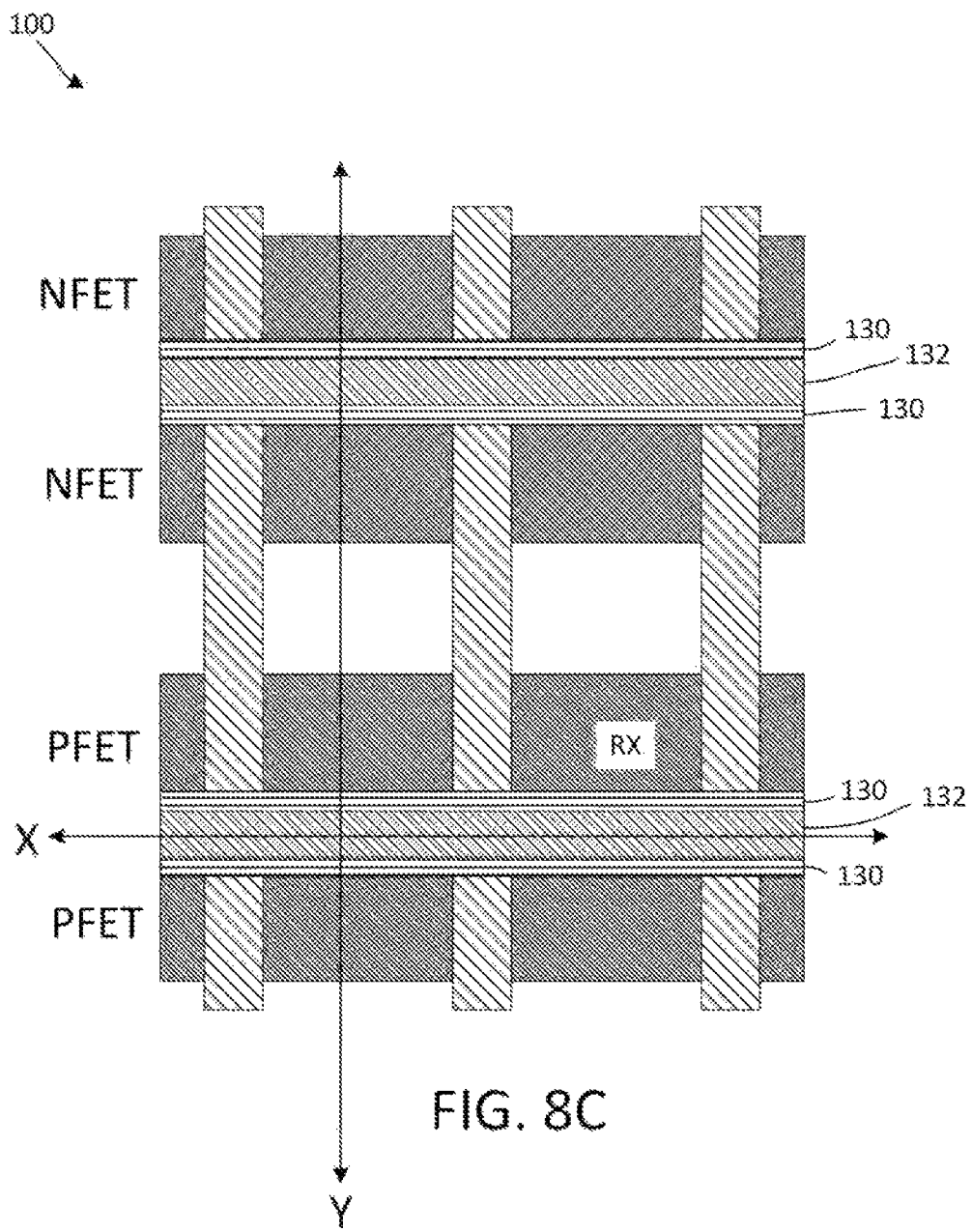
FIG. 8C is a top view of the semiconductor device of FIG. 8A, according to embodiments.

Referring now to FIG. 8A, this figure depicts a cross-sectional view of the semiconductor device 100 shown in FIG. 7A after additional manufacturing operations and taken along line Y of FIG. 8C, according to embodiments. As shown in FIGS. 8A and 8B (a cross-sectional view of the semiconductor device 100 shown in FIG. 6B after additional manufacturing operations and taken along line X of FIG. 8C), an inner dielectric layer 132 (or dielectric core) is formed to cover the remaining space between the adjacent n-type epitaxial regions 113 and the remaining space between the adjacent p-type epitaxial regions 114. In certain examples, the material of the inner dielectric layer 132 may include $SiO_2$. However, it should be appreciated that any other suitable material(s) may be used. In certain examples, a planarization process such as CMP may be used to replanarize (or remove excess material from) the upper surfaces of the semiconductor device 100. The locations of the inner dielectric spacer layer 132 are also shown in the top down view of FIG. 8C.

Figure 9A:
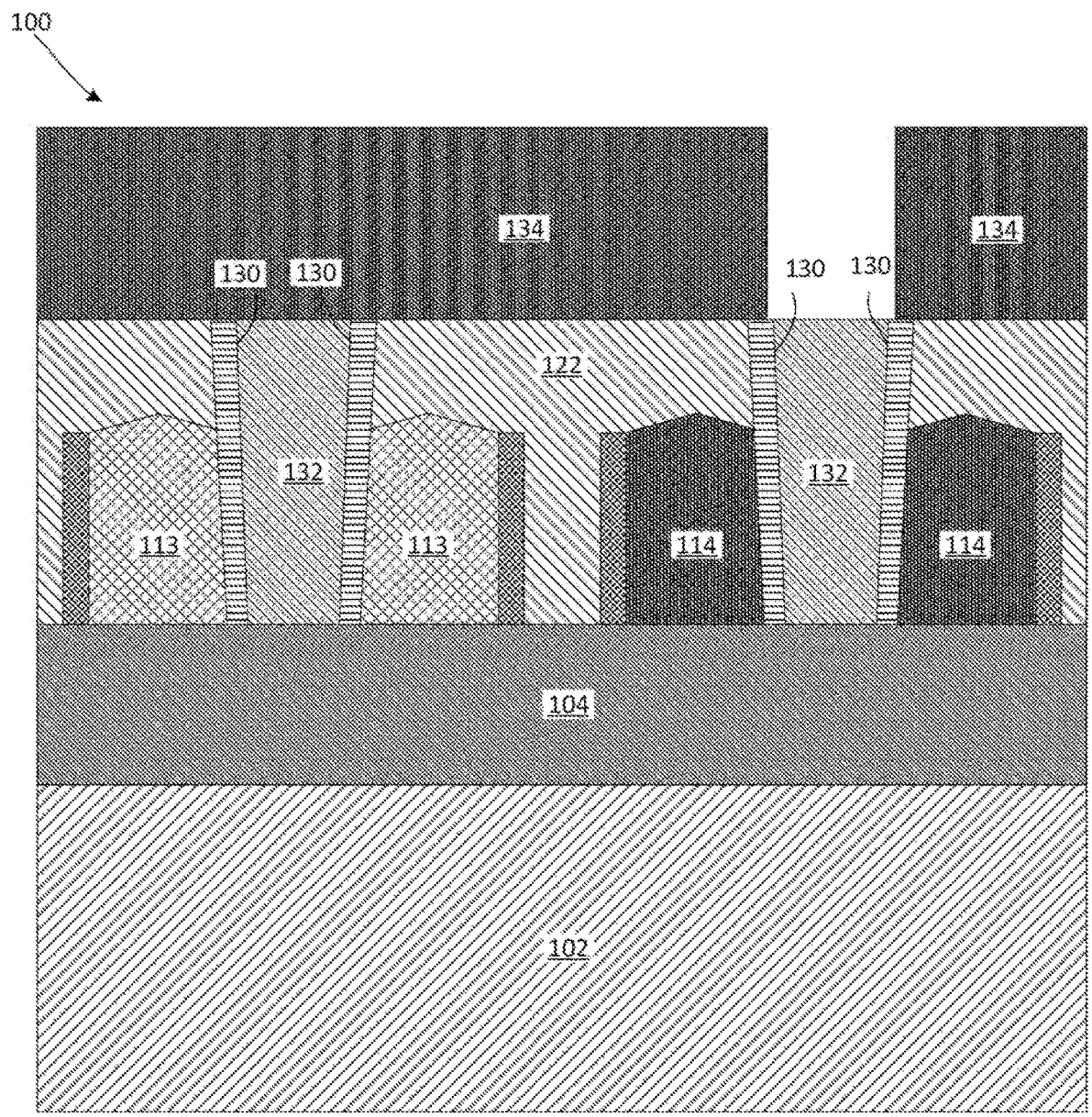
FIG. 9A is a cross-sectional view of the semiconductor device of FIG. 8A after additional fabrication operations and taken along the Y line of FIG. 9C, according to embodiments.
Figure 9B:
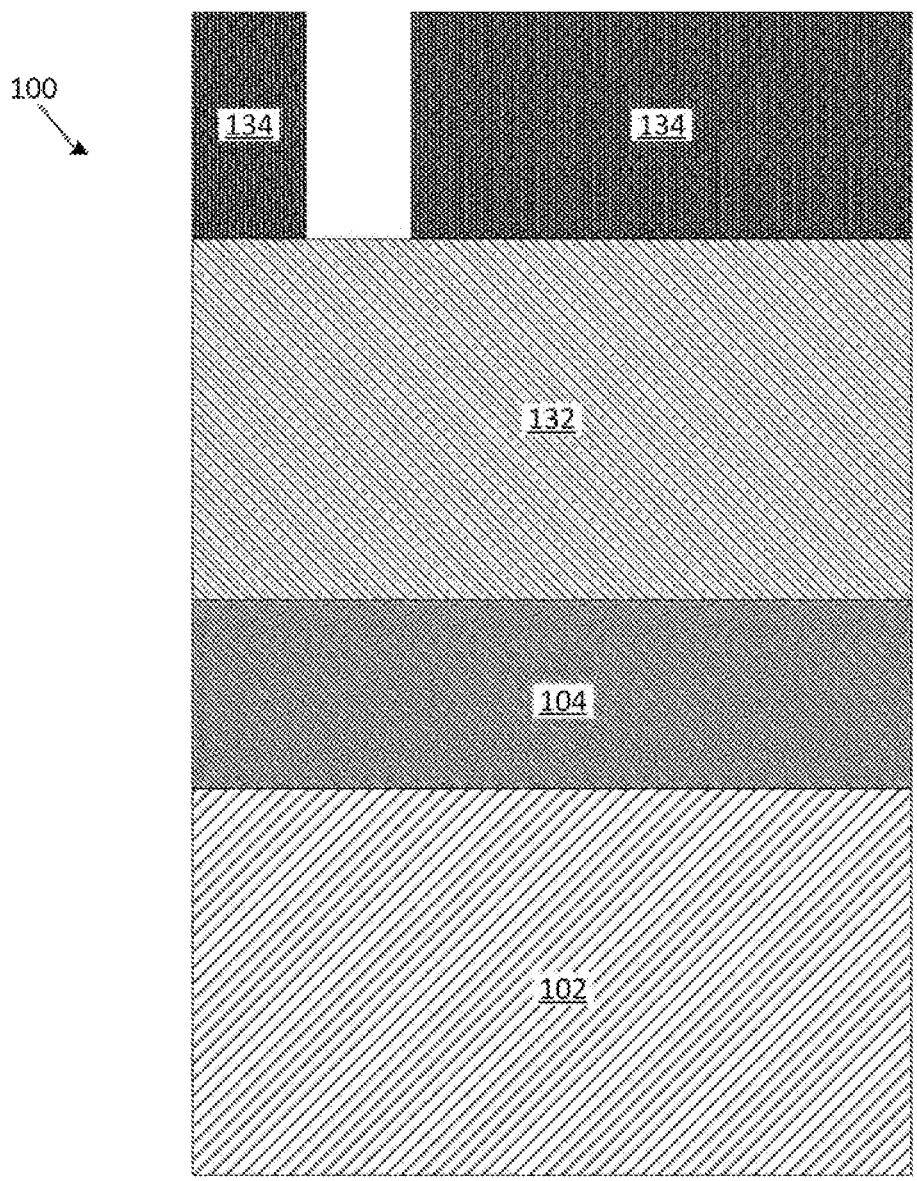
FIG. 9B is a cross-sectional view of the semiconductor device of FIG. 8B after additional fabrication operations and taken along the X line of FIG. 9C, according to embodiments.
Figure 9C:
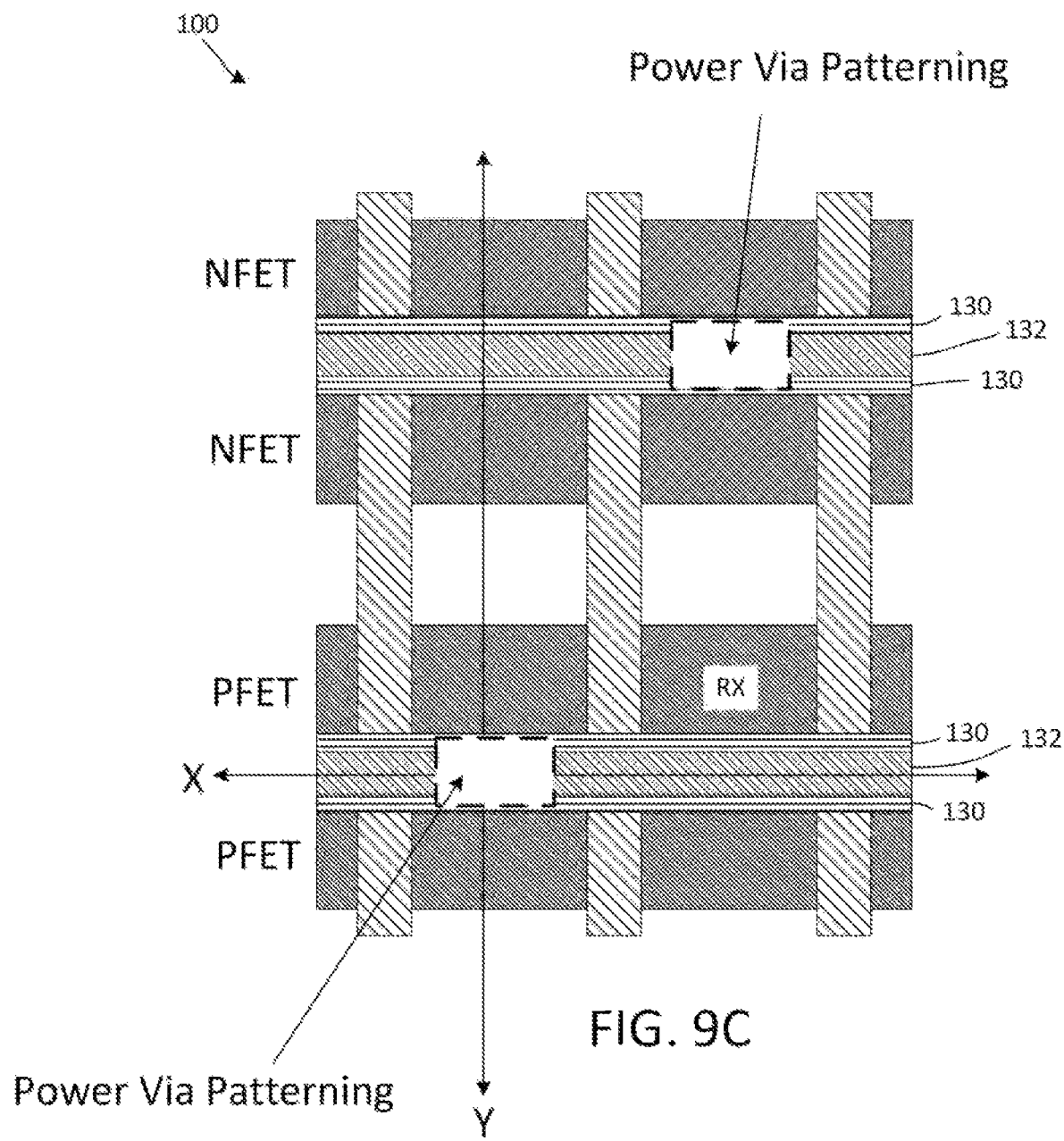
FIG. 9C is a top view of the semiconductor device of FIG. 9A, according to embodiments.

Referring now to FIG. 9A, this figure depicts a cross-sectional view of the semiconductor device 100 shown in FIG. 8A after additional manufacturing operations and taken along line Y of FIG. 9C, according to embodiments. As shown in FIGS. 9A and 9B (a cross-sectional view of the semiconductor device 100 shown in FIG. 8B after additional manufacturing operations and taken along line X of FIG. 9C), a second organic planarization (OPL) layer 134 is formed on the top surface of the ILD layer 122. Then, the second OPL layer 134 is patterned to have openings between cell boundaries. As shown in FIG. 9A, this opening exposes the inner dielectric layer 132 between the adjacent p-type epitaxial regions 114. These openings correspond to locations where the power vias will be formed, as discussed in further detail below. The power via patterning areas are also shown in the top down view of FIG. 9C. In certain examples, the size of the power via patterning areas may be large enough to expose at least portions of the upper surfaces of the first dielectric spacer layers 130 between the adjacent p-type epitaxial regions 114, as shown in FIGS. 9A and 9C.

Figure 10A:
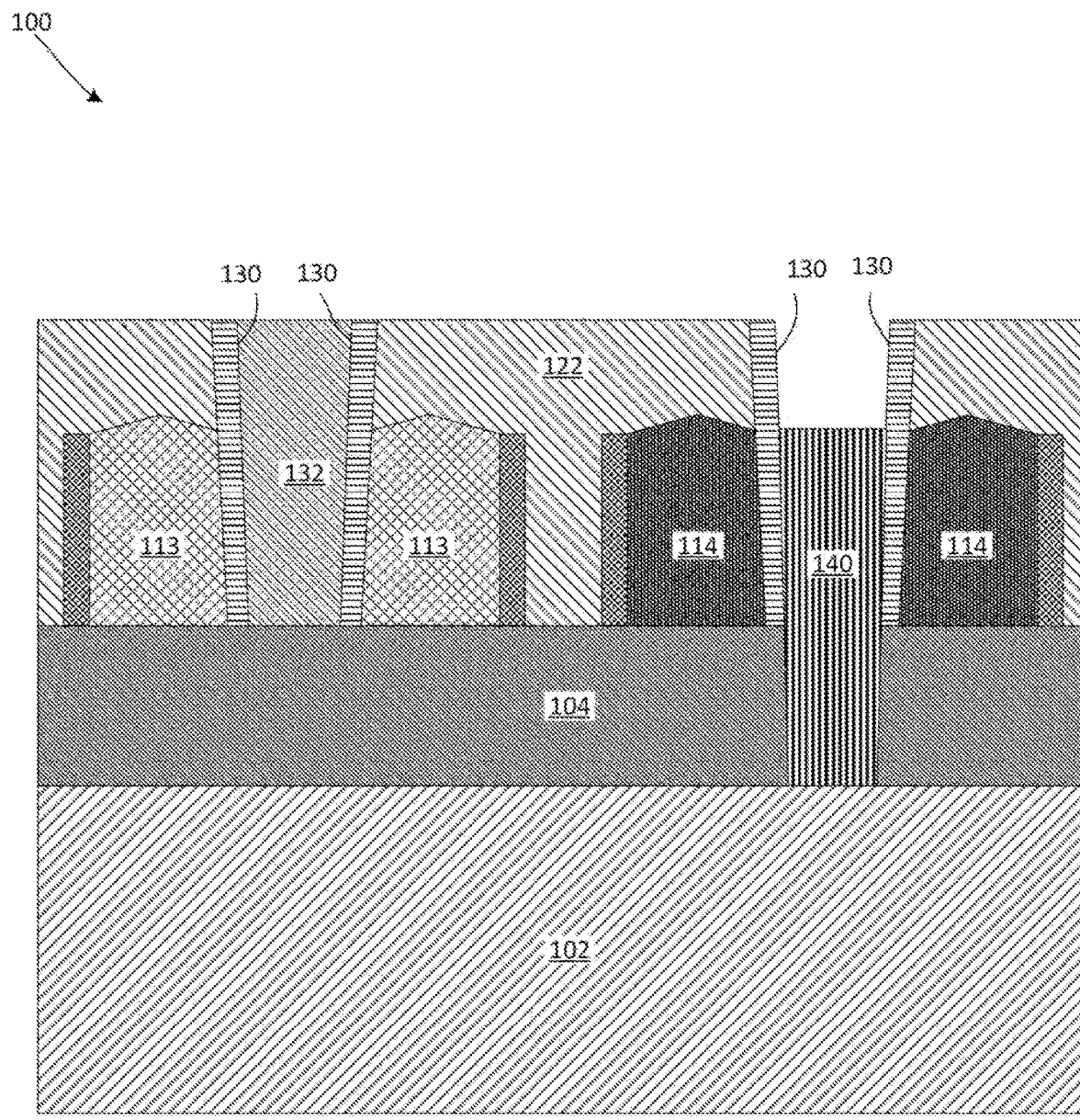
FIG. 10A is a cross-sectional view of the semiconductor device of FIG. 9A after additional fabrication operations and taken along the Y line of FIG. 10C, according to embodiments.
Figure 10B:
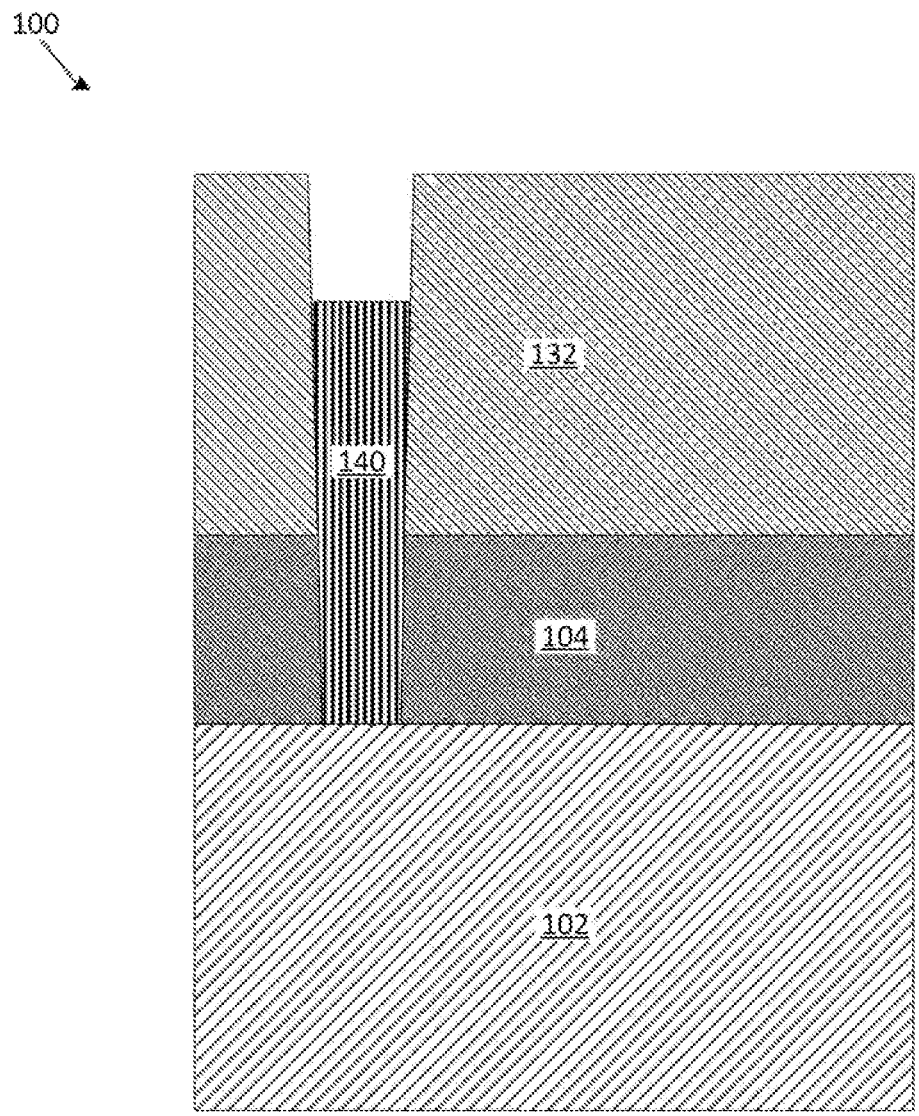
FIG. 10B is a cross-sectional view of the semiconductor device of FIG. 9B after additional fabrication operations and taken along the X line of FIG. 9C, according to embodiments.
Figure 10C:
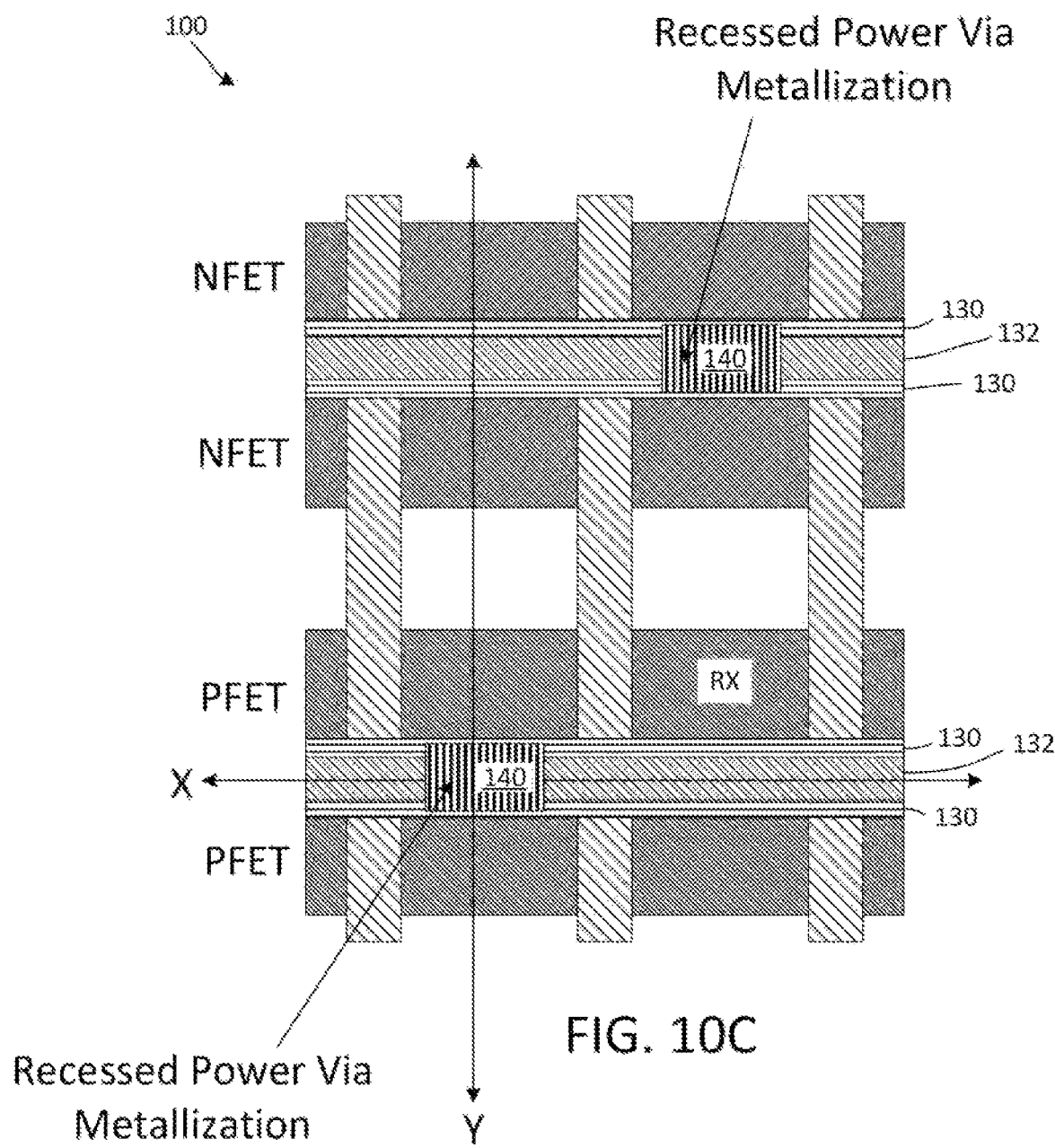
FIG. 10C is a top view of the semiconductor device of FIG. 10A, according to embodiments.

Referring now to FIG. 10A, this figure depicts a cross-sectional view of the semiconductor device 100 shown in FIG. 9A after additional manufacturing operations and taken along line Y of FIG. 10C, according to embodiments. As shown in FIGS. 10A and 10B (a cross-sectional view of the semiconductor device 100 shown in FIG. 9B after additional manufacturing operations and taken along line X of FIG. 10C), an etching process is performed using the power via patterning areas in the second OPL layer 134. As shown in FIGS. 10A and 10B, the etching is performed down through the inner dielectric layer 132, through the BOX layer 104, and down to the level of an upper surface of the substrate 102. As shown in FIG. 10A, the first dielectric spacer layer 130 between the adjacent p-type epitaxial regions 114 is not removed during this etching step. Then, a material deposition process is performed to fill these newly formed power vias with a suitable metal material to form the power vias 140, which extend through the BOX layer 104. These power vias 140 are also shown in the top-down view of FIG. 10C. Following the material deposition process, a CMP process may optionally be performed to replanarize the top surface of the semiconductor device 100, and to remove any excess material. Then, another material removal process (i.e., an etch back) is performed to recess the metal material of the power vias 140 to a level that is below an upper surface of the first ILD layer 122.

Figure 11A:
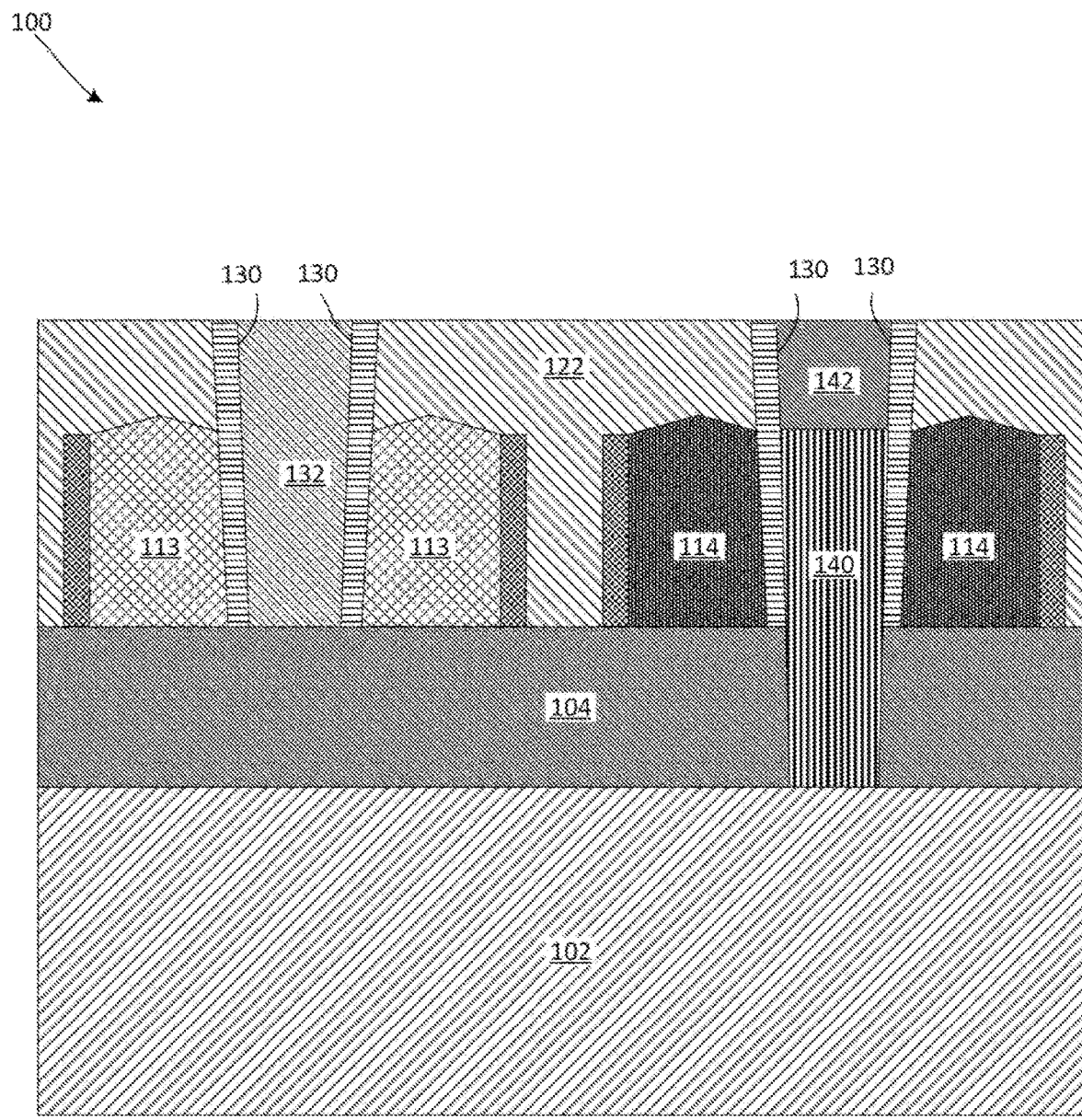
FIG. 11A is a cross-sectional view of the semiconductor device of FIG. 10A after additional fabrication operations and taken along the Y line of FIG. 11C, according to embodiments.
Figure 11B:
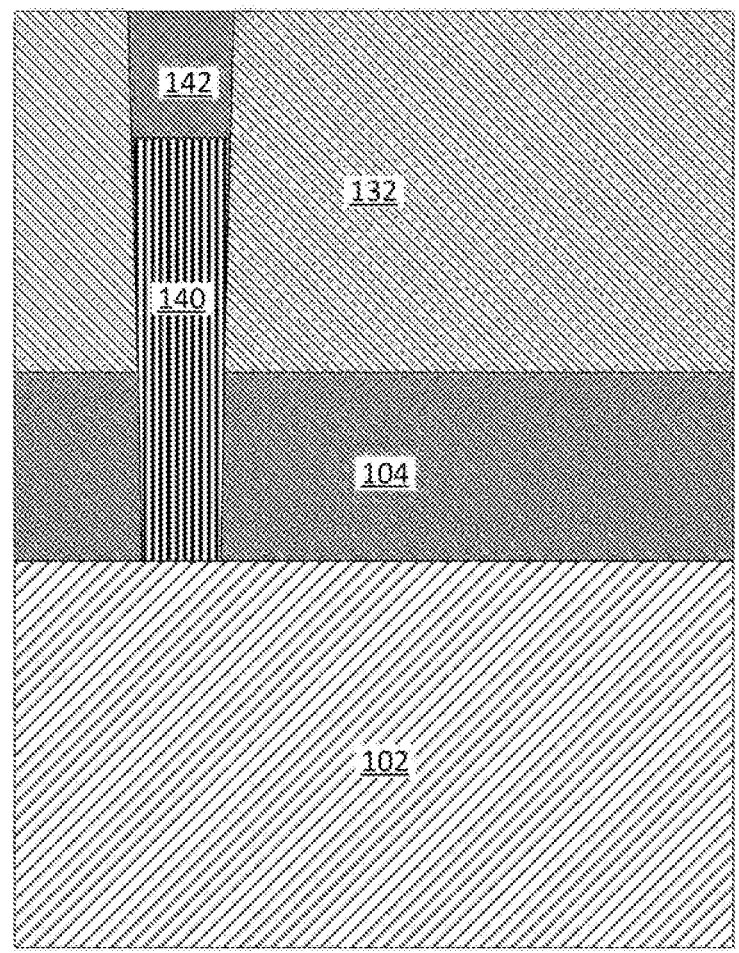
FIG. 11B is a cross-sectional view of the semiconductor device of FIG. 10B after additional fabrication operations and taken along the X line of FIG. 11C, according to embodiments.
Figure 11C:
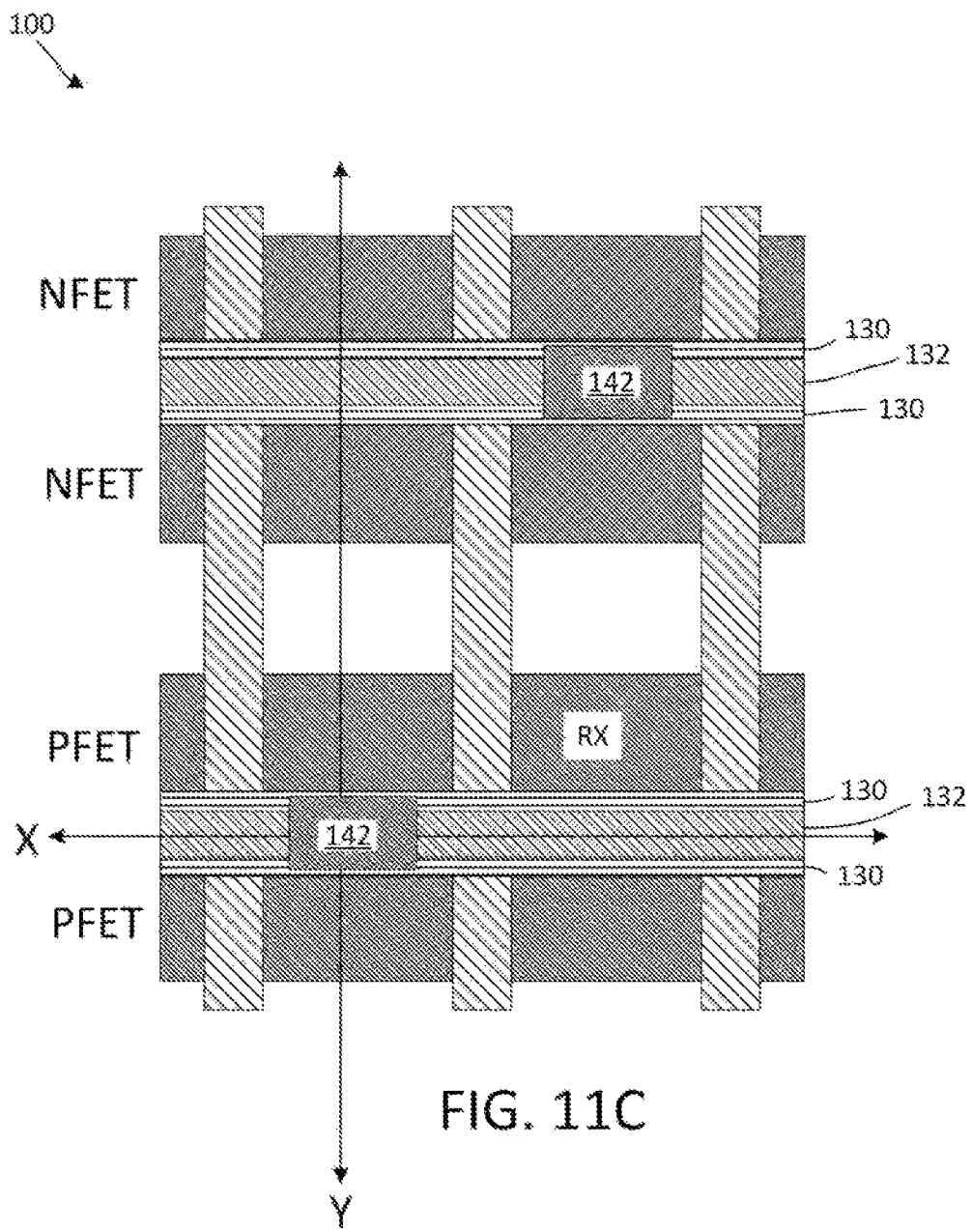
FIG. 11C is a top view of the semiconductor device of FIG. 11A, according to embodiments.

Referring now to FIG. 11A, this figure depicts a cross-sectional view of the semiconductor device 100 shown in FIG. 10A after additional manufacturing operations and taken along line Y of FIG. 11C, according to embodiments. As shown in FIGS. 11A and 11B (a cross-sectional view of the semiconductor device 100 shown in FIG. 10B after additional manufacturing operations and taken along line X of FIG. 11C), a dielectric fill layer 142 is formed to fill in the spaces resulting from the etch back process described above with respect to FIGS. 10A-10C. After the dielectric fill layer 142 is formed, an additional etch back process or planarization process such as CMP is performed to replanarize the surface of the semiconductor device 100 and/or remove any excess material of the dielectric fill layer 142. The locations of the dielectric fill layer 142 are also shown in the top down view of FIG. 11C.

Figure 12A:
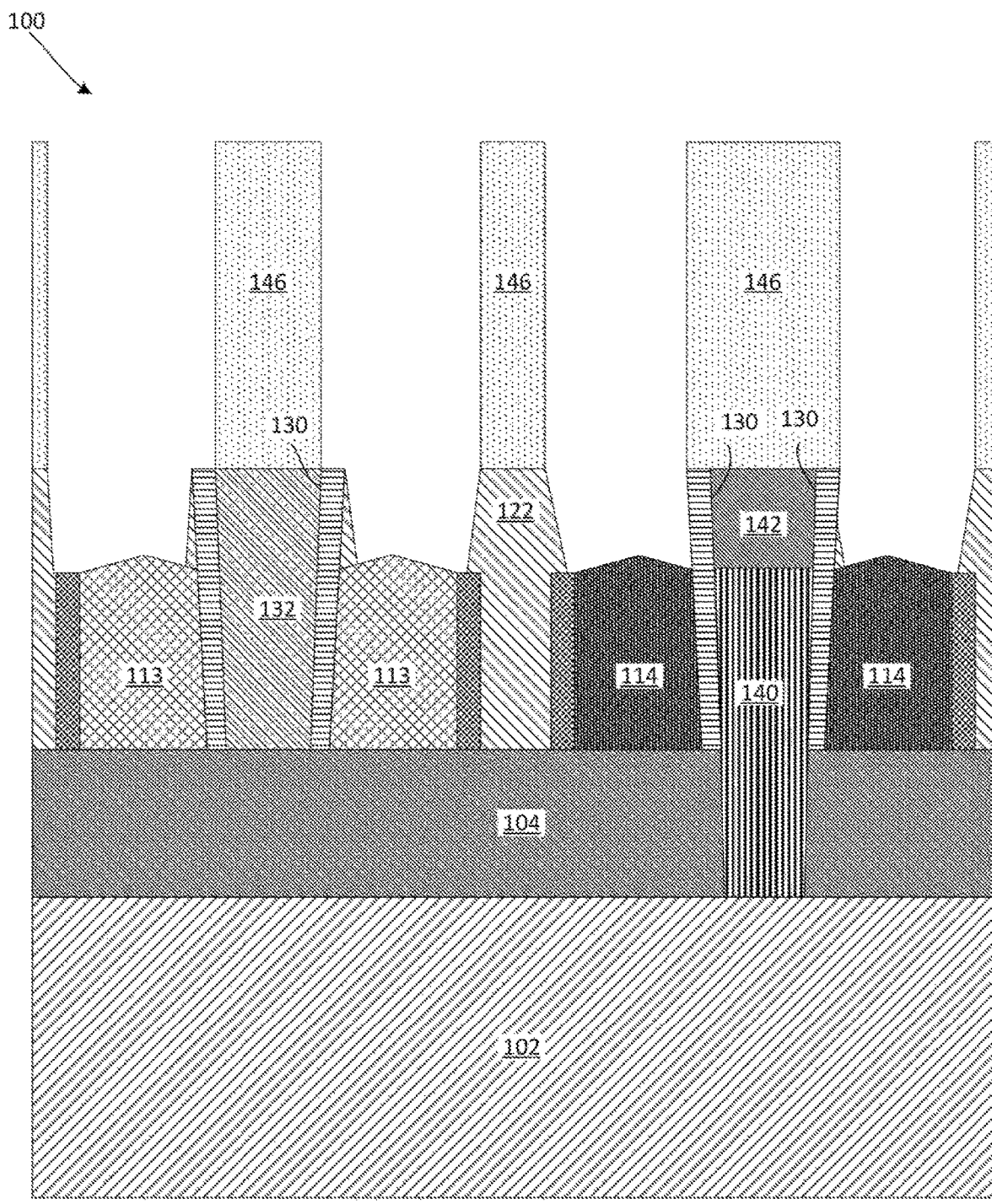
FIG. 12A is a cross-sectional view of the semiconductor device of FIG. 11A after additional fabrication operations and taken along the Y line of FIG. 12C, according to embodiments.
Figure 12B:
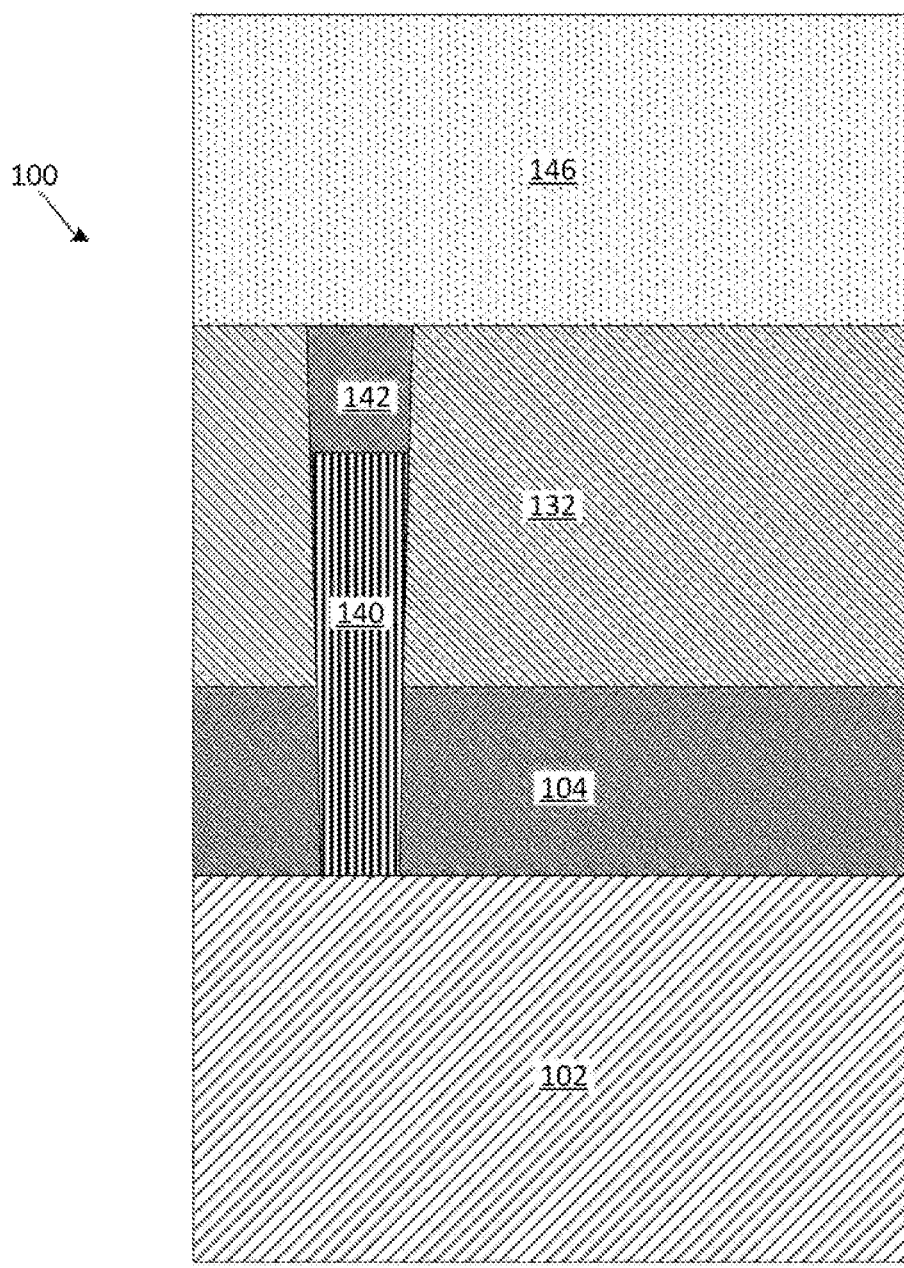
FIG. 12B is a cross-sectional view of the semiconductor device of FIG. 11B after additional fabrication operations and taken along the X line of FIG. 12C, according to embodiments.
Figure 12C:
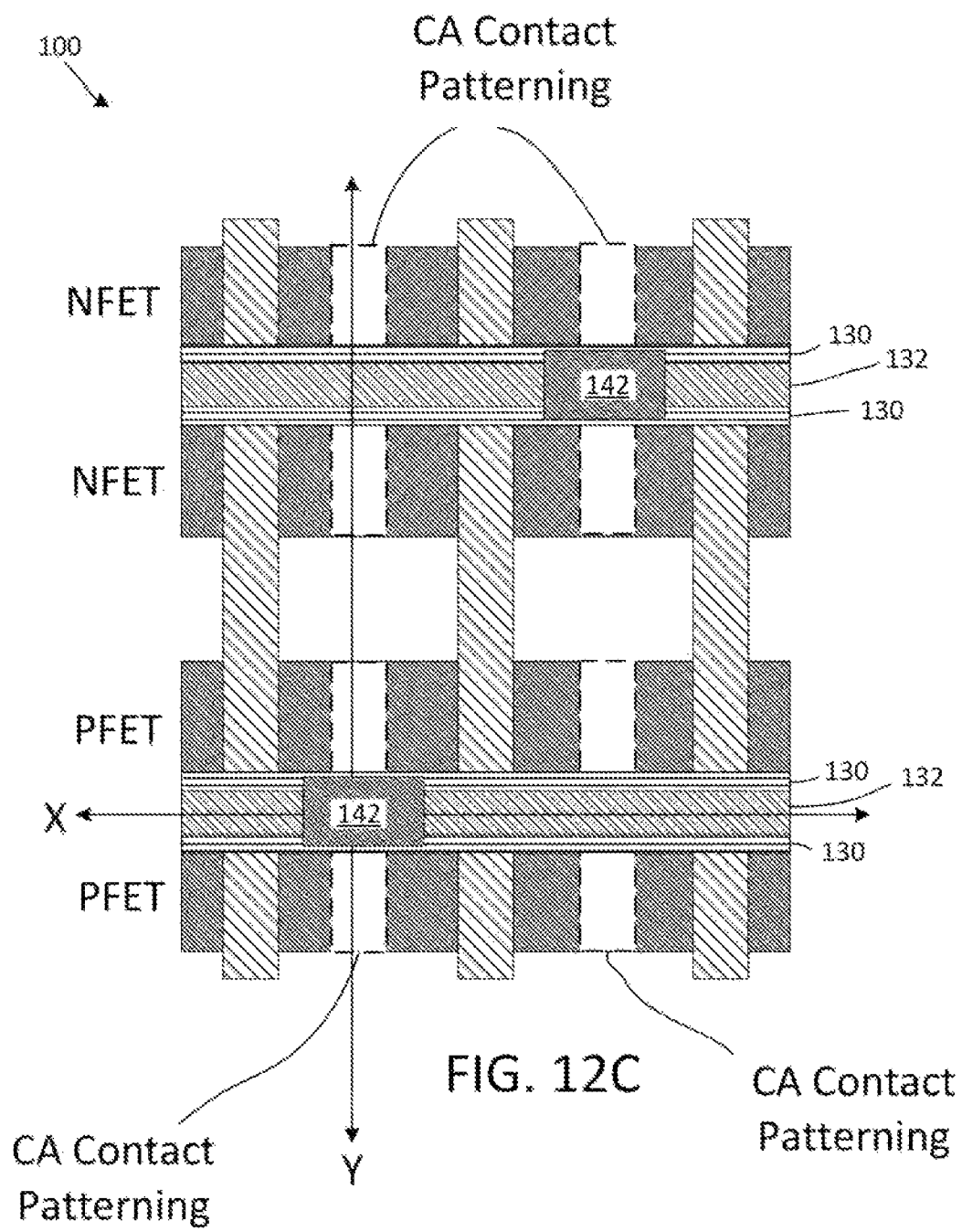
FIG. 12C is a top view of the semiconductor device of FIG. 12A, according to embodiments.

Referring now to FIG. 12A, this figure depicts a cross-sectional view of the semiconductor device 100 shown in FIG. 11A after additional manufacturing operations and taken along line Y of FIG. 12C, according to embodiments. As shown in FIGS. 12A and 12B (a cross-sectional view of the semiconductor device 100 shown in FIG. 11B after additional manufacturing operations and taken along line X of FIG. 12C), a third OPL layer 146 is formed on the top surface of the ILD layer 122. Then, the third OPL layer 146 is patterned to have openings corresponding to areas above the n-type epitaxial regions 113 and the p-type epitaxial regions 114. As shown in FIG. 12A, these openings expose the top surfaces of the n-type epitaxial regions 113 and the p-type epitaxial regions 114. These openings correspond to locations where the first type metal contacts (CA) will be formed, as discussed in further detail below. In certain examples, the patterning and etching process is a self-aligned process. The locations of the CA contact patterning areas are also shown in the top down view of FIG. 12C.

Figure 13A:
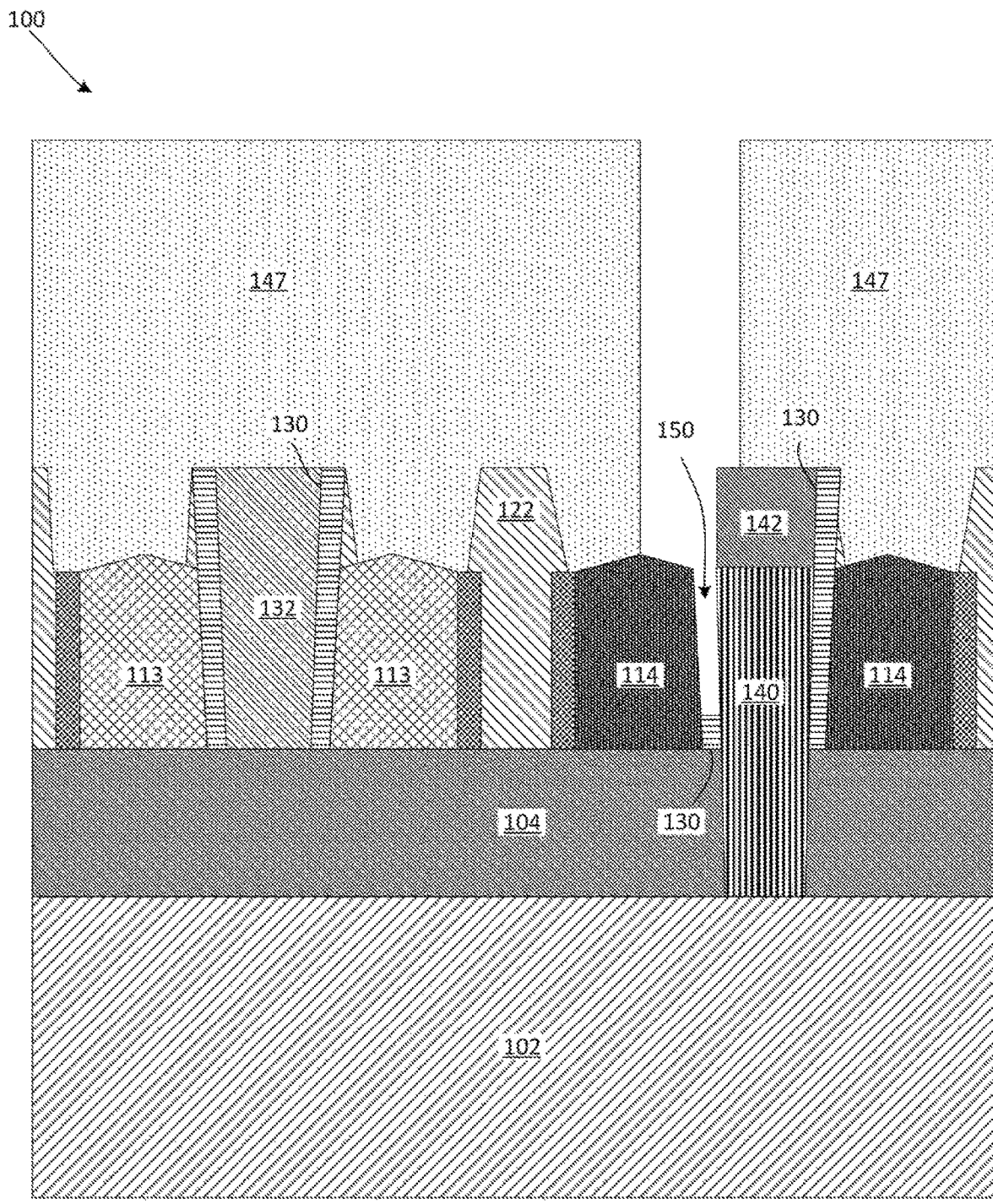
FIG. 13A is a cross-sectional view of the semiconductor device of FIG. 12A after additional fabrication operations and taken along the Y line of FIG. 13C, according to embodiments.
Figure 13B:
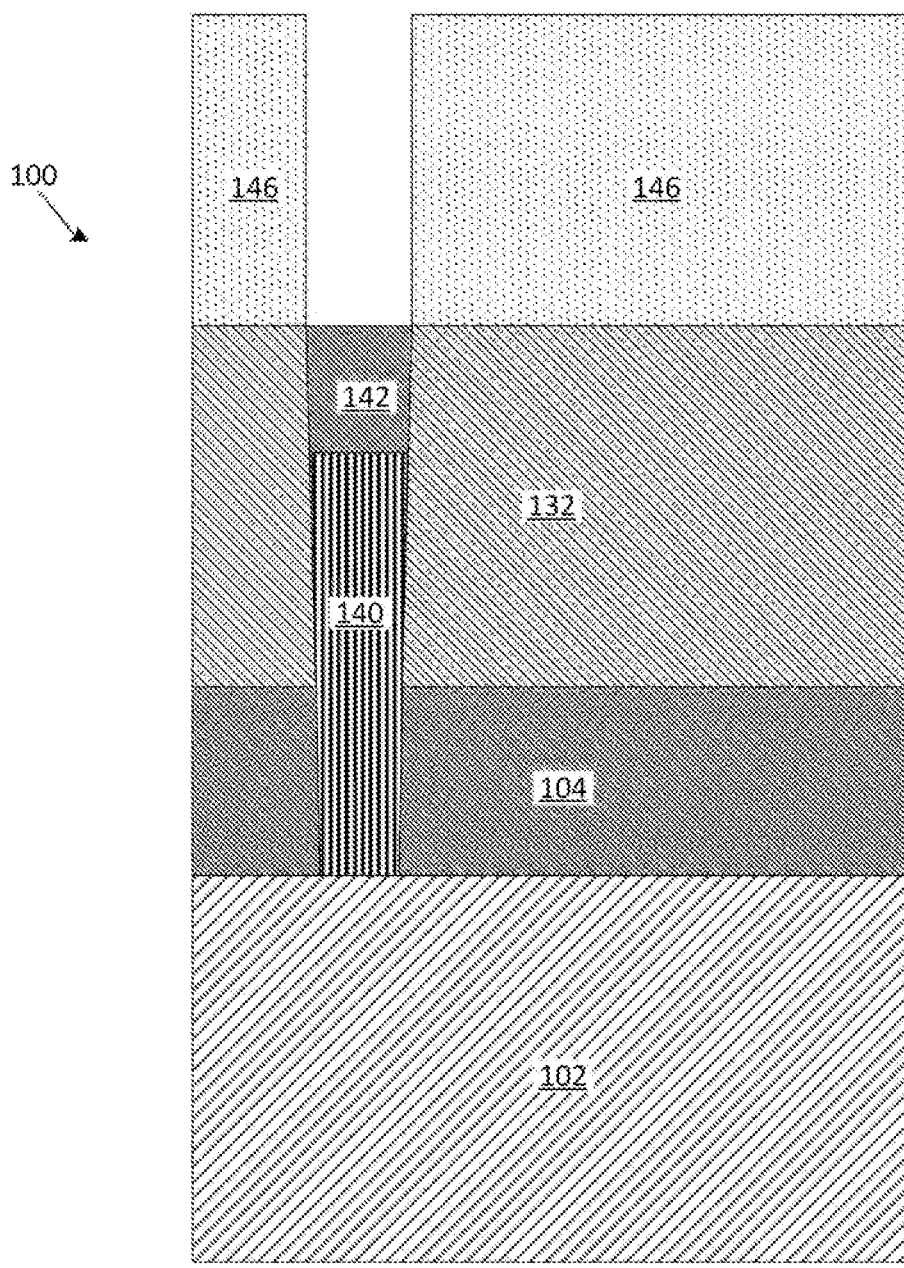
FIG. 13B is a cross-sectional view of the semiconductor device of FIG. 12B after additional fabrication operations and taken along the X line of FIG. 13C, according to embodiments.
Figure 13C:
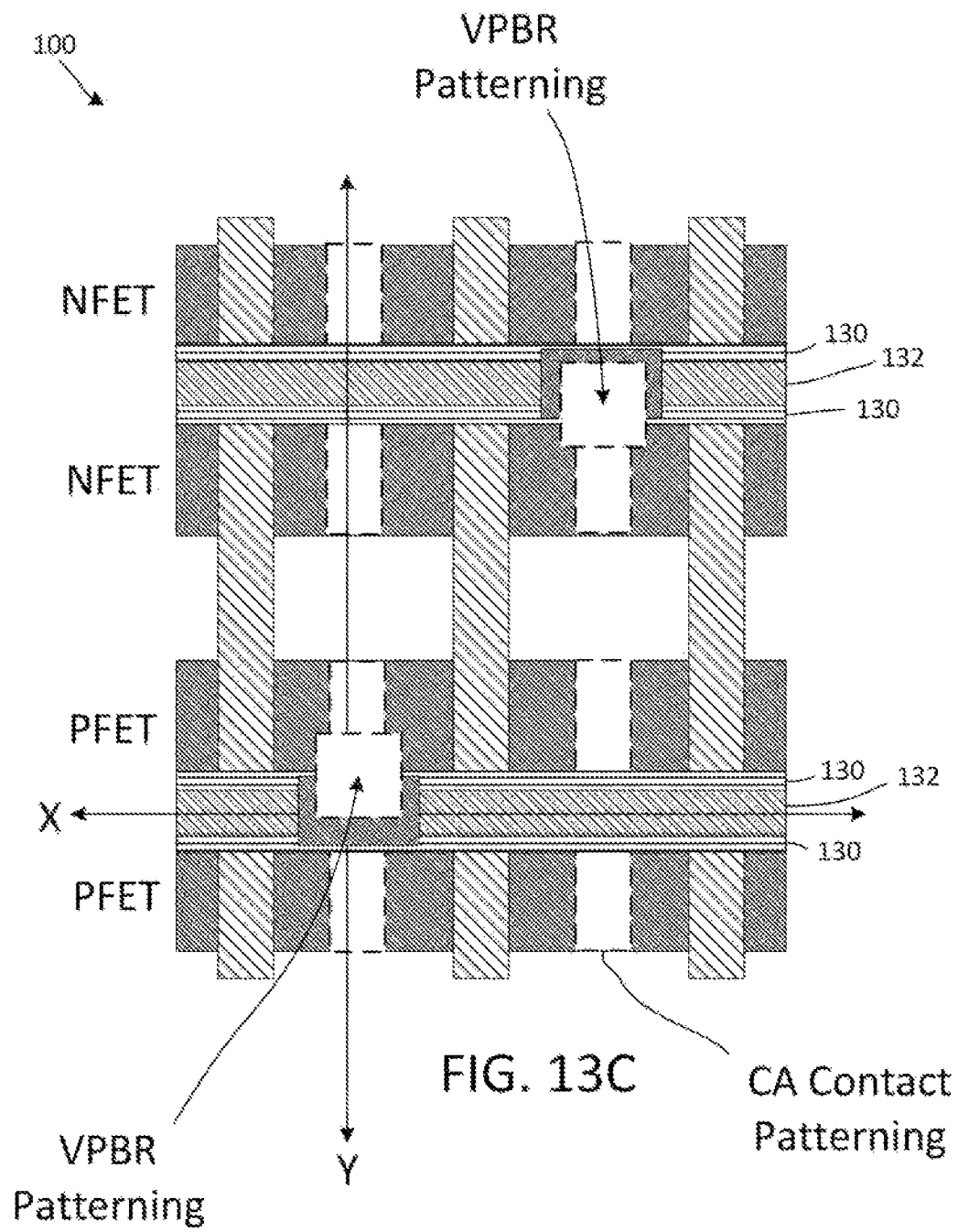
FIG. 13C is a top view of the semiconductor device of FIG. 13A, according to embodiments.

Referring now to FIG. 13A, this figure depicts a cross-sectional view of the semiconductor device 100 shown in FIG. 12A after additional manufacturing operations and taken along line Y of FIG. 13C, according to embodiments. As shown in FIGS. 13A and 13B (a cross-sectional view of the semiconductor device 100 shown in FIG. 12B after additional manufacturing operations and taken along line X of FIG. 13C), a fourth OPL layer 147 is formed on the top surface of the ILD layer 122. Then, the fourth OPL layer 147 is patterned to have openings corresponding to areas where the VBPR will be formed. As shown in FIG. 13A, one of these openings exposes a portion of the top surface of the left side p-type epitaxial region 114 (as shown in FIG. 13A) and expose the dielectric fill layer 142 (as shown in FIG. 13B). These openings correspond to locations where the VBPRs will be formed, as discussed in further detail below. In certain examples, the patterning and etching process is a self-aligned process. The locations of the first contact patterning areas CA are also shown in the top down view of FIG. 13C. After the VBPR via formation etching process is complete, as shown in FIG. 13A, another selective etching process is performed to remove a portion of the first dielectric spacer layer 130 in the space 150 where the left side p-type epitaxial region 114 is located. Thus, this second etching process exposes one side of the left side p-type epitaxial region 114. Although it is shown in FIG. 13A that a small portion of the first dielectric spacer layer 130 remains at the bottom of the space 150, it should be appreciated that in other examples, all of the first dielectric spacer layer 130 may be removed in this space 150.

Figure 14A:
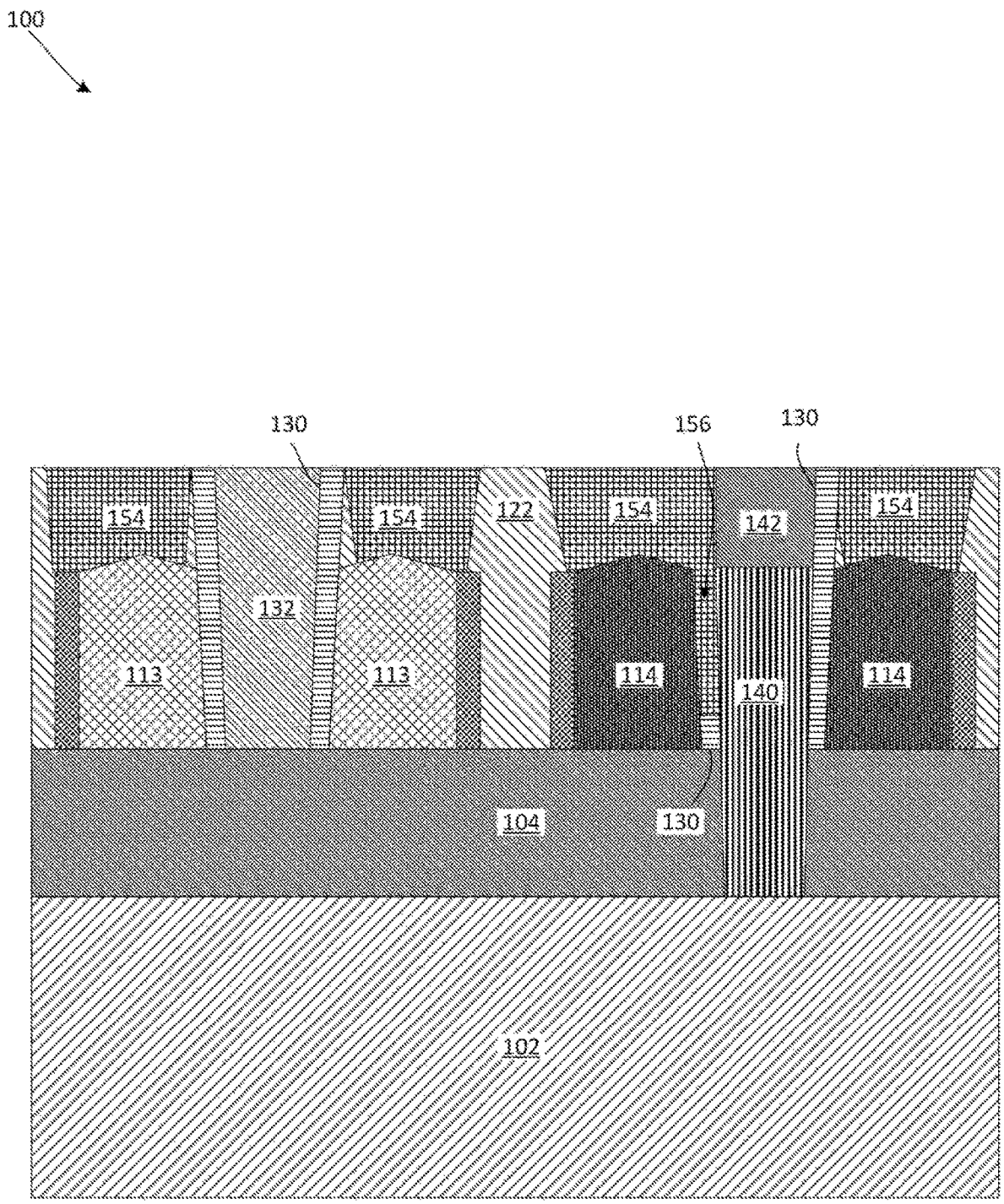
FIG. 14A is a cross-sectional view of the semiconductor device of FIG. 13A after additional fabrication operations and taken along the Y line of FIG. 14C, according to embodiments.
Figure 14B:
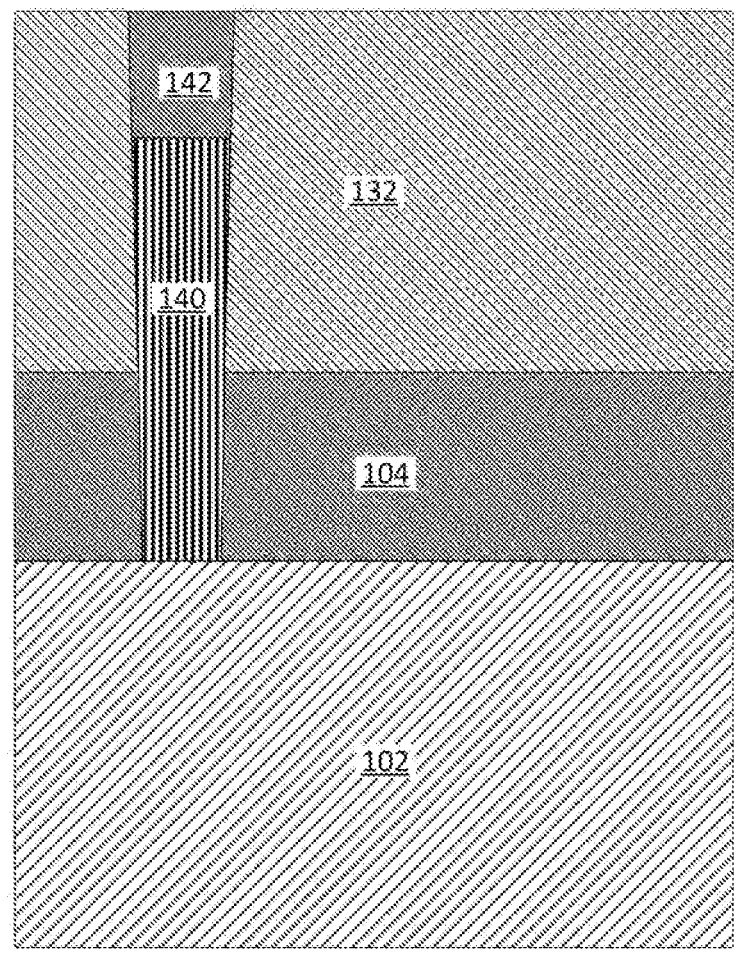
FIG. 14B is a cross-sectional view of the semiconductor device of FIG. 13B after additional fabrication operations and taken along the X line of FIG. 14C, according to embodiments.
Figure 14C:
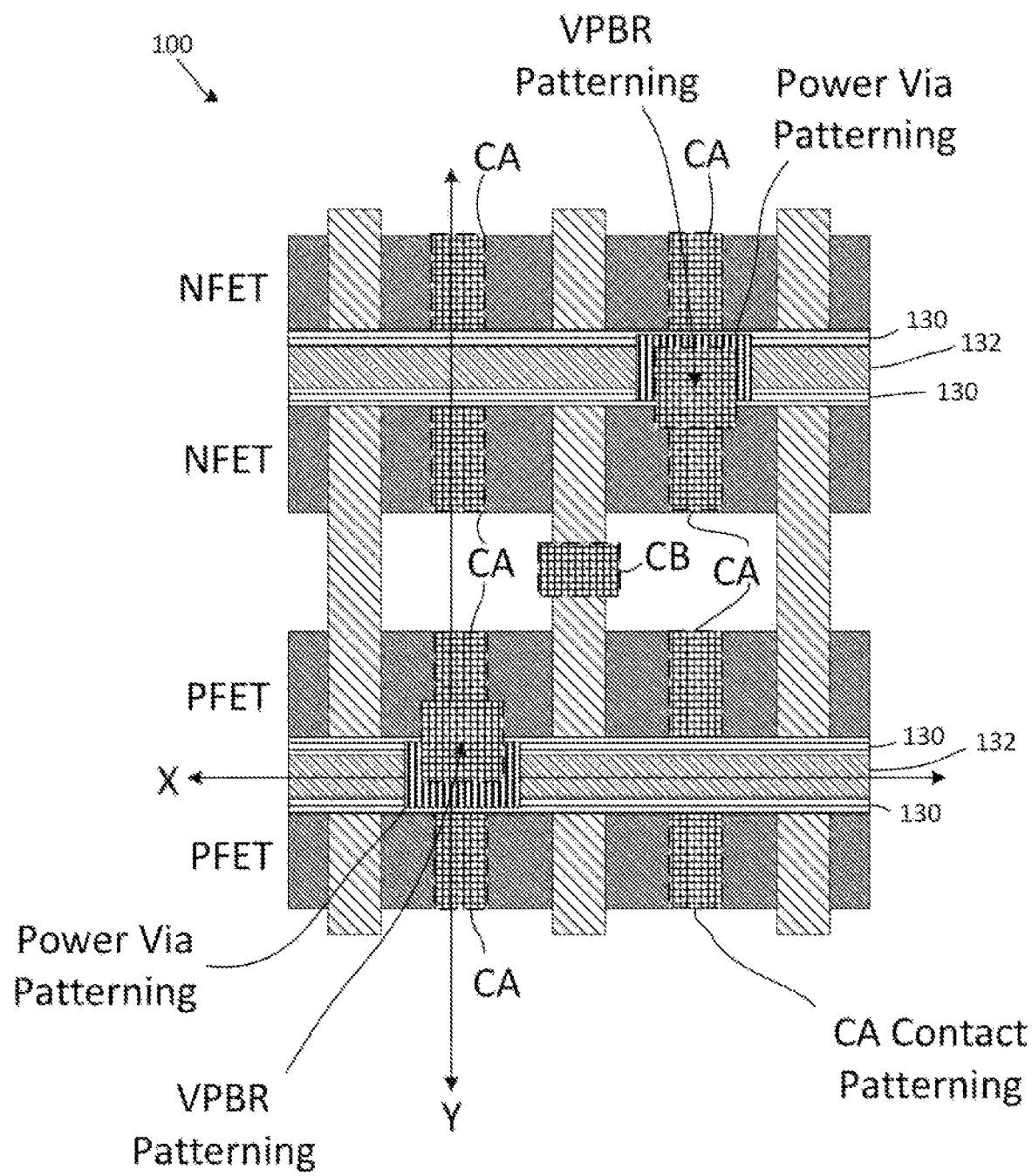
FIG. 14C is a top view of the semiconductor device of FIG. 14A, according to embodiments.

Referring now to FIG. 14A, this figure depicts a cross-sectional view of the semiconductor device 100 shown in FIG. 13A after additional manufacturing operations and taken along line Y of FIG. 14C, according to embodiments. As shown in FIG. 14C, the location of the second contact CB is shown. Although the formation of the gate contact CB is not apparent in the cross-sectional views of FIGS. 14A and 14B, it should be appreciated that the process for forming the gate contact CB may be the same as that described above for the patterning of the first contacts CA (i.e., deposition of another OPL layer and forming one or more openings for etching the second contact CB via). As shown in FIGS. 14A and 14B (a cross-sectional view of the semiconductor device 100 shown in FIG. 13B after additional manufacturing operations and taken along line X of FIG. 14C), first contacts CA 154 are formed in the vias created by the etching process described above with respect to FIGS. 13A-13C. Also, the VBPR 156 is formed above any remaining portion of the first dielectric spacer layer and between the power via 140 and the left side p-type epitaxial region 114. The first contacts CA 154, the gate contact CB and the VBPR 156 are also shown in the top-down view of FIG. 14C.

Figure 15A:
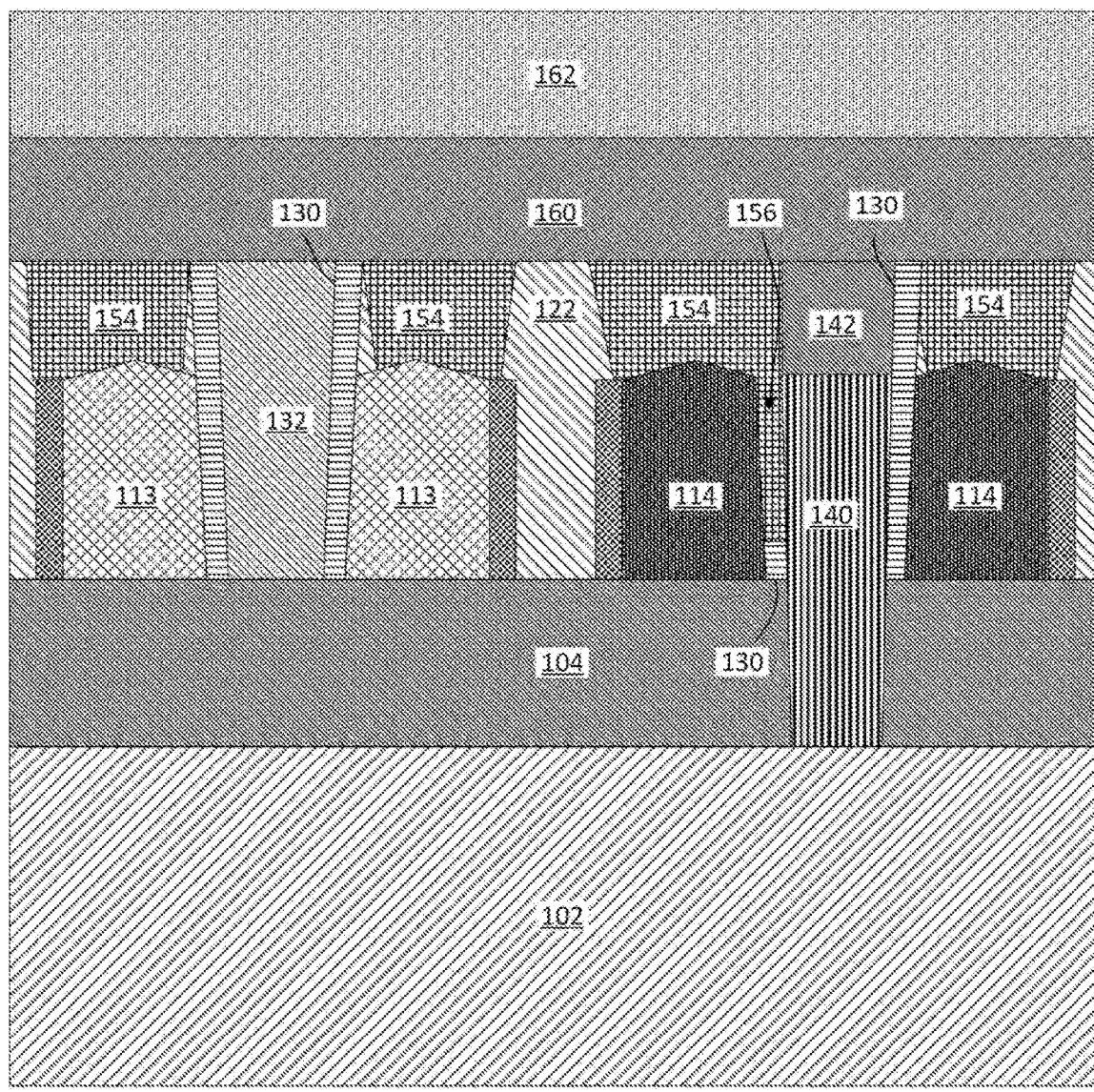
FIG. 15A is a cross-sectional view of the semiconductor device of FIG. 14A after additional fabrication operations and taken along the Y line of FIG. 14C, according to embodiments.
Figure 15B:
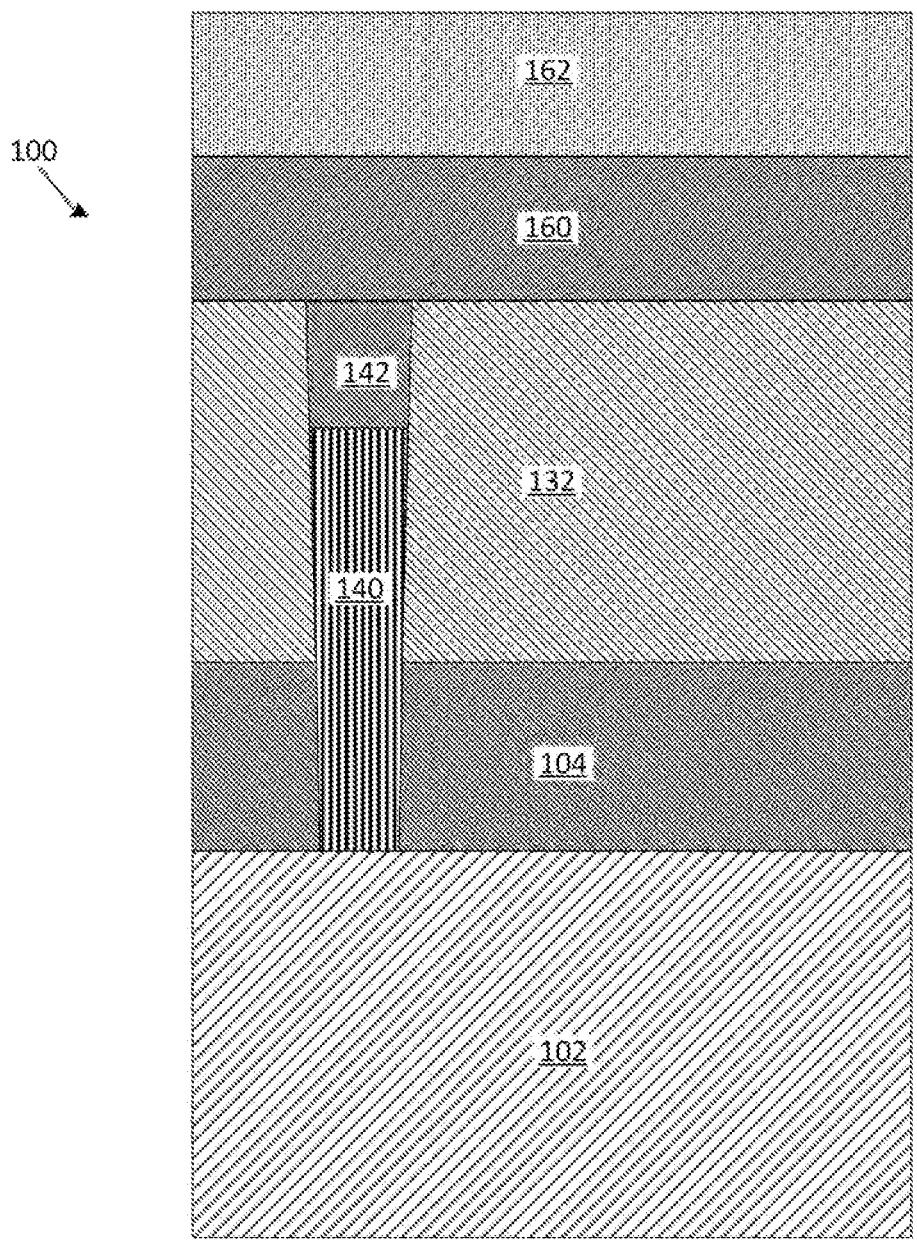
FIG. 15B is a cross-sectional view of the semiconductor device of FIG. 14B after additional fabrication operations and taken along the X line of FIG. 14C, according to embodiments.

Referring now to FIG. 15A, this figure depicts a cross-sectional view of the semiconductor device 100 shown in FIG. 14A after additional manufacturing operations and taken along line Y of FIG. 14C, according to embodiments. As shown in FIGS. 15A and 15B (a cross-sectional view of the semiconductor device 100 shown in FIG. 14B after additional manufacturing operations and taken along line Y of FIG. 14C), a back end of line (BEOL) structure 160 is formed on the top surface of the first contacts CA 154. In general, the BEOL is the second portion of IC fabrication where the individual devices (transistors, capacitors, resistors, etc.) get interconnected with wiring on the wafer and the metallization layer. BEOL generally begins when the first layer of metal is deposited on the wafer. BEOL includes contacts, insulating layers (dielectrics), metal levels, and bonding sites for chip-to-package connections. Then, a carrier wafer 162 is provided on the BEOL structure 160.

Figure 16A:
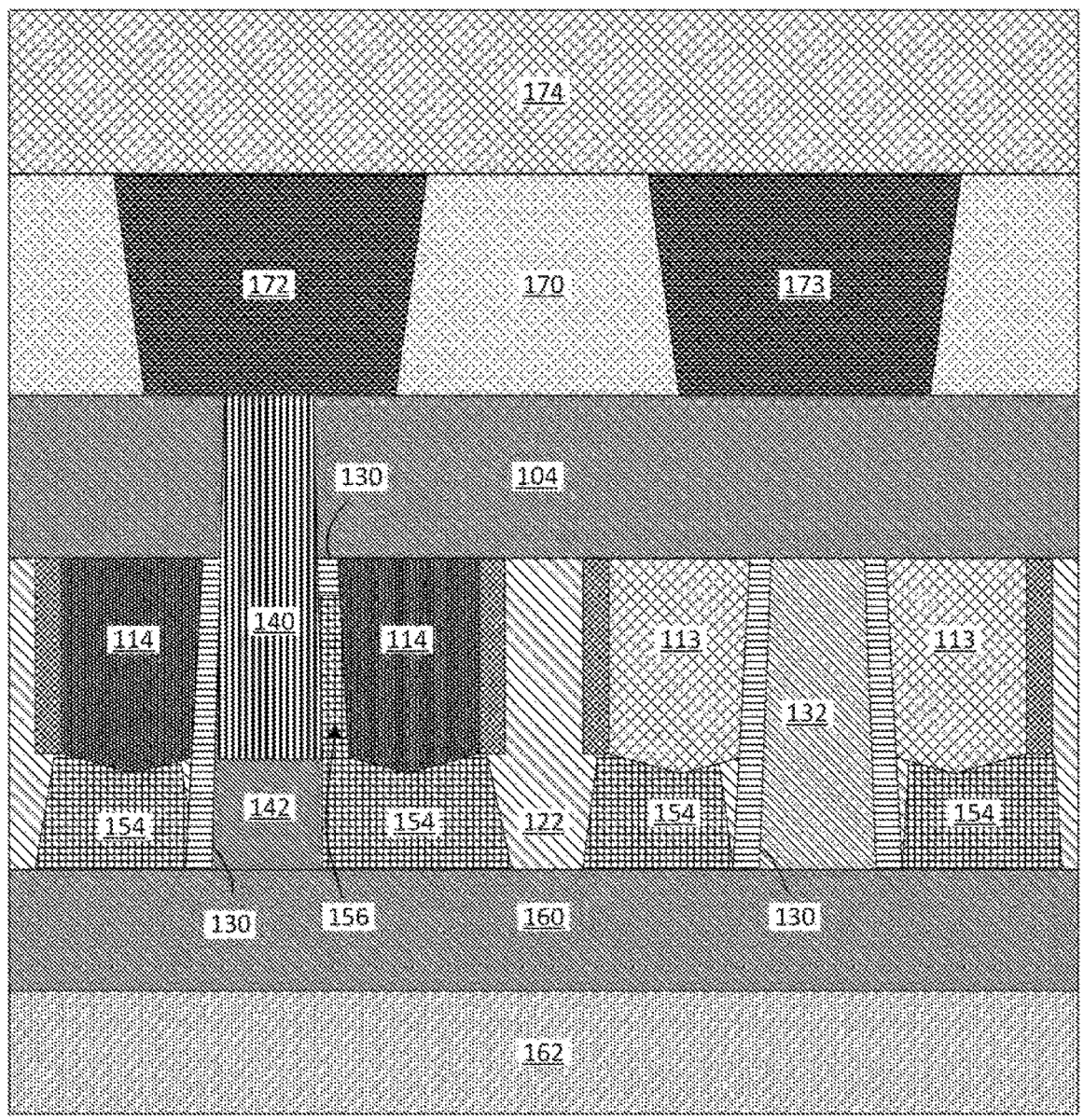
FIG. 16A is a cross-sectional view of the semiconductor device of FIG. 15A after additional fabrication operations and taken along the Y line of FIG. 14C, according to embodiments.
Figure 16B:
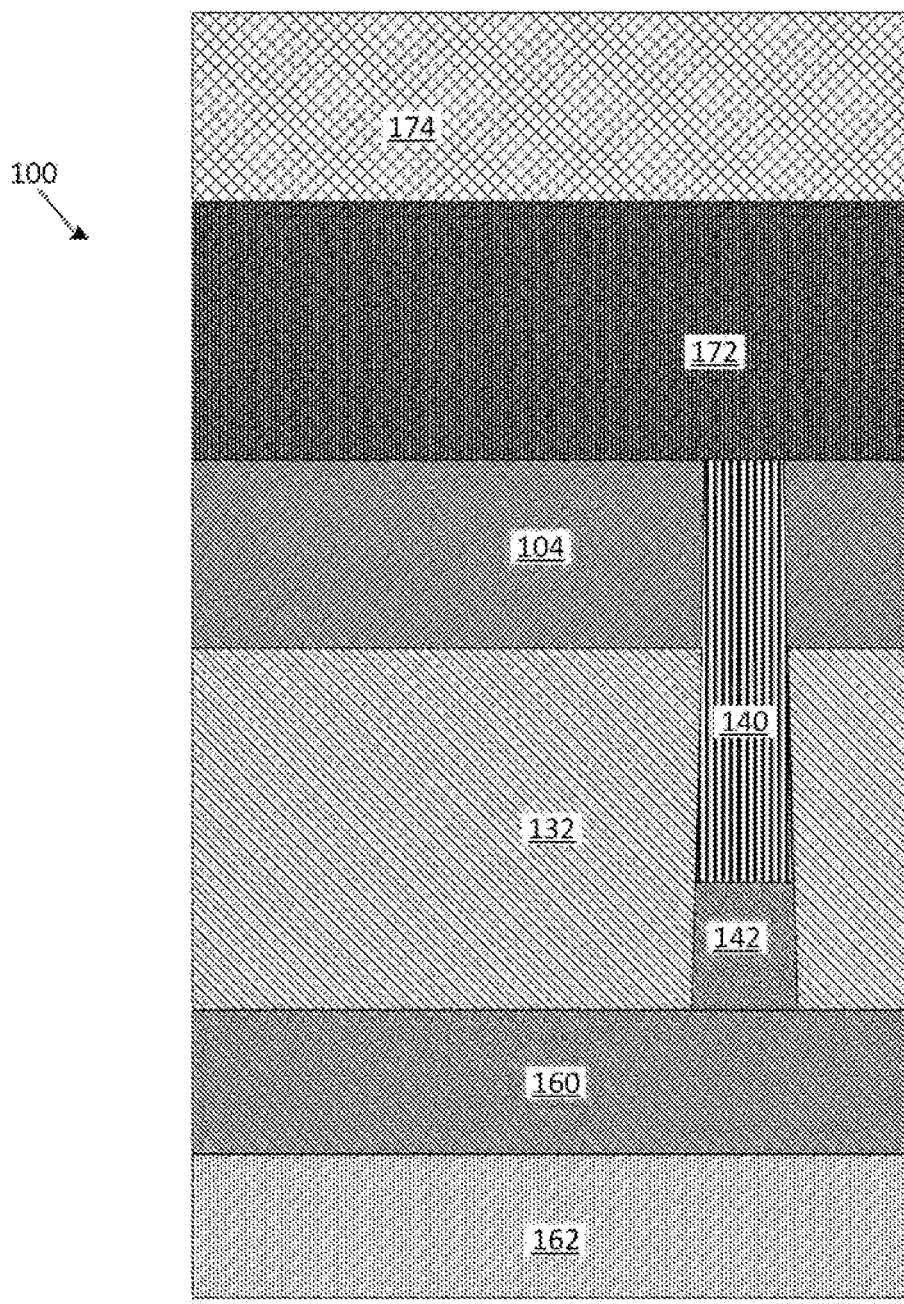
FIG. 16B is a cross-sectional view of the semiconductor device of FIG. 15B after additional fabrication operations and taken along the X line of FIG. 14C, according to embodiments.

Referring now to FIG. 16A, this figure depicts a cross-sectional view of the semiconductor device 100 shown in FIG. 15A after additional manufacturing operations and taken along line Y of FIG. 14C, according to embodiments. As shown in FIGS. 16A and 16B (a cross-sectional view of the semiconductor device 100 shown in FIG. 15B after additional manufacturing operations and taken along line Y of FIG. 14C), the semiconductor device 100 is flipped upside down and the substrate 102 is removed. After the substrate 102 is removed, a backside ILD layer 170 is formed. The backside ILD layer 170 may include one or more suitable dielectric materials. Vias are then formed in the backside ILD layer 170 with any suitable material removal process, and a first backside power rail (BPR) 172 (e.g., VDD) and a second BPR 173 (e.g., VSS) are formed in the vias. Finally, a backside power distribution network (BSPDN) 174 is formed on the first BPR 172 and second BPR 173.

Figure 17A:
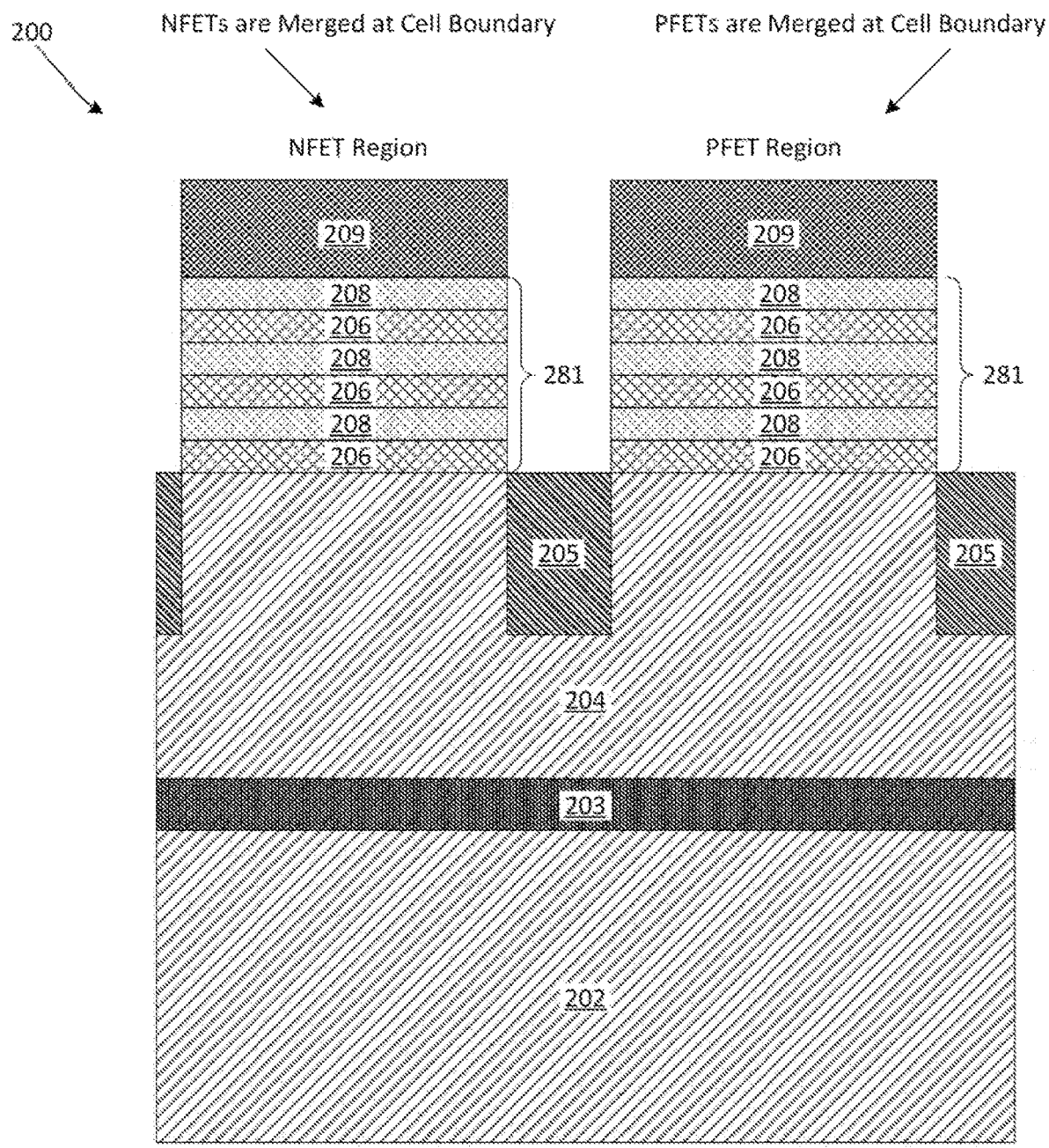
FIG. 17A is a cross-sectional view of a semiconductor device at an intermediate stage of the fabrication process and taken along the Y1 line of FIG. 17B, according to embodiments.
Figure 17B:
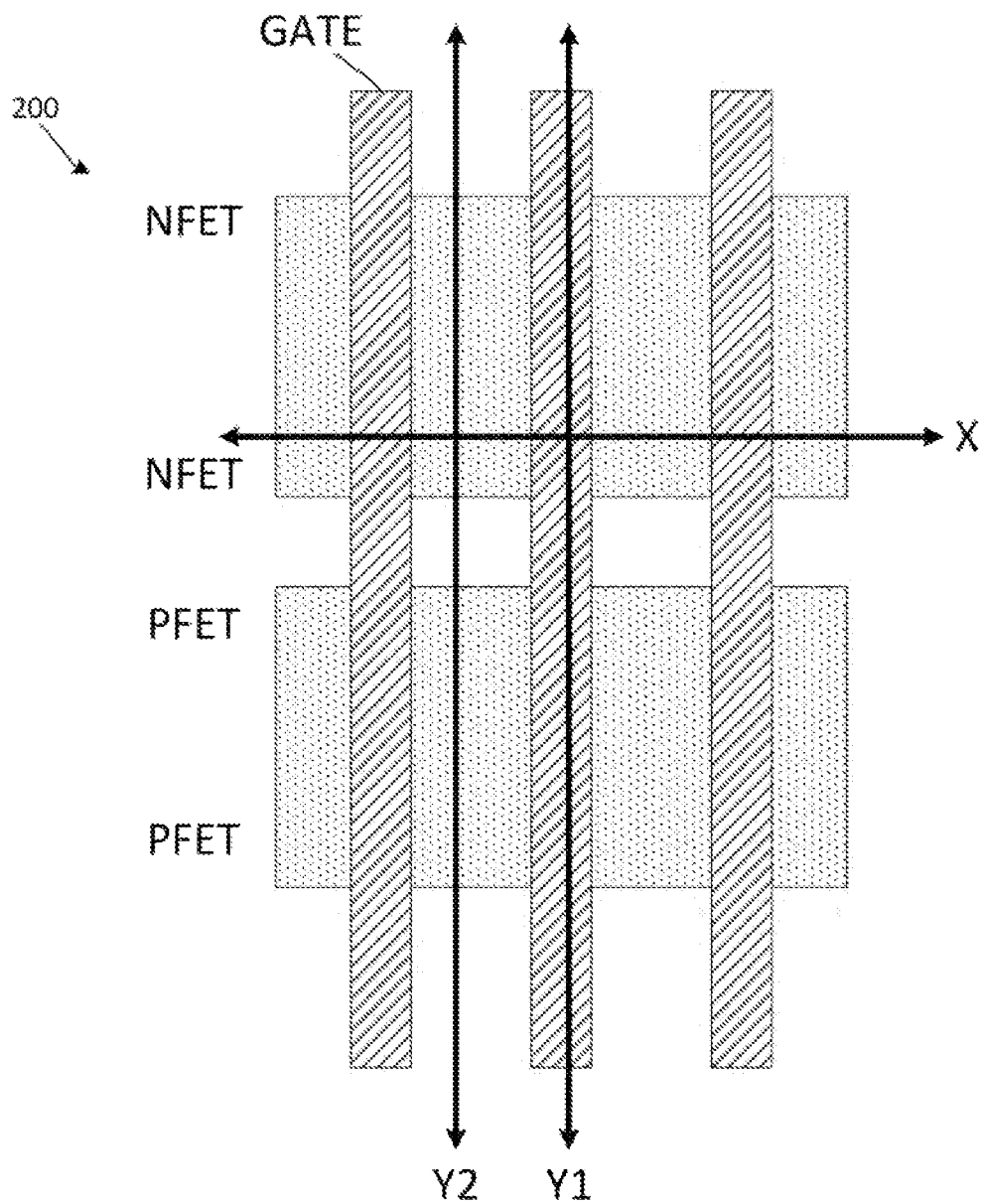
FIG. 17B is a top view of the semiconductor device of FIG. 17A, according to embodiments.

Referring now to FIG. 17A, this figure depicts a cross-sectional view of the semiconductor device 200 shown in FIG. 17B taken along line Y1, according to embodiments. FIG. 17B is a simplified top-down (or plan) view of the semiconductor device 200 to show the various NFET regions, the PFET regions, the location of the gate cuts, and various other metal contacts as described in further detail below. As shown in FIG. 17A, a substrate 202 is provided. The substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 202 may also be a semiconductor on insulator (SOI) substrate. The substrate 202 may be comprised of any other suitable material(s) that those listed above. In some embodiments, the substrate 202 includes both semiconductor materials and dielectric materials. In some embodiments, an etch stop layer 203 is formed on the substrate 202. The etch stop layer 203 may comprise, for example, SiGe or any other suitable material. On top of the etch stop layer 203, and additional silicon layer 204 is formed.

As shown in FIG. 17A, multi-layer nanosheet stacks 281 are formed on the additional silicon layer 204. The nanosheet stacks 281 include a first type sacrificial layer 206, followed by the formation of an active semiconductor layer 208. In certain examples, the first one of the first type sacrificial layers 206 (i.e., the bottommost first type sacrificial layer) is initially formed directly on an upper surface of the additional silicon layer 204. In other examples, certain layers may be formed between the upper surface of the additional silicon layer 204 and the first one of the first type sacrificial layers 206. In an example, the first type sacrificial layer 206 is composed of silicon-germanium (e.g., SiGe35, or more generally, where the Ge ranges from about 15-35%). Next, an active semiconductor layer 208 is formed on an upper surface of the first one of the first type sacrificial layers 206. In an example, the active semiconductor layer 208 is composed of silicon. Several additional layers of the first type sacrificial layer 206 and the active semiconductor layer 208 are alternately formed. In the example illustrated in FIG. 18A, there are a total of three first type sacrificial layers 206 and three active semiconductor layers 208 that are alternately formed to form the nanosheet stack 281. However, it should be appreciated that any suitable number of alternating layers may be formed.

In certain embodiments, the first type sacrificial layers 206 have a vertical thickness ranging, for example, from approximately 3 nm to approximately 20 nm. In certain embodiments, the active semiconductor layers 208 have a vertical thickness ranging, for example, from approximately 3 nm to approximately 10 nm. Although the range of 3-20 nm is cited as an example range of thickness, other thickness of these layers may be used. In certain examples, certain of the first type sacrificial layers 206 and the active semiconductor layers 208 may have different thicknesses relative to one another. Therefore, multiple epitaxial growth processes can be performed to form the first type sacrificial layers 206 and the active semiconductor layers 208 shown in FIG. 17A.

In certain embodiments, it may be desirable to have a small vertical spacing (VSP) between adjacent nanosheet layers in a stack of nanosheets to reduce the parasitic capacitance and to improve circuit speed. For example, the VSP (the distance between the bottom surface of a first nanosheet layer and the top surface of an adjacent second nanosheet layer) may range from 5 nm to 15 nm. However, the VSP must be of a sufficient value to accommodate the gate stack that will be formed in the spaces created by later removal of the first type sacrificial layers 206. As shown in FIG. 17A, the semiconductor device 200 is patterned to create the patterned nanosheet stacks 281. As shown in FIG. 17A, one or more hardmask layers 209 and/or nitride layers may be patterned and sized to correspond to what will later be the active region (RX) of the FETs. Any suitable combination of deposition, lithography and material removal processes may be used to form and pattern the hardmask and nitride layer. The hardmask may comprise, for example, SiN, SiC or SiCO. The semiconductor device 200 is then patterned using the hardmask to create the patterned nanosheet stacks 281, and then the hardmasks and/or nitride layers may be removed. As shown in FIG. 17A, there is an NFET region and a PFET region. The NFETs are merged at the cell boundary, and the PFETs are merged at the cell boundary. As also shown in FIG. 17A, shallow trench isolation (STI) regions 205 are formed in the additional silicon layer 204 between the NFET and PFET regions.

Figure 18A:
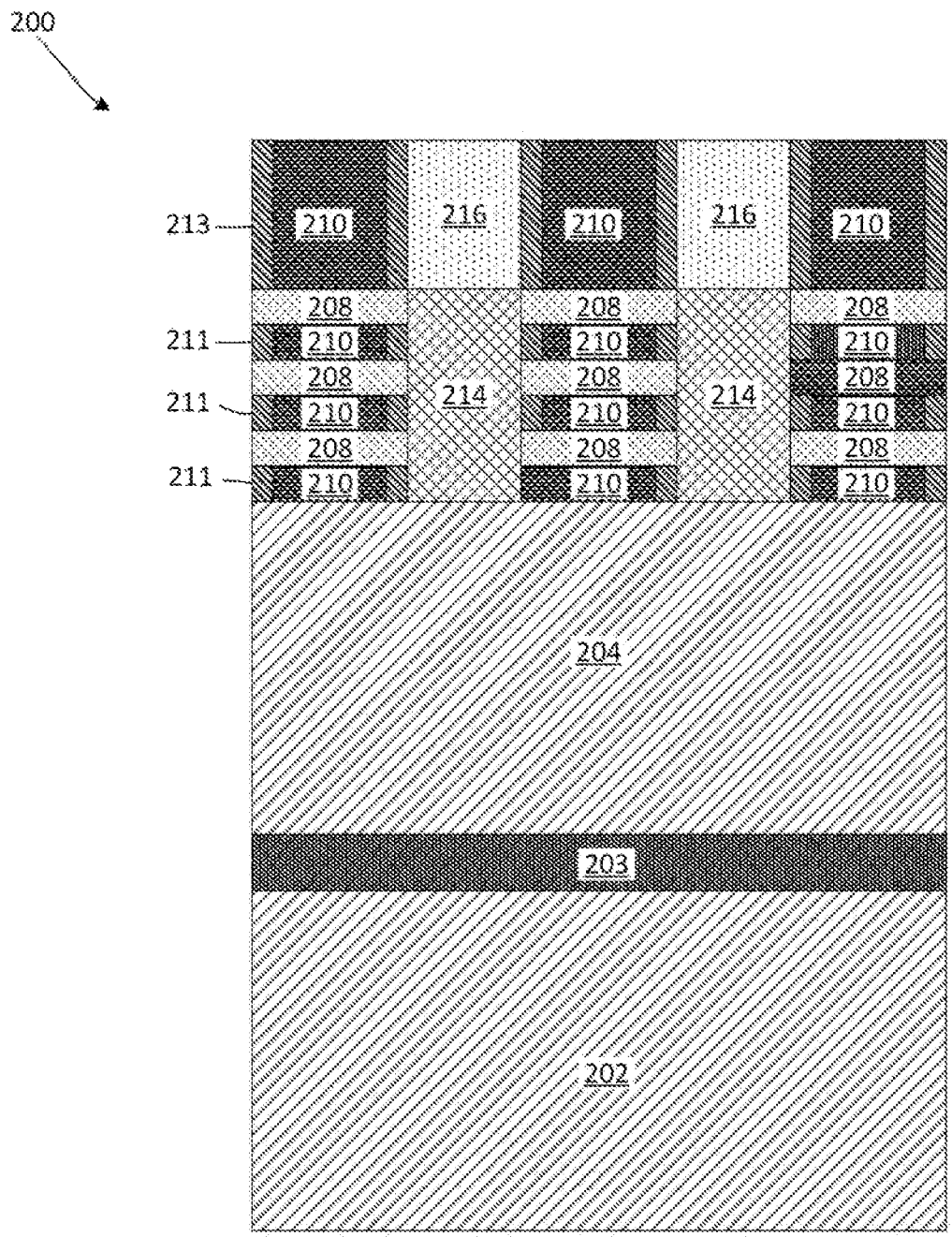
FIG. 18A is a cross-sectional view of the semiconductor device of FIG. 17A after additional fabrication operations and taken along the X line of FIG. 17B, according to embodiments.

Referring now to FIG. 18A, this figure is a cross-sectional view of the semiconductor device of FIG. 17A after additional fabrication operations and taken along the X line of FIG. 17B, according to embodiments. As shown in FIG. 18A, in a process that may be similar to that described above with respect to FIG. 2A, the first type sacrificial layers 206 are removed, the inner spacers 211 are formed, the n-type S/D epitaxial layers 214 (see, FIGS. 18A and 18C) are formed, and the p-type S/D epitaxial layers 215 (see, FIG. 18C) are formed. Although not shown in FIGS. 18A-18C, a dummy gate may be formed first in a manner similar to that described above, followed by gate spacer 213 formation. Then, the nanosheet stacks 281 are recessed to remove a portion of the first type sacrificial layers 206, followed by inner spacer 211 formation. In particular, a selective etching process is performed, which is capable of removing portions of the first type sacrificial layers 206. The selective etching process can use a boron-based chemistry or a chlorine-based chemistry, for example, which selectively recesses the exposed portions second type sacrificial layers 206 without significantly attacking the surrounding materials such as the active semiconductor layers 208. Then, the inner spacers 211 are formed in the indents created by the removal of the portions of the first type sacrificial layers 206. An isotropic etching process may optionally be performed to clean up the edges of the inner spacers 211. After inner spacer 211 and n-type S/D epitaxial layers 214 and p-type S/D epitaxial layers 215 formation, and ILD layer 216 is deposited followed by CMP to expose the dummy gate. After the removal of the dummy gate and first type sacrificial layer 206, a high-K metal gate (HKMG) 210 is formed.

Figure 18B:
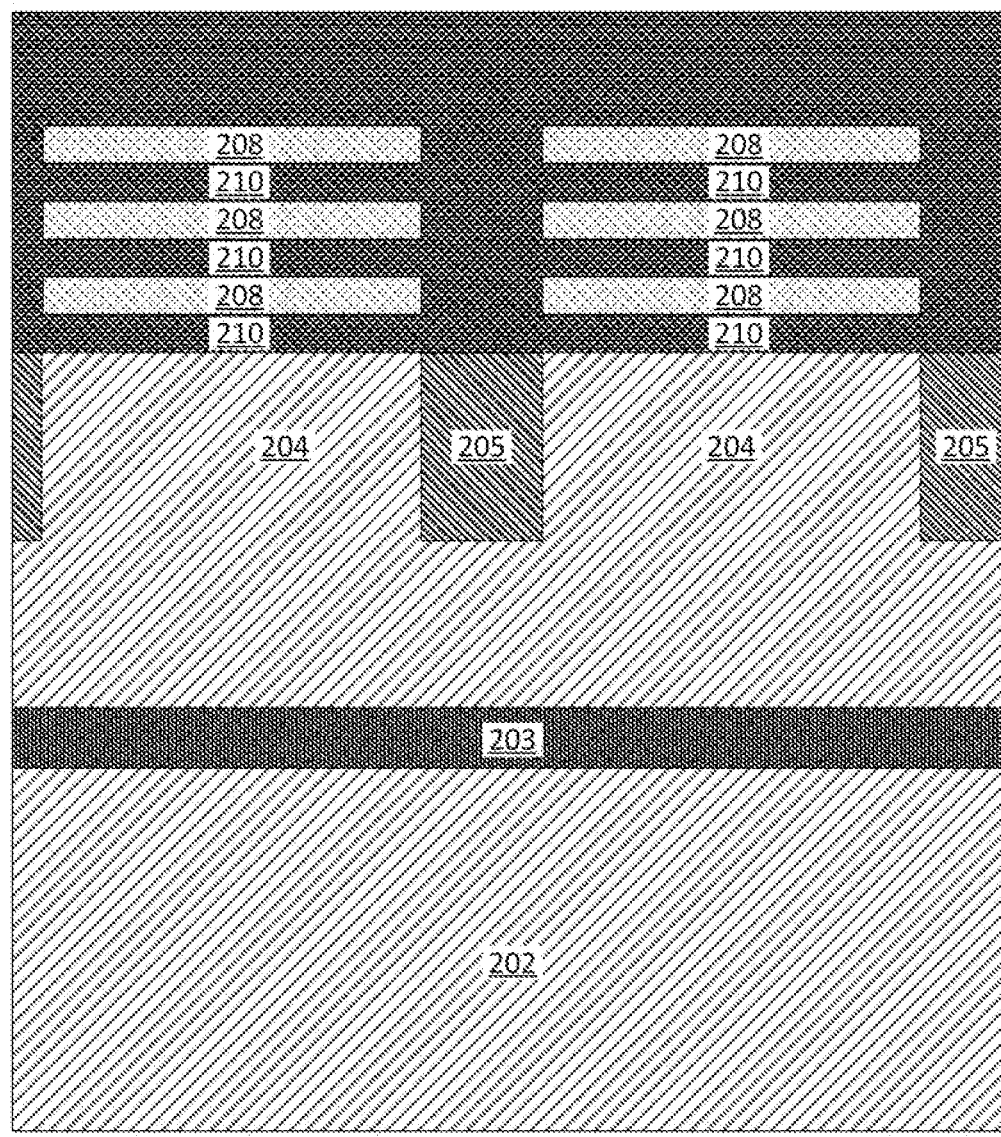
FIG. 18B is a cross-sectional view of the semiconductor device of FIG. 17A after additional fabrication operations and taken along the Y1 line of FIG. 17B, according to embodiments.
Figure 18C:
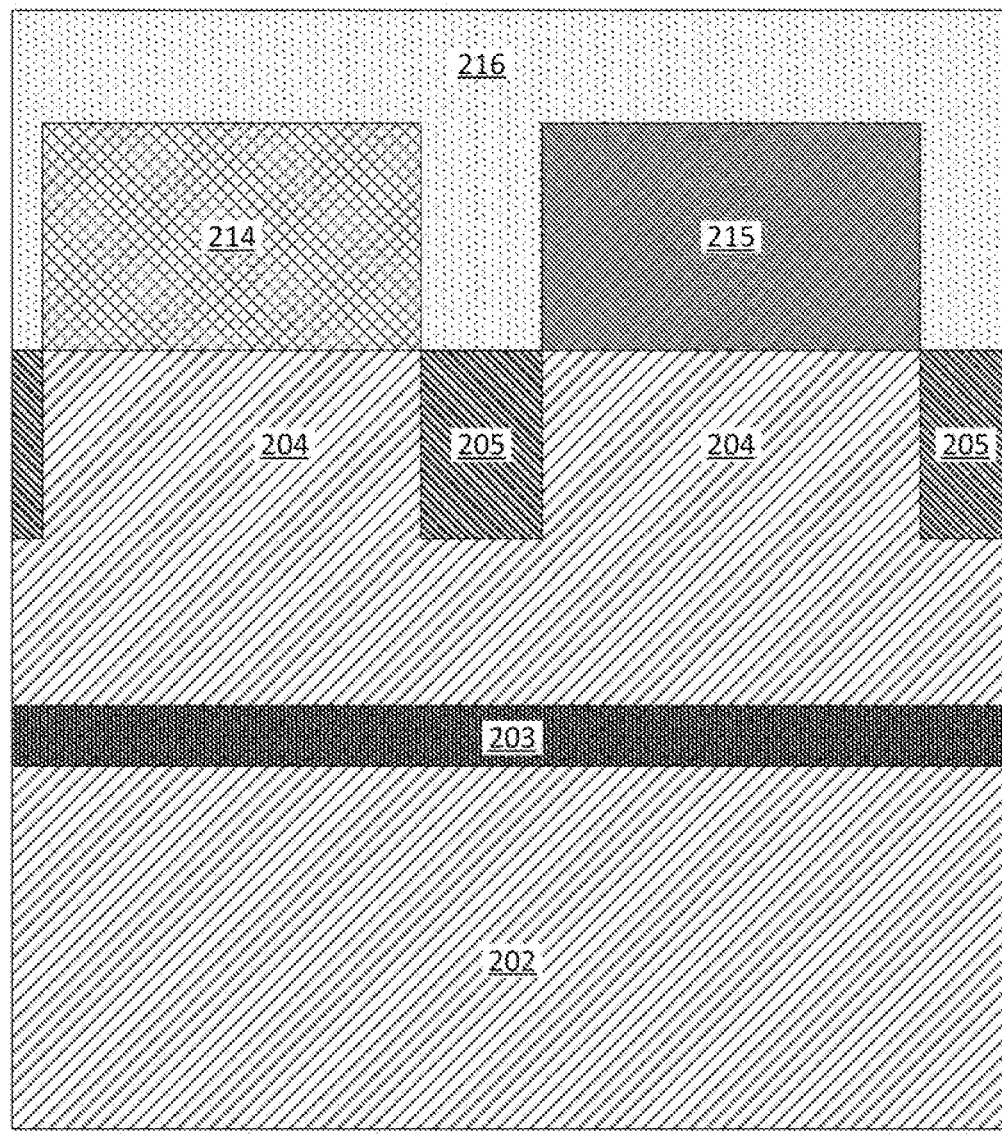
FIG. 18C is a cross-sectional view of the semiconductor device of FIG. 17A after additional fabrication operations and taken along the Y2 line of FIG. 17B, according to embodiments.
Figure 19A:
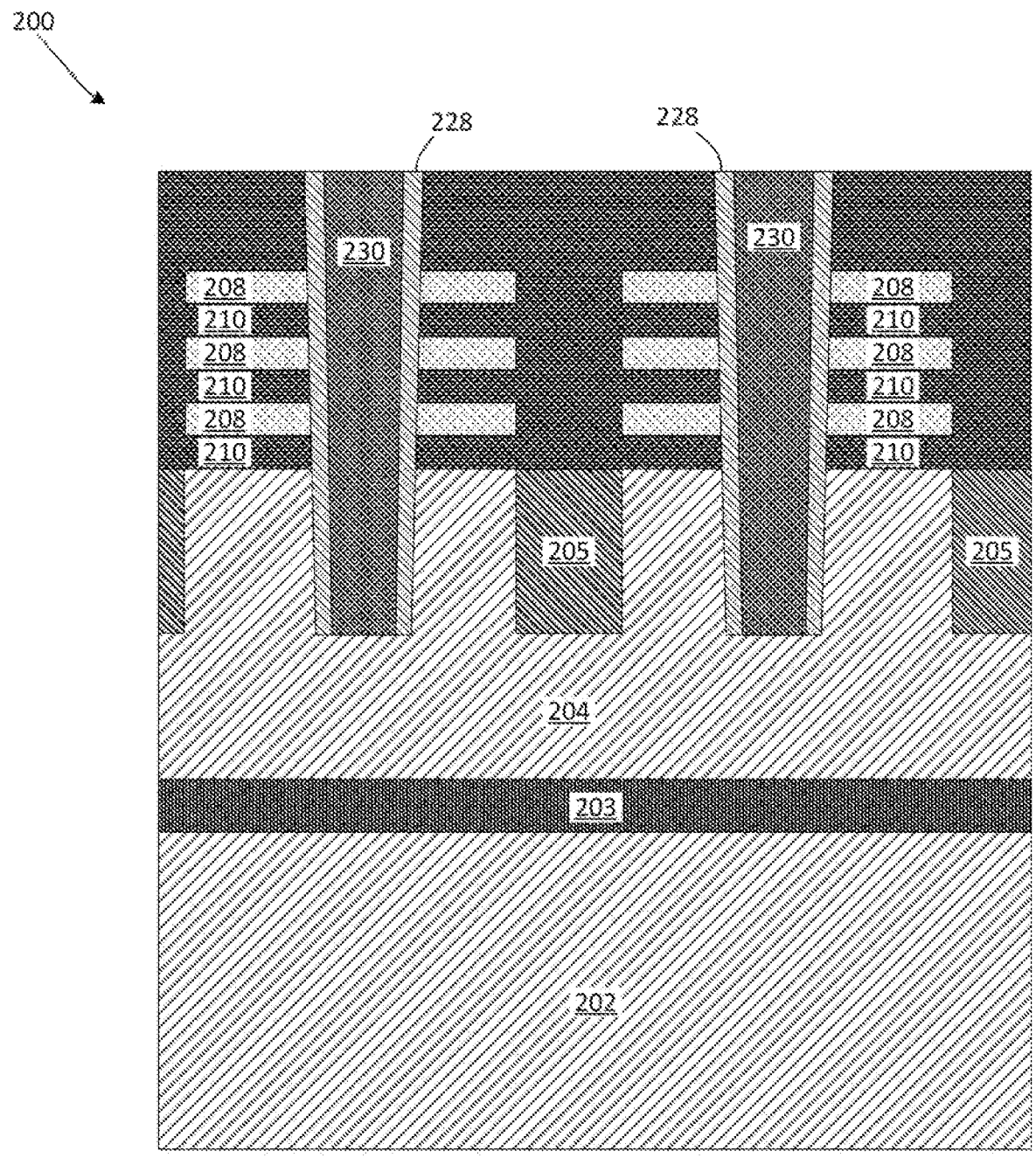
FIG. 19A is a cross-sectional view of the semiconductor device of FIG. 18B after additional fabrication operations and taken along the Y1 line of FIG. 19C, according to embodiments.
Figure 19B:
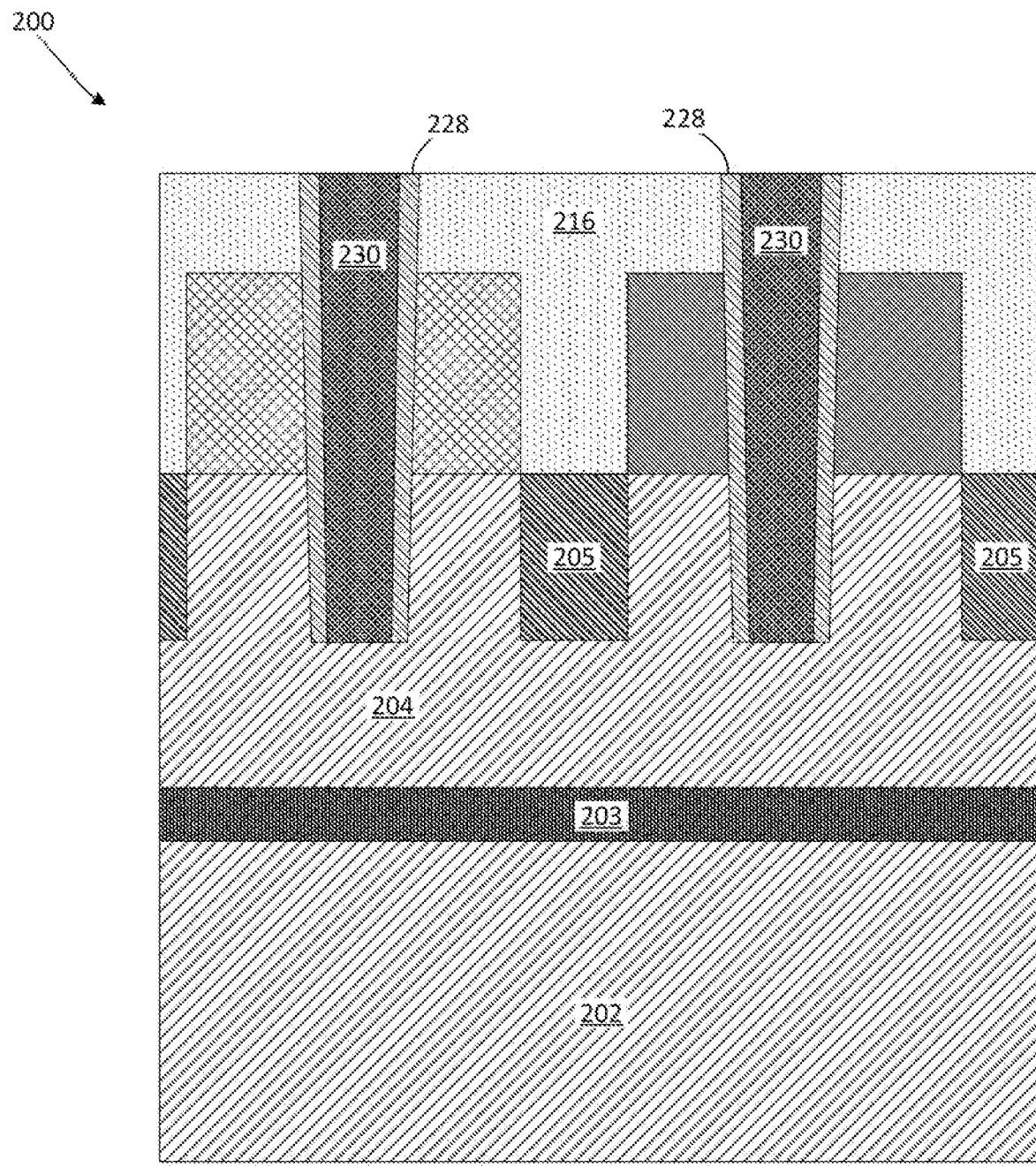
FIG. 19B is a cross-sectional view of the semiconductor device of FIG. 18C after additional fabrication operations and taken along the Y2 line of FIG. 19C, according to embodiments.
Figure 19C:
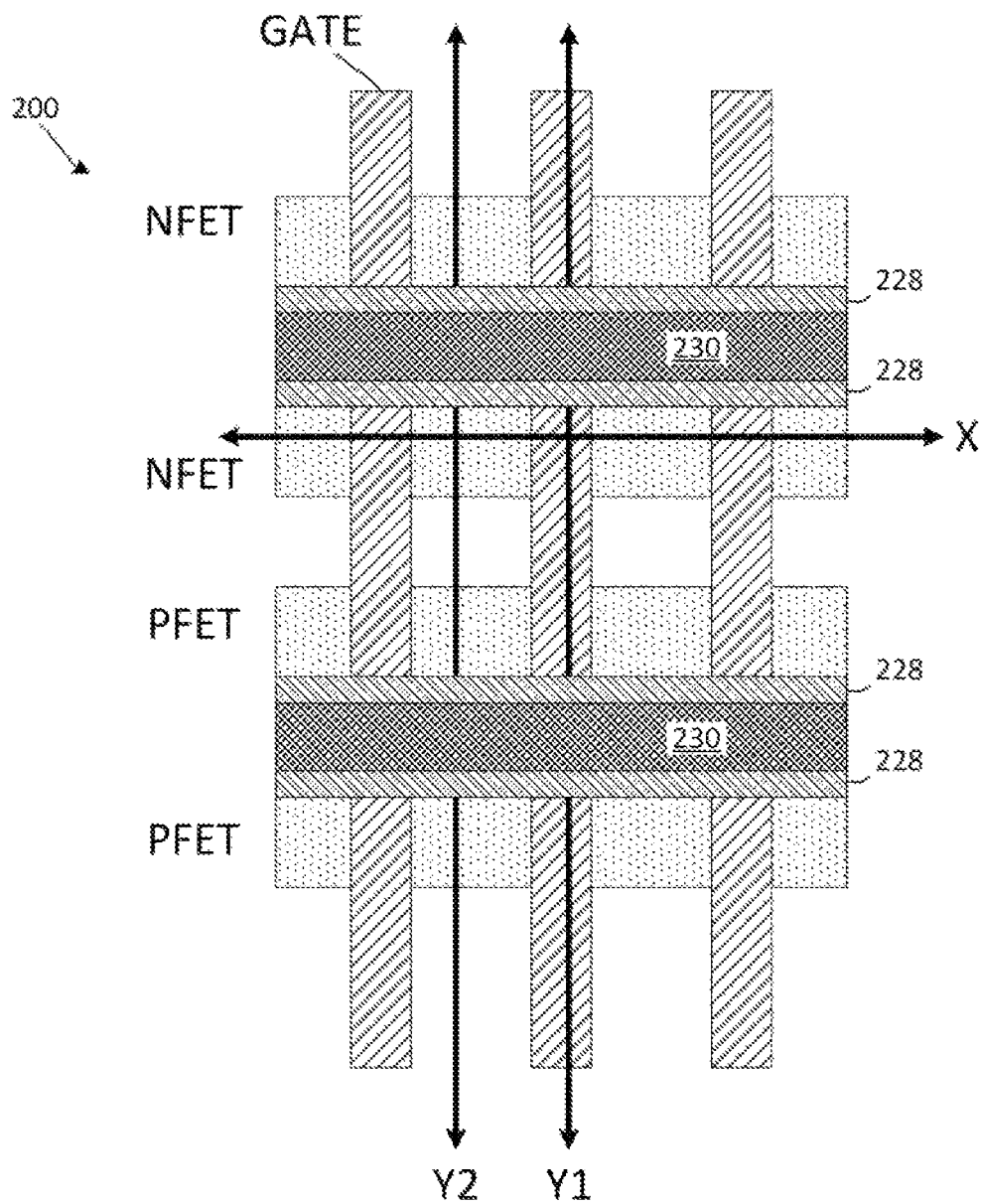
FIG. 19C is a top view of the semiconductor device of FIG. 19A, according to embodiments.

Referring now to FIG. 19A, this figure is a cross-sectional view of the semiconductor device 200 of FIG. 18B after additional fabrication operations and taken along the Y1 line of FIG. 19C, according to embodiments. FIG. 19B is a cross-sectional view of the semiconductor device 200 of FIG. 18C taken along the Y2 line of FIG. 19C, and FIG. 19C is a top view of the semiconductor device of FIG. 19A, according to embodiments. As shown in FIG. 19A, a late cut is performed to separate the NFET regions and PFET regions at the N/P boundaries. The late cut is formed through the entire depth of the nanosheet stacks 281 (see, FIG. 17A) and into the additional silicon layer 204. After the late cut, as shown in FIGS. 19A and 19B, a first dielectric fill layer 228 and a second dielectric fill layer 230 are formed in the areas created by the late cut. Any suitable material removal processes and material deposition process may be used to form the first dielectric fill layer 228 and a second dielectric fill layer 230. The top view of FIG. 19C also shows the locations of the first dielectric fill layer 228 and a second dielectric fill layer 230.

Figure 20A:
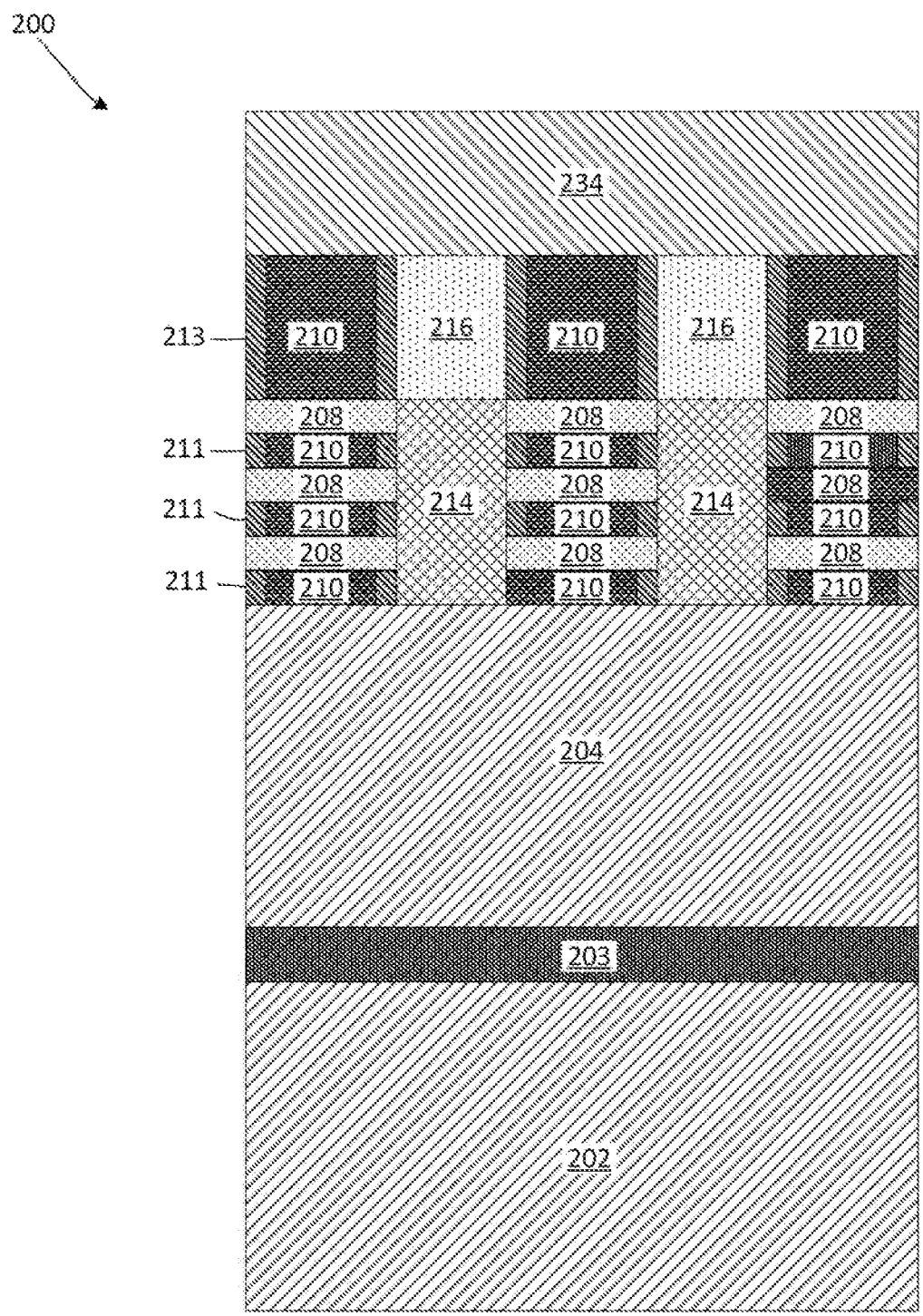
FIG. 20A is a cross-sectional view of the semiconductor device of FIG. 18A after additional fabrication operations and taken along the X line of FIG. 20D, according to embodiments.
Figure 20B:
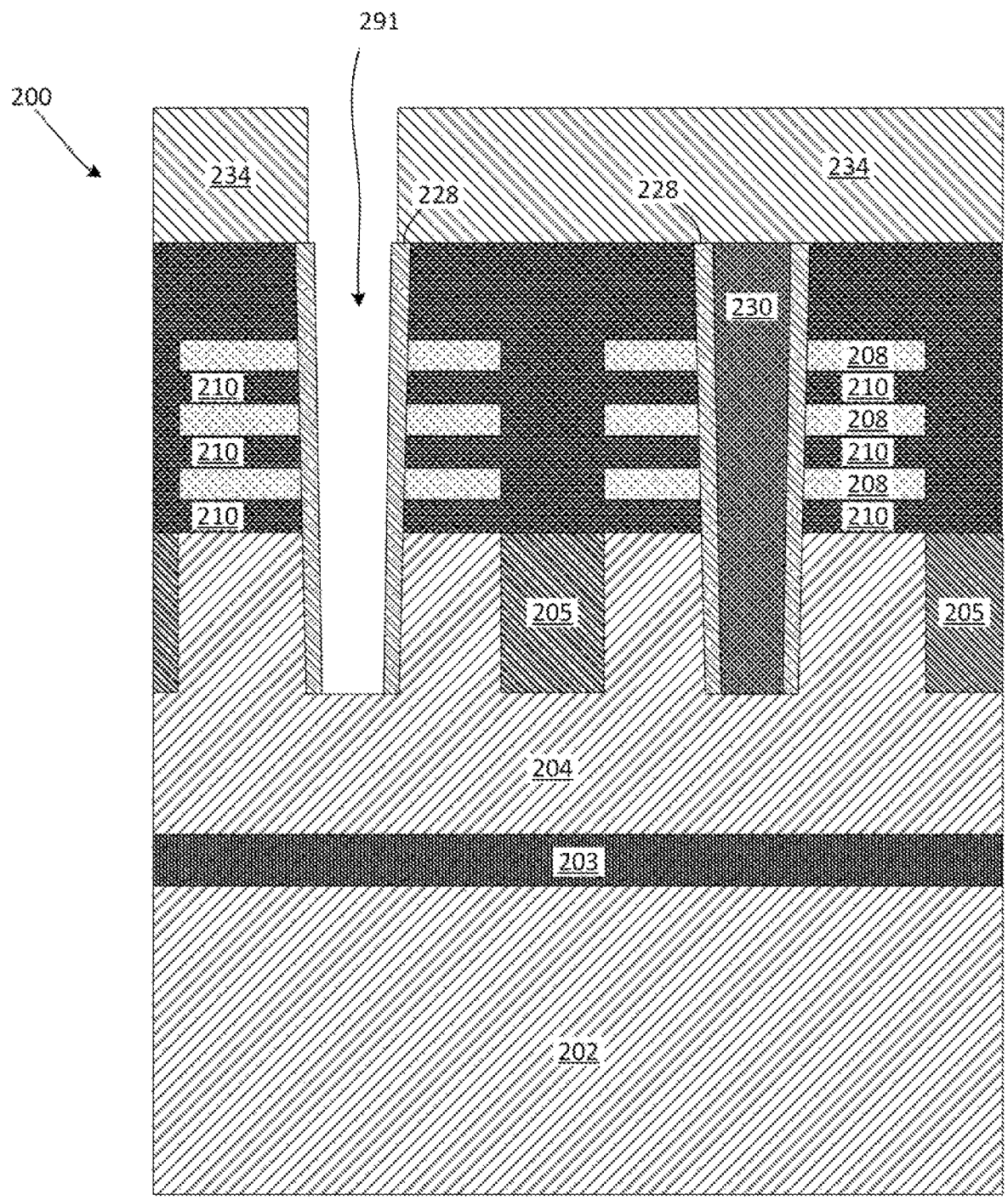
FIG. 20B is a cross-sectional view of the semiconductor device of FIG. 19A after additional fabrication operations and taken along the Y1 line of FIG. 20D, according to embodiments.
Figure 20C:
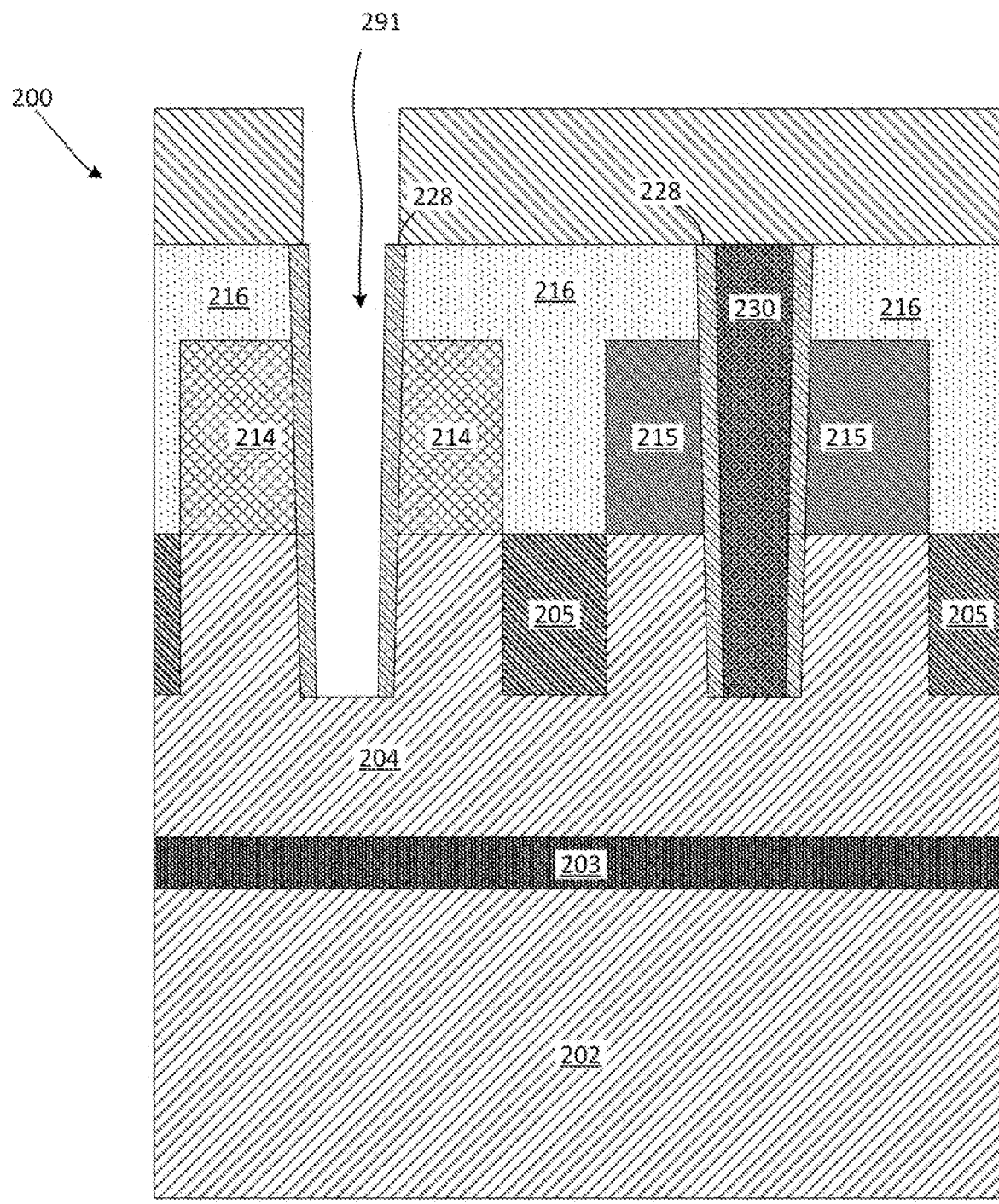
FIG. 20C is a cross-sectional view of the semiconductor device of FIG. 19B after additional fabrication operations and taken along the Y2 line of FIG. 20D, according to embodiments.
Figure 20D:
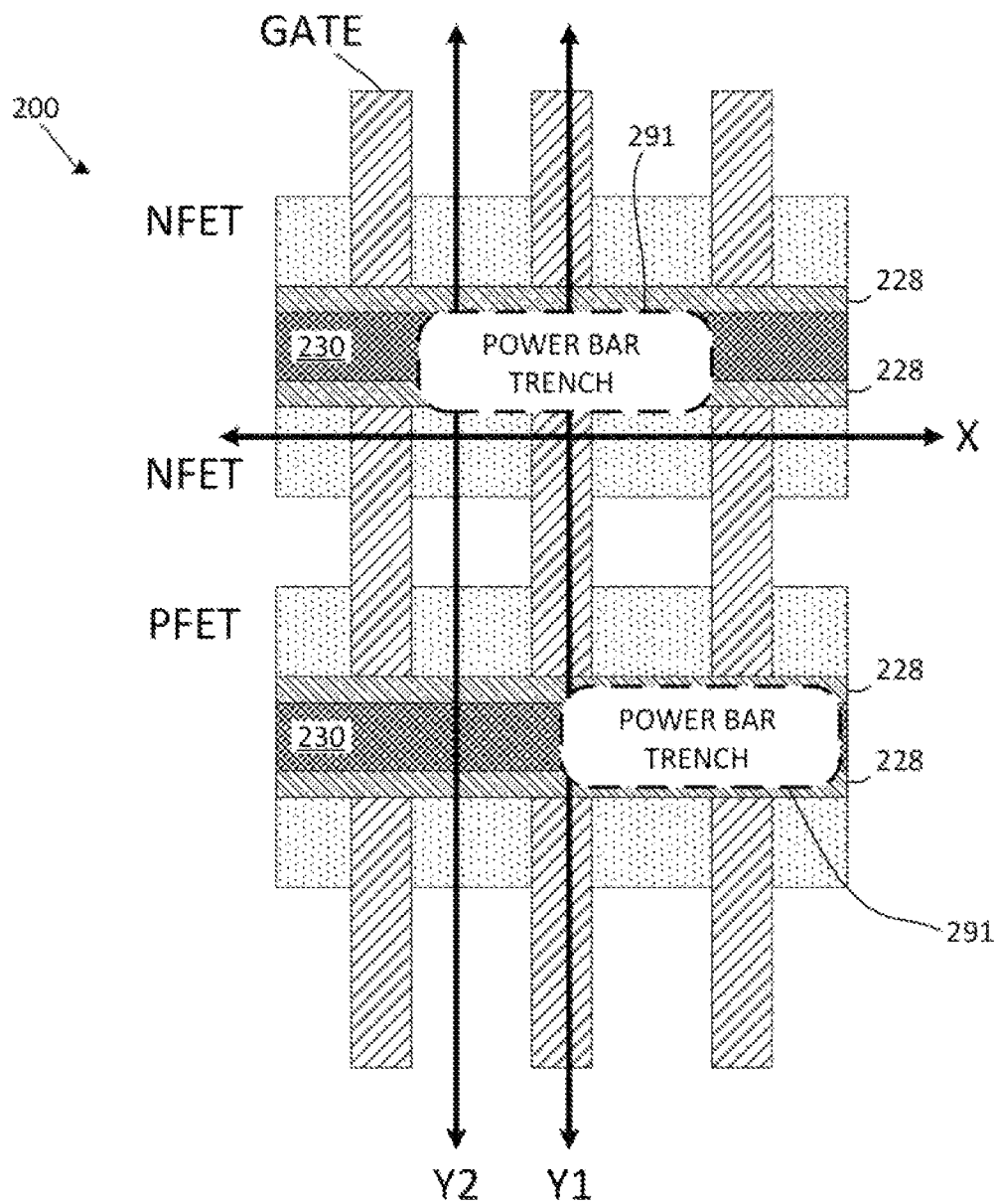
FIG. 20D is a top view of the semiconductor device of FIG. 20A, according to embodiments.

Referring now to FIG. 20A, this figure is a cross-sectional view of the semiconductor device 200 of FIG. 19A after additional fabrication operations and taken along the X line of FIG. 20D, according to embodiments. FIG. 20B is a cross-sectional view of the semiconductor device of FIG. 19A after additional fabrication operations and taken along the Y1 line of FIG. 20D, FIG. 20C is a cross-sectional view of the semiconductor device 200 of FIG. 19B after additional fabrication operations and taken along the Y2 line of FIG. 20D, and FIG. 20C is a top view of the semiconductor device 200 of FIG. 20A. As shown in FIGS. 20A-20C, an OPL layer 234 is formed on the top of the ILD layer 216 and patterned to create openings for the formation of the power bar trench 291. In particular, an etching process is performed to selectively remove the second dielectric layer 230 in these areas to form the power bar trench 291. The areas of the power bar trenches 291 are also shown in the top-down view of FIG. 20D.

Figure 21A:
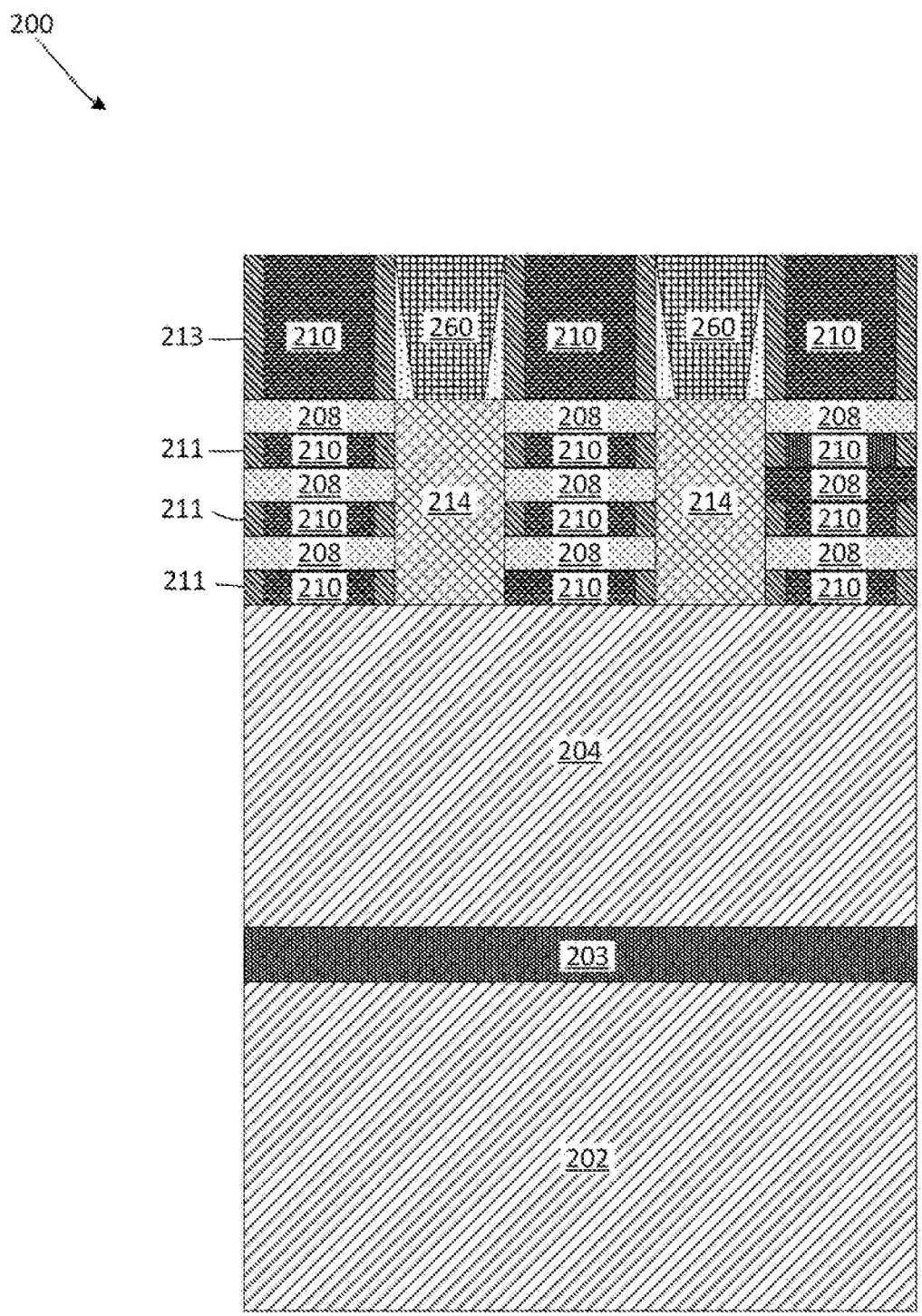
FIG. 21A is a cross-sectional view of the semiconductor device of FIG. 20A after additional fabrication operations and taken along the X line of FIG. 21D, according to embodiments.
Figure 21B:
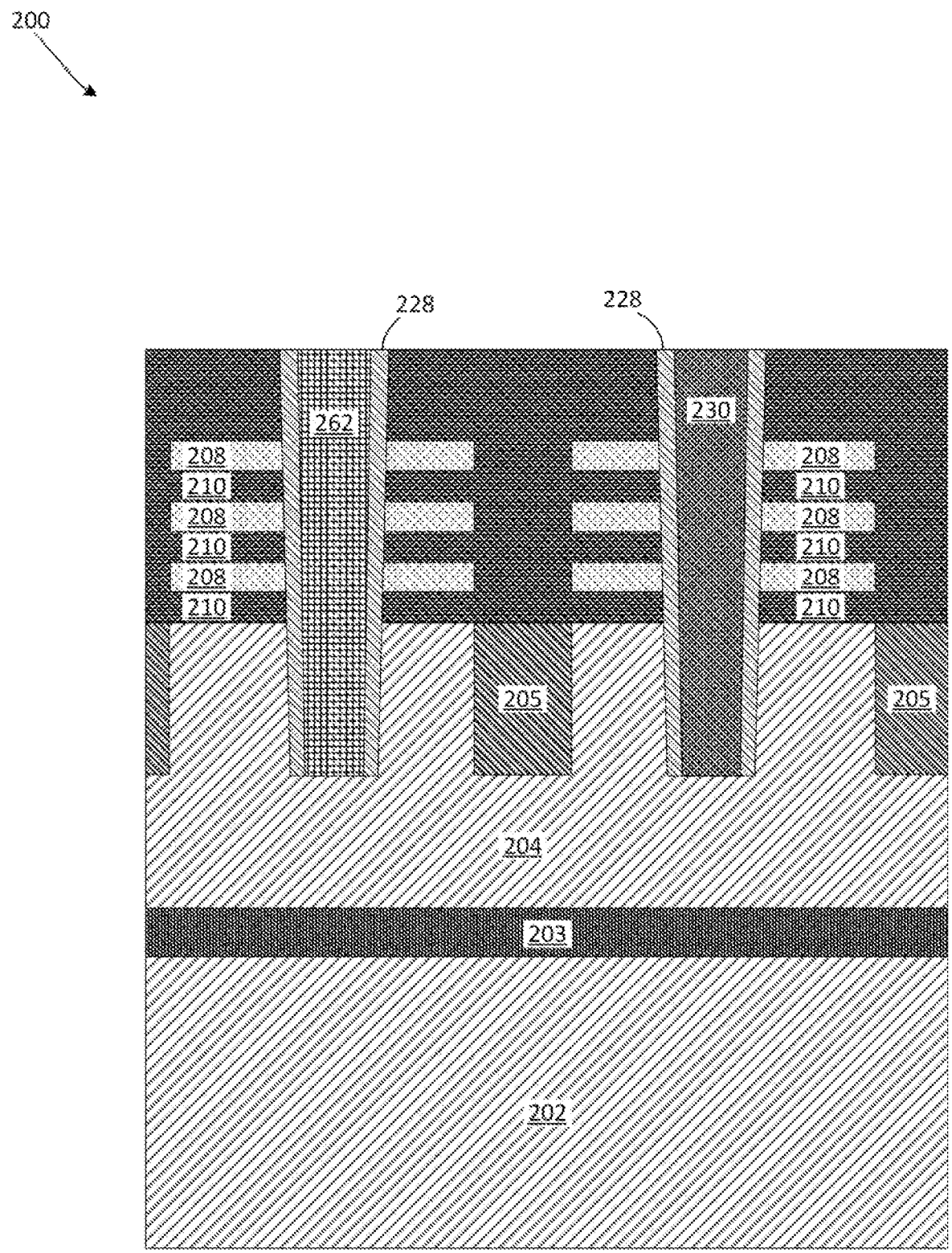
FIG. 21B is a cross-sectional view of the semiconductor device of FIG. 20B after additional fabrication operations and taken along the Y1 line of FIG. 21D, according to embodiments.
Figure 21C:
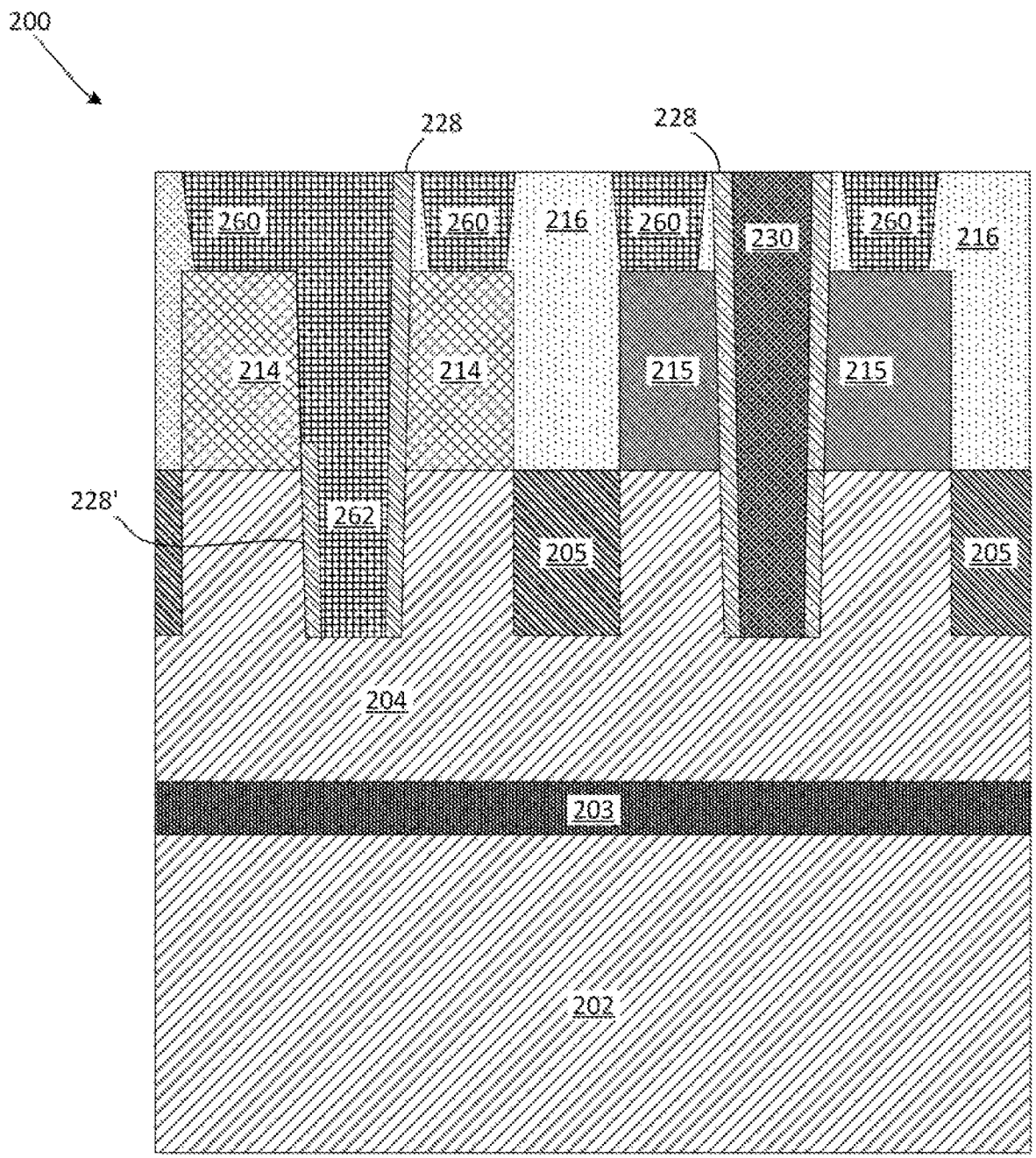
FIG. 21C is a cross-sectional view of the semiconductor device of FIG. 20C after additional fabrication operations and taken along the Y2 line of FIG. 21D, according to embodiments.
Figure 21D:
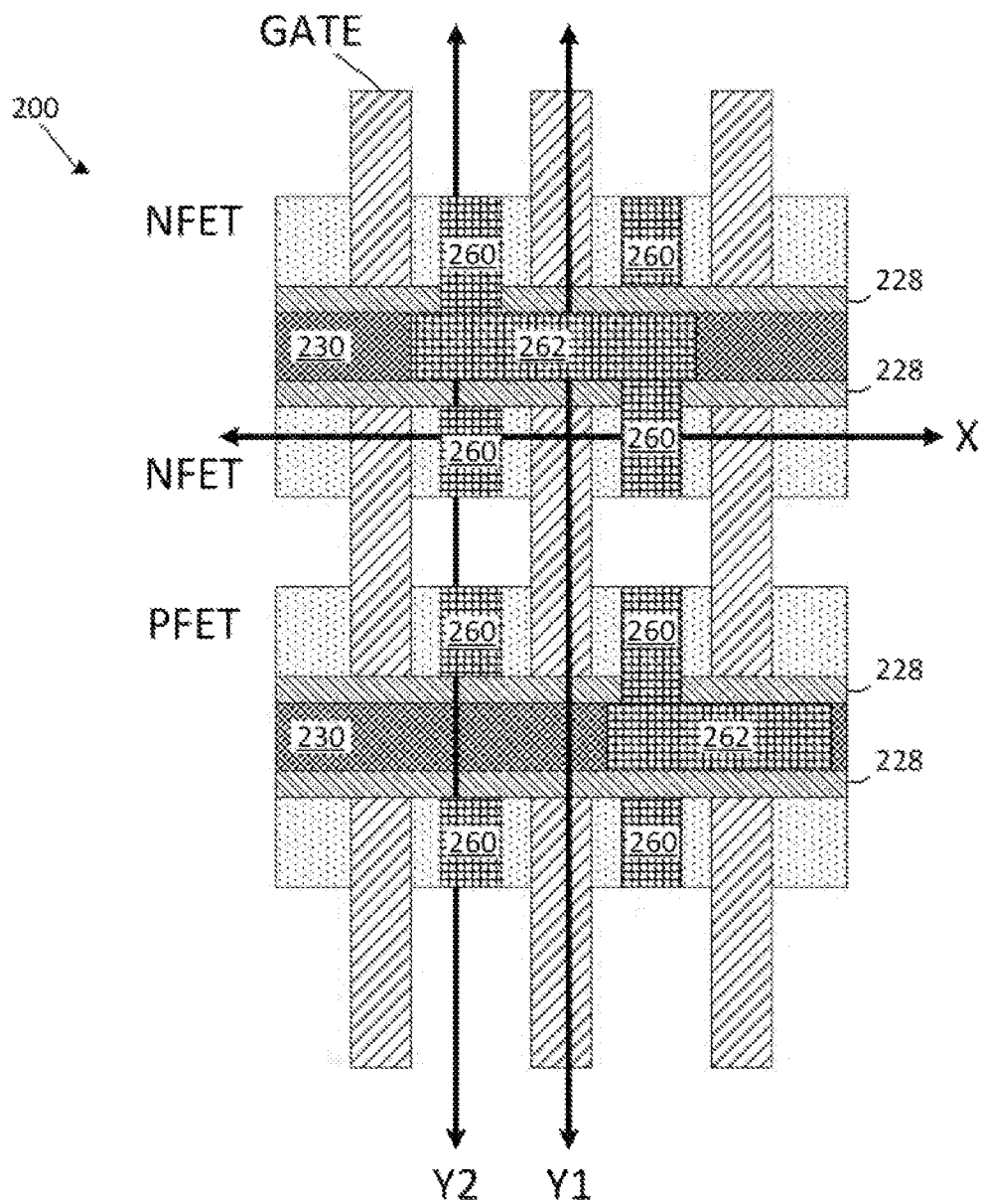
FIG. 21D is a top view of the semiconductor device of FIG. 21A, according to embodiments.

Referring now to FIG. 21A, this figure is a cross-sectional view of the semiconductor device 200 of FIG. 20A after additional fabrication operations and taken along the X line of FIG. 21D, according to embodiments. FIG. 21B is a cross-sectional view of the semiconductor device 200 of FIG. 20B after additional fabrication operations and taken along the Y1 line of FIG. 21D, FIG. 21C is a cross-sectional view of the semiconductor device 200 of FIG. 20C after additional fabrication operations and taken along the Y2 line of FIG. 21D, and FIG. 21D is a top view of the semiconductor device 200 of FIG. 21A. As shown in FIGS. 21A and 21C, source/drain (S/C) contact patterning is performed to form the first contacts (CA) 260. The first contacts 260 may comprise any suitable metal material. As shown in FIG. 21C, the S/D patterning includes removing a portion of the first dielectric fill layer 228 on the leftmost n-type epitaxial layer 214 to create a shortened portion 228' of the first dielectric fill layer 228 and to expose a portion of the sidewall of the leftmost n-type epitaxial layer 214.

Figure 22A:
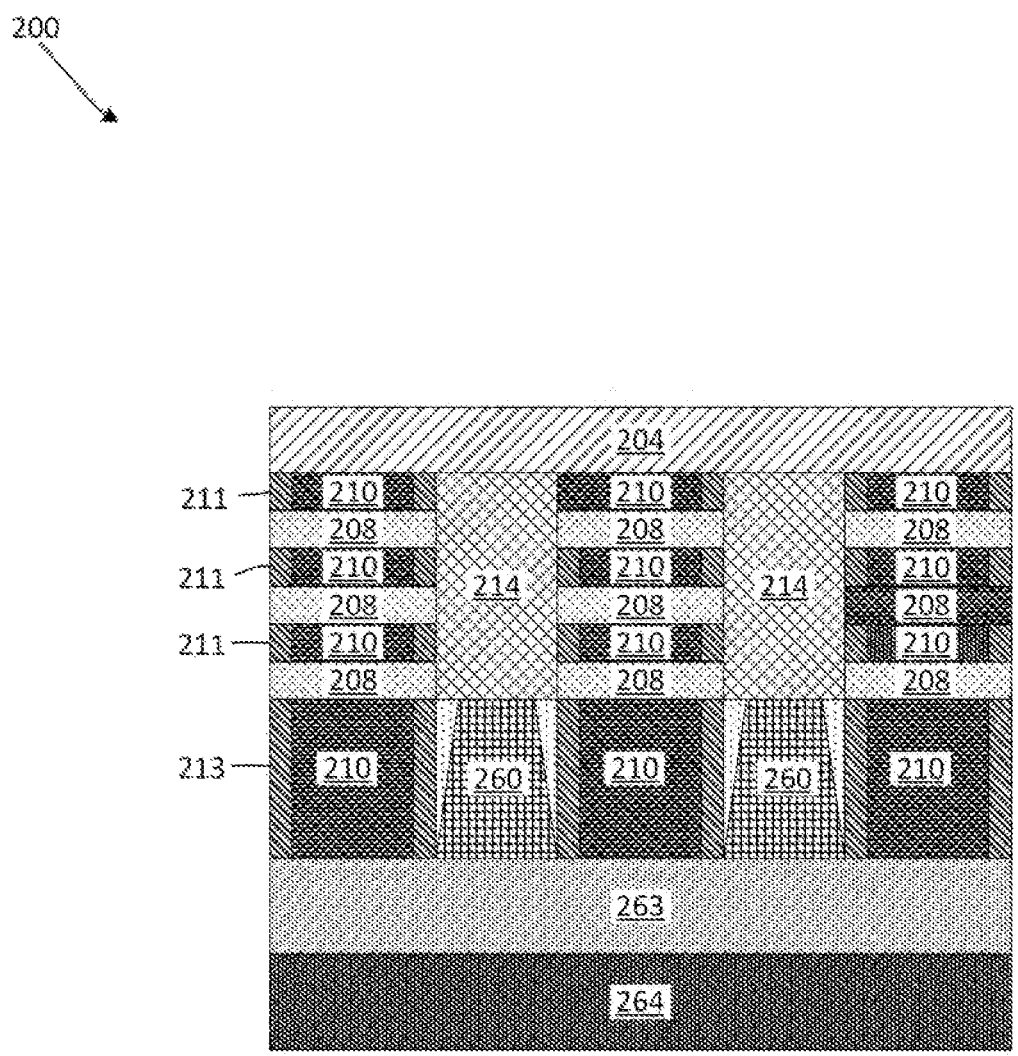
FIG. 22A is a cross-sectional view of the semiconductor device of FIG. 21A after additional fabrication operations and taken along the X line of FIG. 21D, according to embodiments.
Figure 22B:
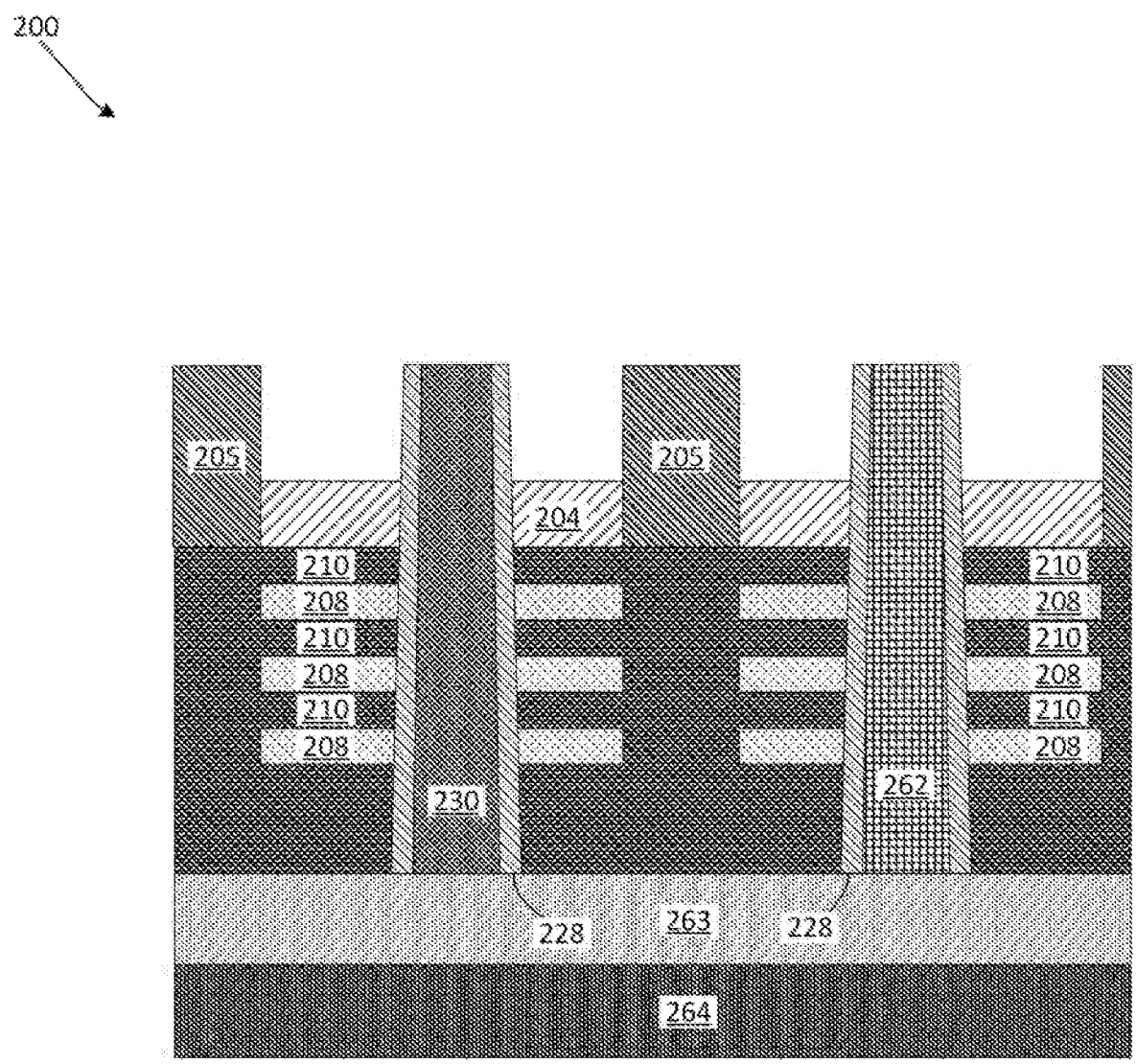
FIG. 22B is a cross-sectional view of the semiconductor device of FIG. 21B after additional fabrication operations and taken along the Y1 line of FIG. 21D, according to embodiments.
Figure 22C:
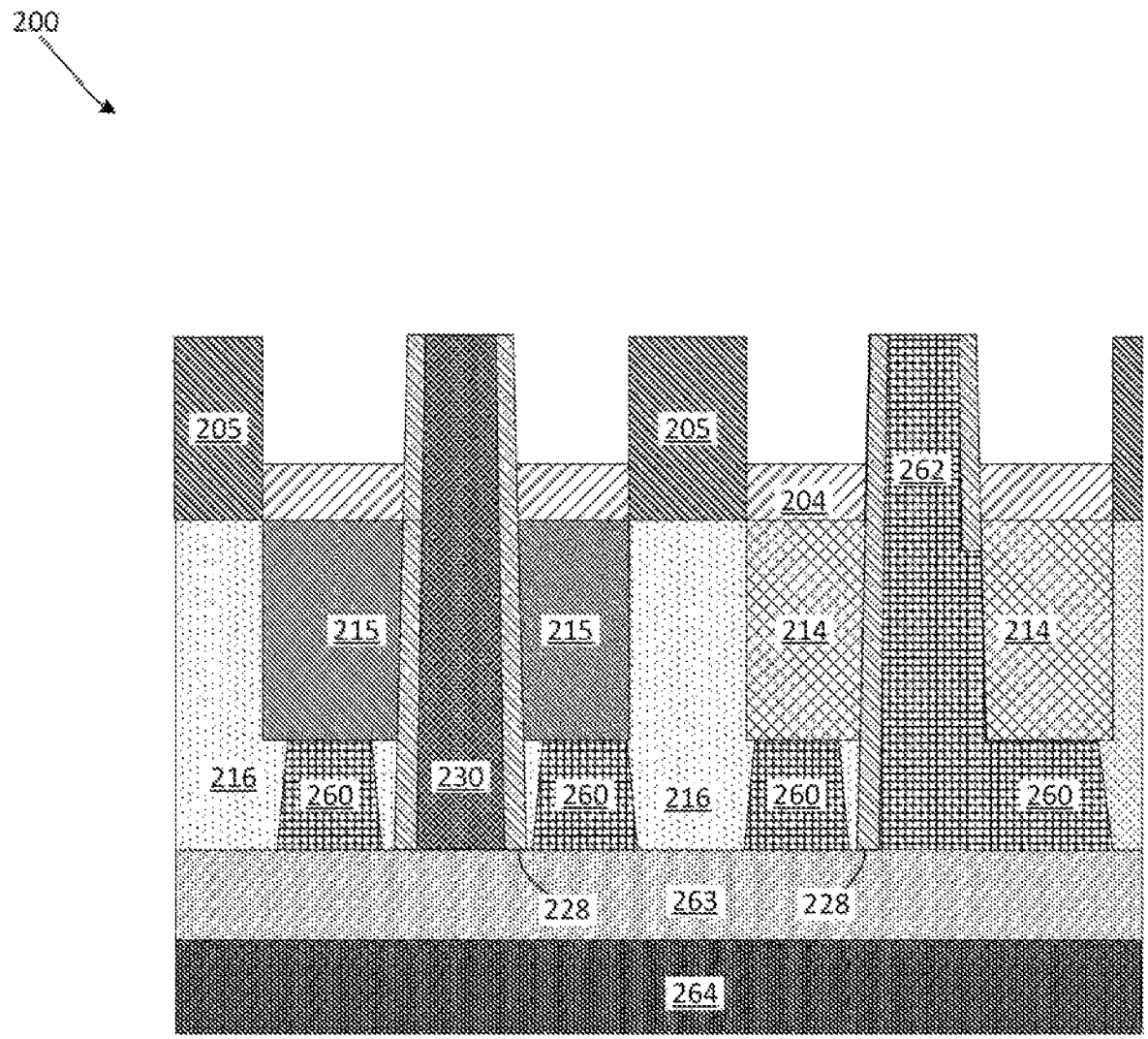
FIG. 22C is a cross-sectional view of the semiconductor device of FIG. 21C after additional fabrication operations and taken along the Y2 line of FIG. 21D, according to embodiments.

Referring now to FIG. 22A, this figure is a cross-sectional view of the semiconductor device 200 of FIG. 21A after additional fabrication operations and taken along the X line of FIG. 21D, according to embodiments. Also, FIG. 22B is a cross-sectional view of the semiconductor device 200 of FIG. 21B after additional fabrication operations and taken along the Y1 line of FIG. 21D, and FIG. 22C is a cross-sectional view of the semiconductor device 200 of FIG. 21C after additional fabrication operations and taken along the Y2 line of FIG. 21D, according to embodiments. As shown in FIGS. 22A-22C, a back-end-of-line (BEOL) layer 263 and a carrier wafer 264 are formed. The BEOL layer 263 connects with the first contacts 260 and the power bars 262. Then, a wafer flip operation is performed and the substrate 202 is removed. Then, as shown in FIGS. 22A-22C, the etch stop layer 203 is removed. After the etch stop layer 203 is removed, a silicon recess operation is performed to remove a portion of the additional silicon layer 204. As shown in FIGS. 22B and 22C, the removal of the portion of the additional silicon layer 204 exposes portions of the STI regions 205, the first dielectric fill layer 228, the second dielectric fill layer 230 and the power bar 262.

Figure 23A:
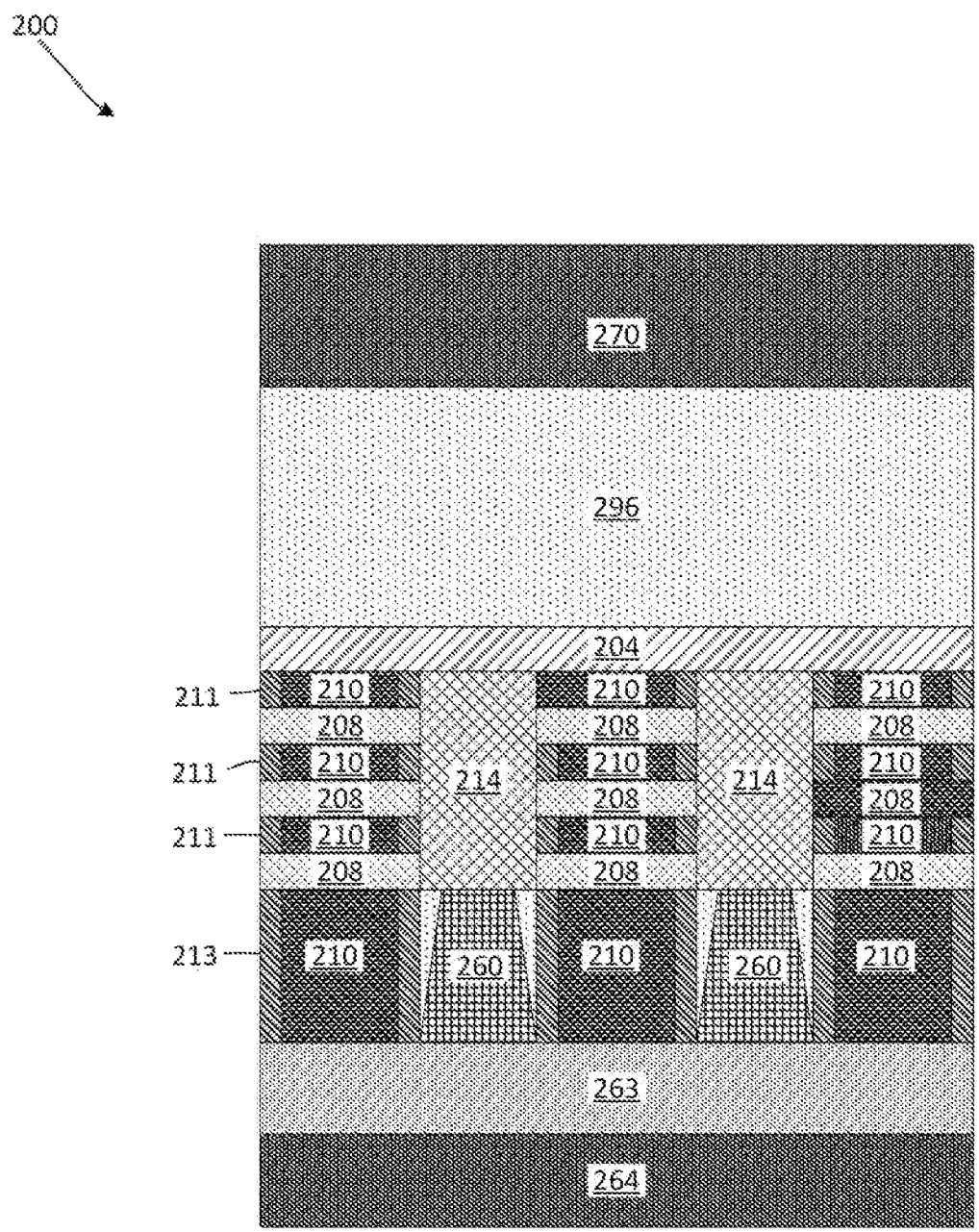
FIG. 23A is a cross-sectional view of the semiconductor device of FIG. 22A after additional fabrication operations and taken along the X line of FIG. 21D, according to embodiments.
Figure 23B:
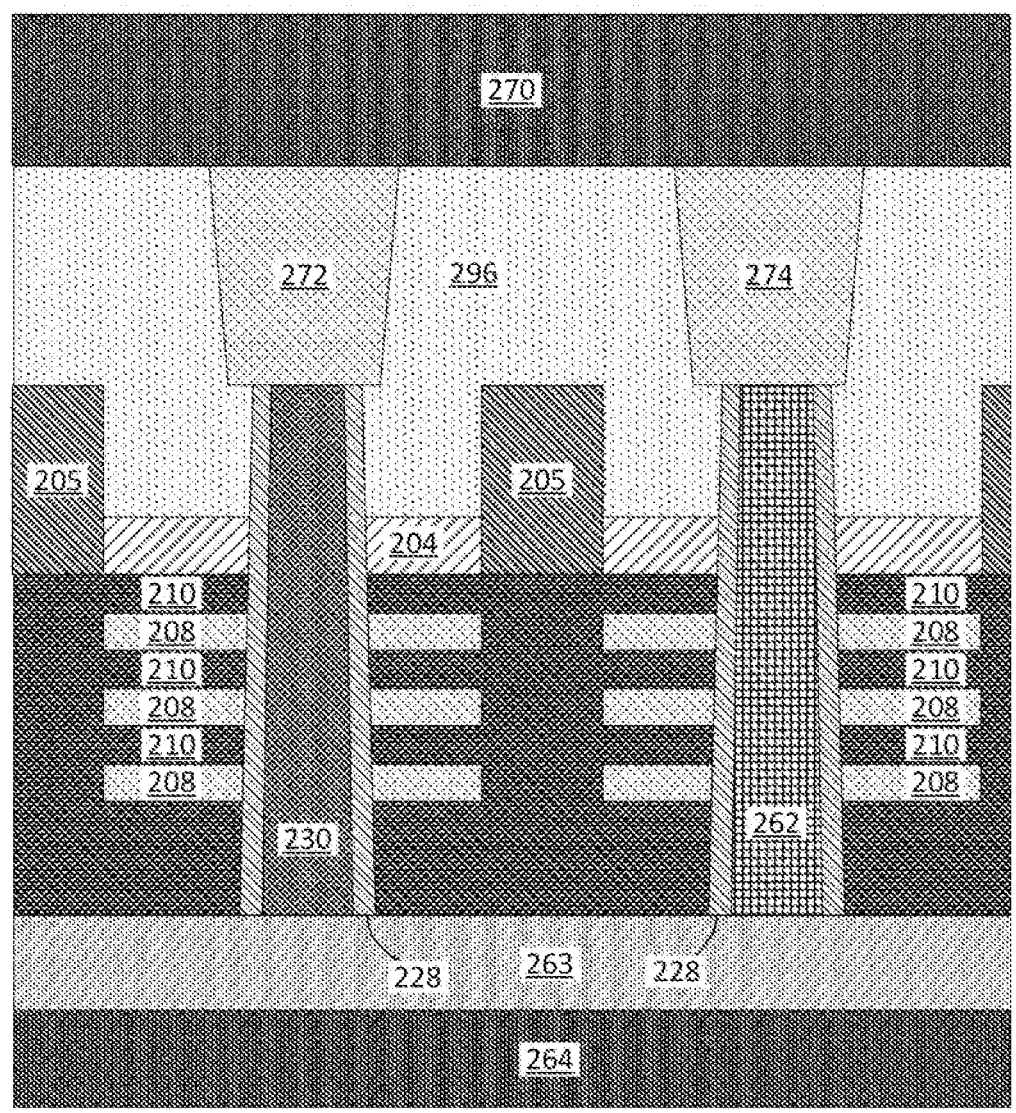
FIG. 23B is a cross-sectional view of the semiconductor device of FIG. 22B after additional fabrication operations and taken along the Y1 line of FIG. 21D, according to embodiments.
Figure 23C:
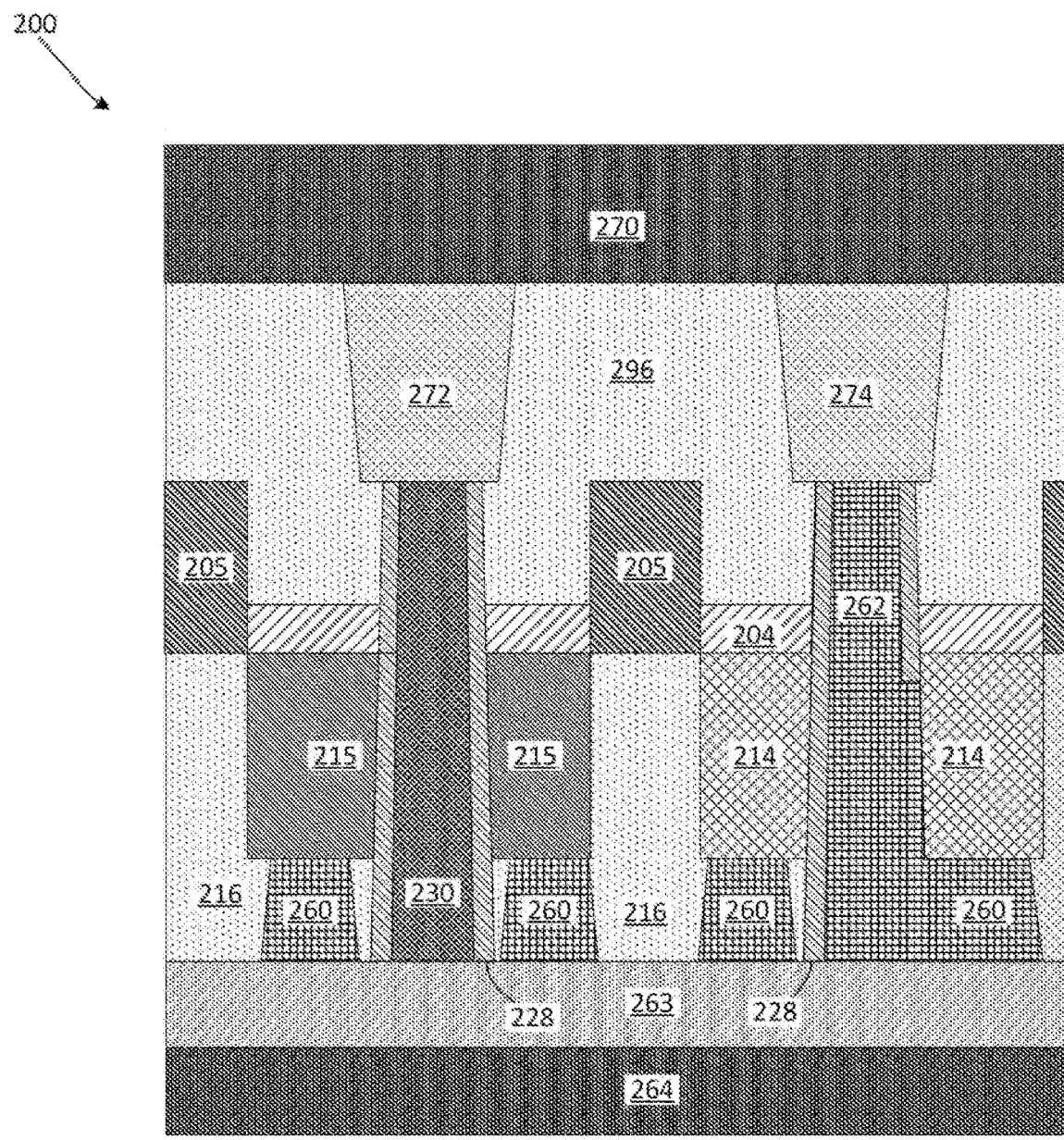
FIG. 23C is a cross-sectional view of the semiconductor device of FIG. 22C after additional fabrication operations and taken along the Y2 line of FIG. 21D, according to embodiments.

Referring now to FIG. 23A, this figure is a cross-sectional view of the semiconductor device 200 of FIG. 22A after additional fabrication operations and taken along the X line of FIG. 21D, according to embodiments. Also, FIG. 23B is a cross-sectional view of the semiconductor device 200 of FIG. 22B after additional fabrication operations and taken along the Y1 line of FIG. 21D, and FIG. 23C is a cross-sectional view of the semiconductor device 200 of FIG. 22C after additional fabrication operations and taken along the Y2 line of FIG. 21D, according to embodiments. As shown in FIGS. 23A-23C, a backside ILD layer 296 is formed. Then, a backside power rail (e.g., VDD 272 and VSS 274) are formed into the backside ILD layer 296. As shown in FIGS. 23B and 23C, the VSS 274 portion of the backside power rail connect to the power bars 262. As also shown in FIGS. 23A-23C, a backside power distribution network (BSPDN) 270 is formed on the backside power rail to connect to the VDD 272 portion and the VSS 274 portion.

In the embodiments shown and described above with respect to FIGS. 17A-23C, a semiconductor device comprises: a cell boundary cut region that separates the channel, gate and S/D epis (at N2N or P2P space), where the cut region is filled with a bi-layer dielectric structure with a first dielectric liner (or first dielectric fill layer 228) that is attached to the channel, the gate and S/D epitaxial regions, and the second dielectric fill layer 230 formed in between the first dielectric liner. In certain embodiments, between the first dielectric liner, some of second dielectric fill is removed and replaced with a power bar 262, which connects the S/D epitaxial region to the backside power rail (which includes the VDD 272 portion and the VSS portion 274). In certain embodiments, a source/drain contact connecting to signal line (e.g., the first contact 260 above the rightmost n-type epitaxial layer 214 as shown in FIG. 21C) is isolated from a source/drain contact connecting to power bar (e.g., the first contact 260 above the leftmost n-type epitaxial layer 214 as shown in FIG. 21C) by the first dielectric fill layer 228. In certain embodiments, a source/drain contact (e.g., the first contact 260 above the leftmost p-type epitaxial layer 215 as shown in FIG. 21C) connecting to signal line is isolated from another source/drain contact connecting to signal line (e.g., the first contact 260 above the rightmost p-type epitaxial layer 215 as shown in FIG. 21C) by the cut region filled with first dielectric fill layer 228 and the second dielectric fill layer 230. In certain embodiments, as shown in FIG. 21B, certain portions of the gate (e.g., gate tips of the HKMG 210 layer) are located next to the power bar 262, and are separated from the power bar 262 by the first dielectric fill layer 228.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a field effect transistor (FET) including first and second source/drain (S/D) epitaxial regions;
   a gate cut region at cell boundaries between the first and second S/D epitaxial regions;
   a dielectric liner and a dielectric core formed in the gate cut region;
   a backside power rail (BPR) and a backside power distribution network (BSPDN);
   a power via passing through the dielectric core and connecting to the BPR and the BSPDN;
   first metal contacts formed in contact with the first and second S/D epitaxial regions; and
   a via to backside power rail (VBPR) contact,
   wherein the dielectric liner separates the power via from the first S/D epitaxial region, and a portion of the dielectric liner is removed on only one side of the power via and the VBPR contact is formed in a location where this portion of the dielectric liner is removed.

2. The semiconductor device of claim 1, wherein the VBPR contact connects the second S/D epitaxial region with the power via and the first metal contact that is in contact with the second S/D epitaxial region.

3. The semiconductor device of claim 1, wherein a portion of the dielectric core is removed and the power via is formed in a location where this portion of the dielectric core is removed.

4. The semiconductor device of claim 1, further comprising a BOX layer between the first and second S/D epitaxial regions.

5. The semiconductor device according to claim 4, wherein the power via extends through the BOX layer to contact the BPR.

6. The semiconductor device according to claim 1, wherein the dielectric liner separates the power via from the first S/D epitaxial region.

7. The semiconductor device according to claim 1, wherein the first and second S/D epitaxial regions comprise one of a p-type and an n-type material.

8. The semiconductor device according to claim 1, further comprising third and fourth S/D epitaxial regions.

9. The semiconductor device according to claim 1, further comprising a BEOL connected to the first metal contacts.

10. A method of manufacturing a semiconductor device, the method comprising:
   forming a field effect transistor (FET) including first and second source/drain (S/D) epitaxial regions;
   forming a gate cut region at cell boundaries between the first and second S/D epitaxial regions;

forming a dielectric liner and a dielectric core in the gate cut region;

forming a backside power rail (BPR) and a backside power distribution network (BSPDN);

forming a power via passing through the dielectric core and connecting to the BPR and BSPDN;

forming first metal contacts in contact with the first and second S/D epitaxial regions; and forming a via to backside power rail (VBPR) contact, wherein the dielectric liner separates the power via from the first S/D epitaxial region, and a portion of the dielectric liner is removed on only one side of the power via and the VBPR contact is formed in a location where this portion of the dielectric liner is removed.

11. The method of claim 10, wherein the VBPR contact connects the second S/D epitaxial region with the power via and the first metal contact that is in contact with the second S/D epitaxial region.

12. The method of claim 10, wherein a portion of the dielectric core is removed and the power via is formed in a location where this portion of the dielectric core is removed.

13. The method of claim 10, further comprising forming a BOX layer between the first and second S/D epitaxial regions.

14. The method according to claim 13, wherein the power via extends through the BOX layer to contact the BPR.

15. The method according to claim 10, wherein the dielectric liner separates the power via from the first S/D epitaxial region.

16. The method according to claim 10, wherein the first and second S/D epitaxial regions comprise one of a p-type and an n-type material.

17. The method according to claim 10, further comprising forming third and fourth S/D epitaxial regions.

18. A semiconductor device comprising:
a field effect transistor (FET) including first and second source/drain (S/D) epitaxial regions;
a gate cut region at cell boundaries between the first and second S/D epitaxial regions;
a first dielectric fill layer and a second dielectric fill layer formed in the gate cut region; and
a backside power rail (BPR) connected to a backside power distribution network (BSPDN),
wherein a portion of the second first dielectric fill layer is removed on only one side of the gate cut region and replaced with a power bar, which connects at least one of the first and second S/D epitaxial regions to the backside power rail.

* * * * *